United States Patent
Fishman et al.

(10) Patent No.: US 11,616,190 B2
(45) Date of Patent: Mar. 28, 2023

(54) DEVICE AND METHOD FOR SENSING UNDERWATER SOUND PRESSURE

(71) Applicant: B&L Sensor Technologies, LLC, Winchester, MA (US)

(72) Inventors: Lawrence Fishman, Winchester, MA (US); Ching-Yu Lin, Andover, MA (US)

(73) Assignee: B&L Sensor Technologies, LLC, Winchester, MA (US)

( * ) Notice: Subject to any disclaimer, the term of this patent is extended or adjusted under 35 U.S.C. 154(b) by 286 days.

(21) Appl. No.: 16/955,215

(22) PCT Filed: Dec. 20, 2018

(86) PCT No.: PCT/US2018/066764
§ 371 (c)(1),
(2) Date: Jun. 18, 2020

(87) PCT Pub. No.: WO2019/126477
PCT Pub. Date: Jun. 27, 2019

(65) Prior Publication Data
US 2020/0343438 A1      Oct. 29, 2020

Related U.S. Application Data

(60) Provisional application No. 62/609,838, filed on Dec. 22, 2017.

(51) Int. Cl.
*H01L 41/087*    (2006.01)
*H01L 41/08*     (2006.01)
(Continued)

(52) U.S. Cl.
CPC ............ *H01L 41/087* (2013.01); *G01V 1/186* (2013.01); *G01V 1/187* (2013.01);
(Continued)

(58) Field of Classification Search
CPC ............... H01L 41/087; H01L 41/0815; H01L 41/1132; H01L 41/193; H01L 41/257;
(Continued)

(56) References Cited

U.S. PATENT DOCUMENTS 3,434,104 A    3/1969   Stapleton et al.
3,798,474 A    3/1974   Cook et al.
(Continued)

FOREIGN PATENT DOCUMENTS

CN    104065299 B    6/2016
JP    1987/176300    8/1987
(Continued)

OTHER PUBLICATIONS

M. Wegener and R. Gerhard-Multhaupt, "Electric poling and electromechanical characterization of 0.1-mm-thick sensor films and 0.2-mm-thick cable layers from poly(Vinylidene Fluoride-Trifluroethylene)," IEEE Transactions on Ultrasonics, Ferroelectrics, and Freq Control, vol. 50,No. 7,pp. 921-929,Jul. 2003.*

*Primary Examiner* — M Baye Diao
(74) *Attorney, Agent, or Firm* — Pearl Cohen Zedek Latzer Baratz LLP

(57) ABSTRACT

A hydrophone may include a first piezoelectric cable including alternating sections of positive polarity and negative polarity, and a second piezoelectric cable including alternating sections of negative polarity and positive polarity. At least a portion of each section of positive polarity of the first piezoelectric cable may be bonded or adhered to at least a portion of a section of negative polarity of the second piezoelectric cable. A method of manufacturing a hydrophone may include winding or coiling a first piezoelectric cable and a second piezoelectric cable at the same time to (Continued)

create a series of wound sections including cables, the wound sections alternating with a series of not wound sections including the cables.

10 Claims, 40 Drawing Sheets

(51) Int. Cl.
  *H01L 41/113* (2006.01)
  *H01L 41/257* (2013.01)
  *G01V 1/18* (2006.01)
  *H01L 41/193* (2006.01)
(52) U.S. Cl.
  CPC ...... *H01L 41/0815* (2013.01); *H01L 41/1132* (2013.01); *H01L 41/193* (2013.01); *H01L 41/257* (2013.01)
(58) Field of Classification Search
  CPC ........ G01V 1/186; G01V 1/187; G01V 1/201; H04R 17/025; H04R 1/44; H04R 31/00
  USPC .......................................... 367/20
  See application file for complete search history.

(56) References Cited

U.S. PATENT DOCUMENTS

| | | | |
|---|---|---|---|
| 3,832,762 A * | 9/1974 | Johnston | B06B 1/0603 367/160 |
| 3,859,620 A | 1/1975 | Percy | |
| 3,970,878 A | 7/1976 | Berglund | |
| 4,497,046 A | 1/1985 | Savage | |
| 4,794,295 A | 12/1988 | Penneck et al. | |
| 4,841,494 A | 6/1989 | Banno | |
| 4,849,946 A * | 7/1989 | Beauducel | H04R 17/005 310/331 |
| 4,918,666 A | 4/1990 | Beauducel et al. | |
| 6,657,365 B1 | 12/2003 | Ambs | |
| 7,440,644 B2 | 10/2008 | Westhall et al. | |
| 7,697,374 B2 * | 4/2010 | Kitchin | G10K 11/008 367/4 |
| 8,194,504 B2 * | 6/2012 | Kitchin | G01V 1/3843 367/173 |
| 8,720,657 B2 * | 5/2014 | Kramer | B65H 75/4434 191/12.2 R |
| 9,678,231 B2 | 6/2017 | Davis et al. | |
| 9,772,220 B1 | 9/2017 | Cook et al. | |
| 10,928,529 B2 * | 2/2021 | Goenner | G01V 1/188 |
| 2009/0021117 A1 | 1/2009 | Ueda et al. | |
| 2009/0207697 A1 | 8/2009 | Kitchin et al. | |
| 2011/0026366 A1 * | 2/2011 | Kitchin | G10K 11/008 367/157 |
| 2017/0052061 A1 | 2/2017 | Chaggeres et al. | |
| 2017/0347174 A1 | 11/2017 | Chandrasekaran et al. | |

FOREIGN PATENT DOCUMENTS

| | | | | |
|---|---|---|---|---|
| JP | 01050488 | 2/1998 | | |
| JP | 3079175 B2 | 8/2000 | | |
| JP | 2004304193 A | 10/2004 | | |
| JP | 2005/503091 | 1/2005 | | |
| WO | WO-8703699 A | * | 6/1987 | ............ G01H 11/08 |
| WO | WO199809339 A1 | 3/1998 | | |
| WO | WO 2006/028222 | 3/2006 | | |
| WO | WO2011089803 A1 | 7/2011 | | |
| WO | WO-2016092020 A1 | * | 6/2016 | ............ G01V 1/186 |

* cited by examiner

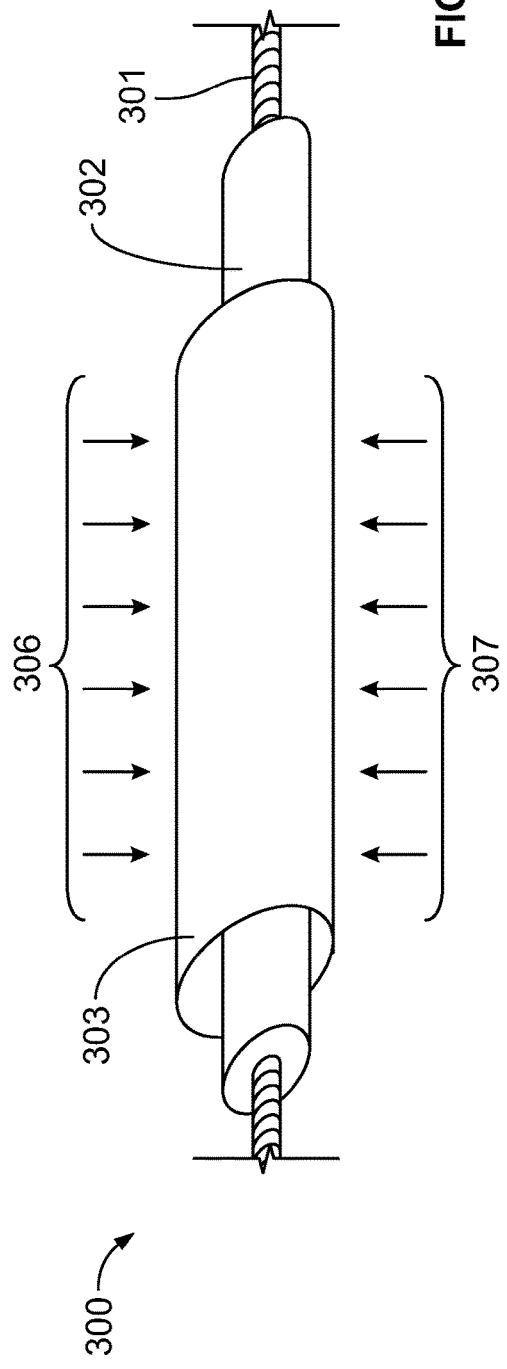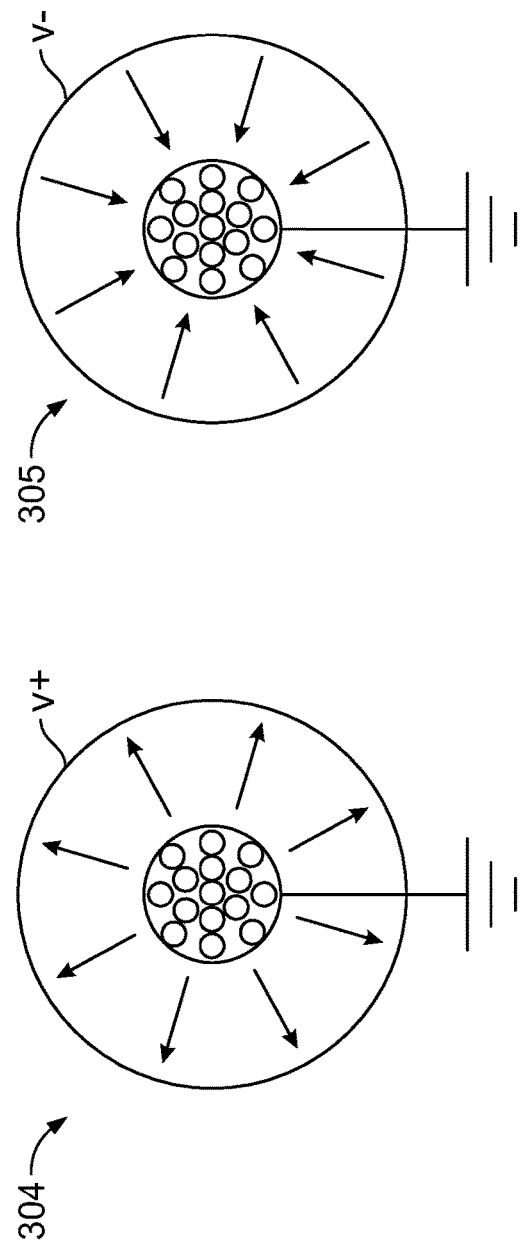
FIG. 2

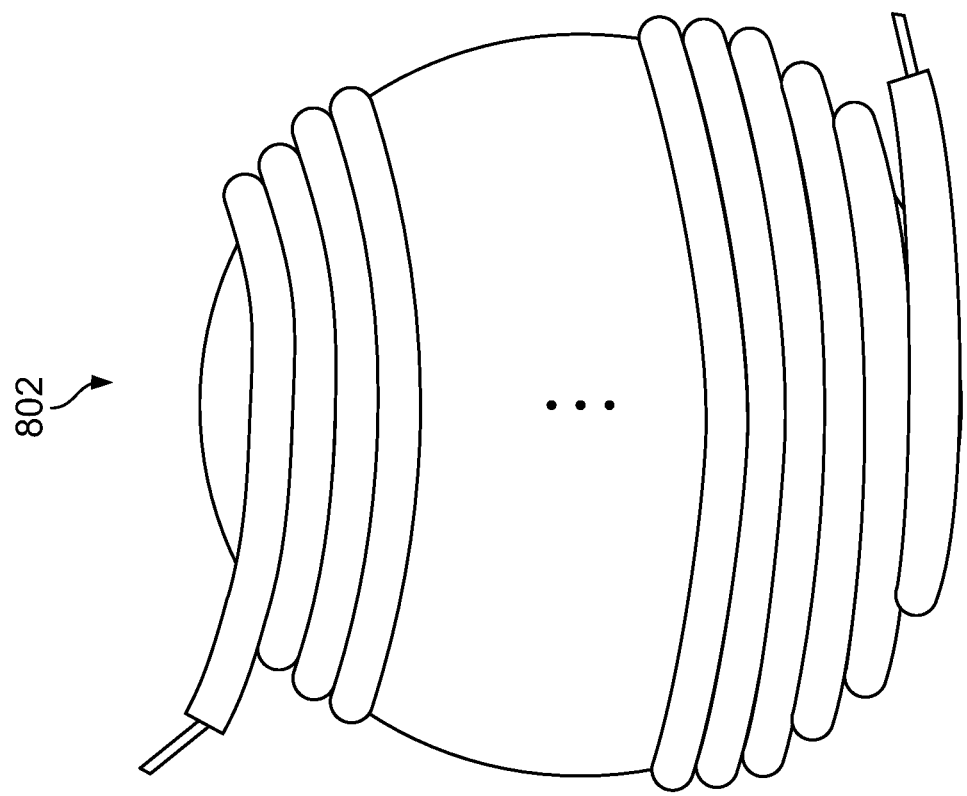
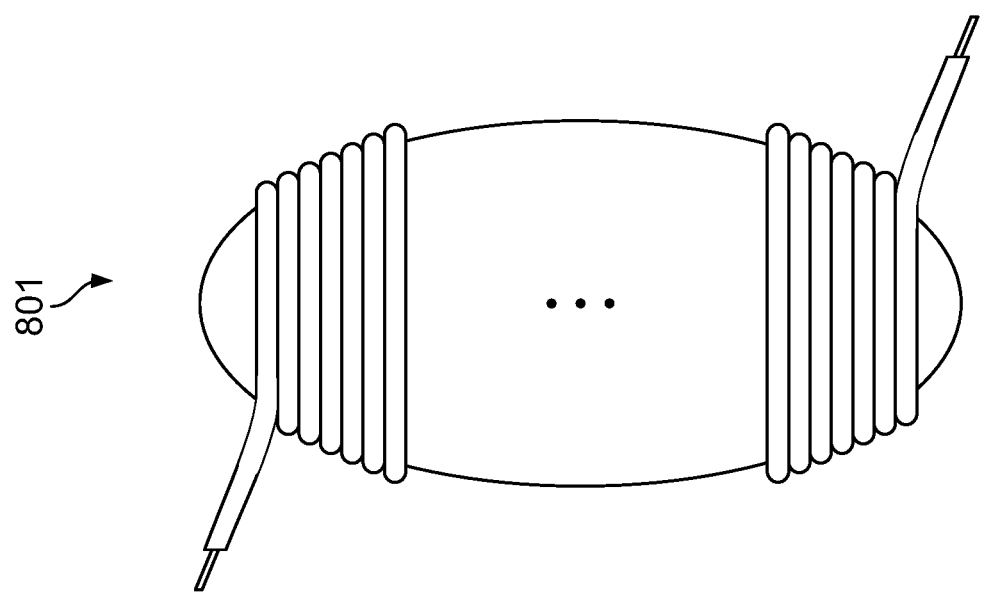
FIG. 7

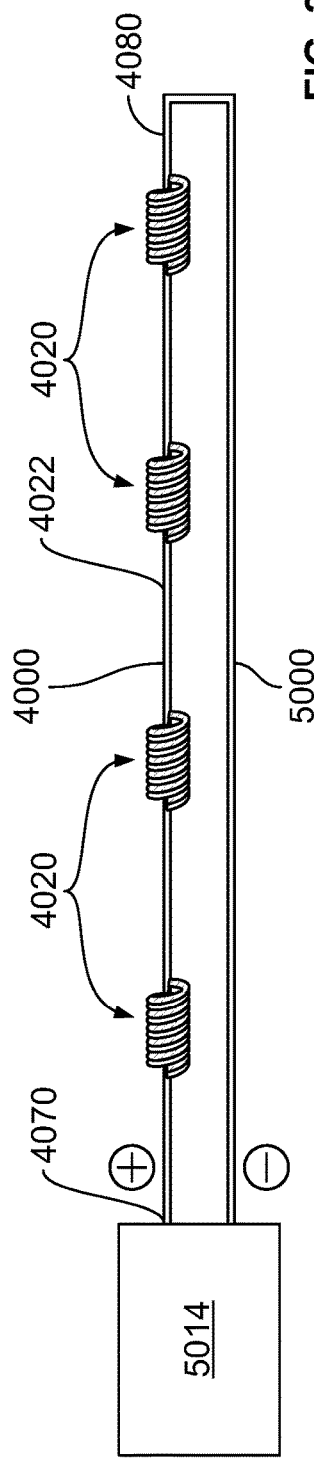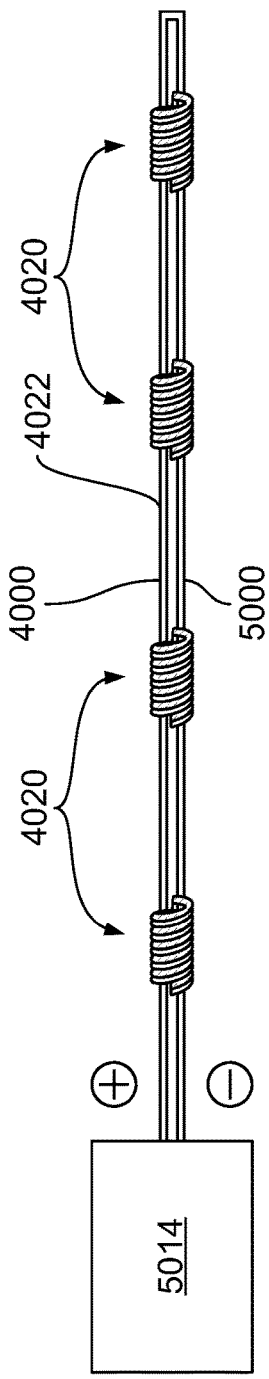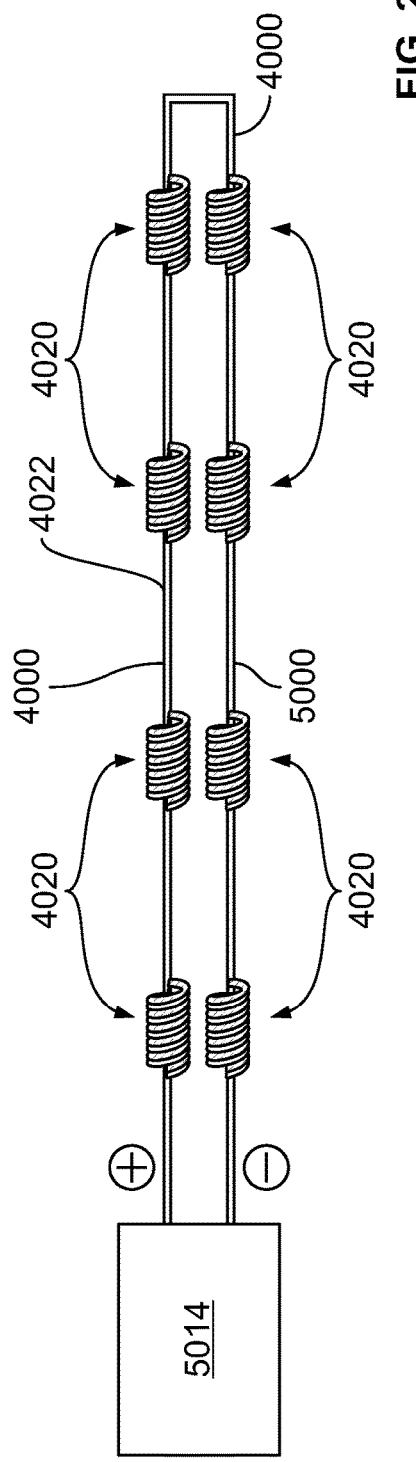

Conductive Paint/Coating

DEVICE AND METHOD FOR SENSING UNDERWATER SOUND PRESSURE

CROSS-REFERENCE TO RELATED APPLICATIONS

This application is a National Phase Application of PCT International Application No. PCT/US2018/066764, International Filing Date Dec. 20, 2018, claiming the benefit from U.S. Provisional Patent Application No. 62/609,838, filed Dec. 22, 2017 and entitled "DEVICE AND METHOD FOR SENSING UNDERWATER SOUND PRESSURE", all of which being incorporated herein by reference in their entirety.

FIELD OF THE PRESENT INVENTION

The present invention directed to device and method for sensing underwater sound pressure.

BACKGROUND

Devices for sensing underwater sound pressure, also known as hydrophones, have had many forms since World War I. Common forms include a cylindrical shell. A majority of such sensors have been made of piezoelectric ceramics or crystals. Such materials may generate charge or voltage when subjected to pressure or stress, and thus can be used to sense sound pressure under water with proper insulation and design. The problem of piezoelectric ceramics or crystals has been their fragility, especially under extreme hydrostatic pressure in deep water. Later on, the invention and use of poly(vinylidene difluoride-trifluoroethylene) or P(VDF-TrFE) co-polymer, other type of piezoelectric material, improved the reliability and the toughness of the hydrophone. However, the copolymer shell in such prior devices made using a cylindrical shell needed to be thick enough to maintain sensitivity and to sustain high pressure under water. Polarizing such a thick piezoelectric P(VDF-TrFE) co-polymer when shaped as a shell may mandate extremely high voltage at an elevated temperature, e.g. 100 MV/m at 100 degrees C.: the thicker the material, the higher voltage needed. High voltage manufacture may be dangerous, and may involve high cost high voltage equipment. In addition, it also demands an expensive specialized extrusion equipment to extrude cylindrical shells out of P(VDF-TrFE). For such prior-art solid wall tubes, the thicker the material is, the more likely there are to be defects. Such defects may result in less dielectric breakdown strength, and during polarization the material may be electrically shorted, and burning may occur. The manufacturing yield may be low.

In field applications, traditional hydrophones in numbers are connected in a long daisy chain. Such a chained configuration requires many manufactured in-between connections to be created after the cylinders are created, by soldering or by mechanical contacts, which are laborious to create and unreliable. In particular, copolymer cylindrical shells may require the use of conductive paint as electrodes, which cannot be soldered. Only mechanical contacts can be used to connect the painted electrodes and metal electrical leads, such as copper strips. Such mechanical connections often fail in the field due to high cycles of bending and stretching.

It would be useful to use an easy-to-make, safe-to-pole and flexible piezo-cable to produce hydrophone, which includes a minimum of mechanical connections.

SUMMARY

Embodiments of the present invention include a hydrophone cable for sensing underwater pressure or sound, which may be for example easy to manufacture and reliable.

In one embodiment a piezo-cable allows multiple tubes to form on a single continuous cable hydrophone without the need to create any individual connections among the tubes, thus saving labor and improving robustness. For example, one may spirally wind or coil a piezo-cable into a tubular form.

The flexibility of P(VDF-TrFE) co-polymer allows it to be extruded as a thin tubular insulation layer on to electrical wire. Once this insulation layer of copolymer is polarized by a high electric field, it becomes piezoelectric and is sensitive to sound pressure if a proper connection is made. Because this insulation can be thin, the wire remains flexible, the required polarizing high voltage is much less than with thicker piezo material (e.g. tubes made directly from piezo material), and thus the voltage is less dangerous, and the yield will be high. This form of insulated wire with proper electrical connection is also called piezo-cable.

Embodiments of the invention may provide a method to produce a low cost and easy-to-make device to sense underwater sound pressure. This sensing device may include wound piezo-cable. The wound forms can be for example a tubular shape with constant diameter or varied or varying (within the device) diameter such as a sphere, oval cross-section or a football shape. The size of the wound form can be scalable in length, in thickness or in diameter. For example, a thicker tube may be made by wrapping multiple layers of pre-manufactured cable, and such a thicker tube may be manufactured without increasing the polarization voltage needed. A thicker-walled tube may provide more strength against hydrostatic pressure, and also may have greater sensitivity, for example if series connections are used. The wound form can include multiple layers, which may be electrically connected in parallel to increase capacitance or in series to increase voltage sensitivity. The wound form can be bonded or connected by solvent or adhesives such as epoxy or silicone rubber, or may be connected by another manner such as twisting the cables. A continuous long piezo-cable can be wound into multiple tubular forms, as if daisy-chained together, without any individual connection in between being manufactured (separate from the manufacture of the cable itself): when used herein, the lack of the need of a connection refers to the lack of the need to actively connect, using e.g. soldering, welding, mechanical clamping, etc., two components or wires. Instead, different portions of a hydrophone (e.g. hydrophone units such as sensing tubes or cylinders) according to some embodiments may be connected by being formed of one or more continuous (possibly with the exception of cutting) piezo cables; connections are inherent in the manufacture of each strand of cable itself. Various coatings or alterations may be made to the wound cables. Cutting may occur for some strands of cable. A conductive coating may be applied. EMI (electromagnetic interference) coating or shielding may be applied. For protection, the wound form can be coated with pressure sensitive material such as silicone rubber or urethane.

In some embodiments of the present invention, a hydrophone may include a first piezoelectric cable including alternating sections of positive polarity and negative polarity, and a second piezoelectric cable comprising alternating sections of negative polarity and positive polarity, where each section of positive polarity of the first piezoelectric cable is bonded to a section of negative polarity of the second piezoelectric cable. However, in some embodiments, alternating sections of positive polarity and negative polarity need not be used: for example two parallel (parallel in the sense of extending side by side) cables may be used, each having a polarity opposite of the other, e.g. one having + polarity and the other − polarity. In some embodiments of the present invention, a hydrophone may include a first piezoelectric cable and a second piezoelectric cable arranged in alternating coiled sections and uncoiled (not wound) sections.

Methods of manufacture of a hydrophone are described. Some embodiments of the present invention include winding or coiling a first piezoelectric cable and a second piezoelectric cable at the same time, for example around the same mandrel or other structure, to create a series of wound or coiled sections or units each including the first piezoelectric cable and the second piezoelectric cable; the units or coiled sections alternating with a series of not coiled or wound sections which also include the first piezoelectric cable and the second piezoelectric cable.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 2 is an example of piezo-cable according to one embodiment.

FIG. 7 illustrates an example of wound football or sphere form according to one embodiment.

FIG. 23A illustrates sample connection points for signal processing, according to an embodiment of the present invention.

FIG. 23B illustrates sample connection points for signal processing, according to an embodiment of the present invention.

FIG. 23C illustrates sample connection points for signal processing, according to an embodiment of the present invention.

DETAILED DESCRIPTION

Figure 1:
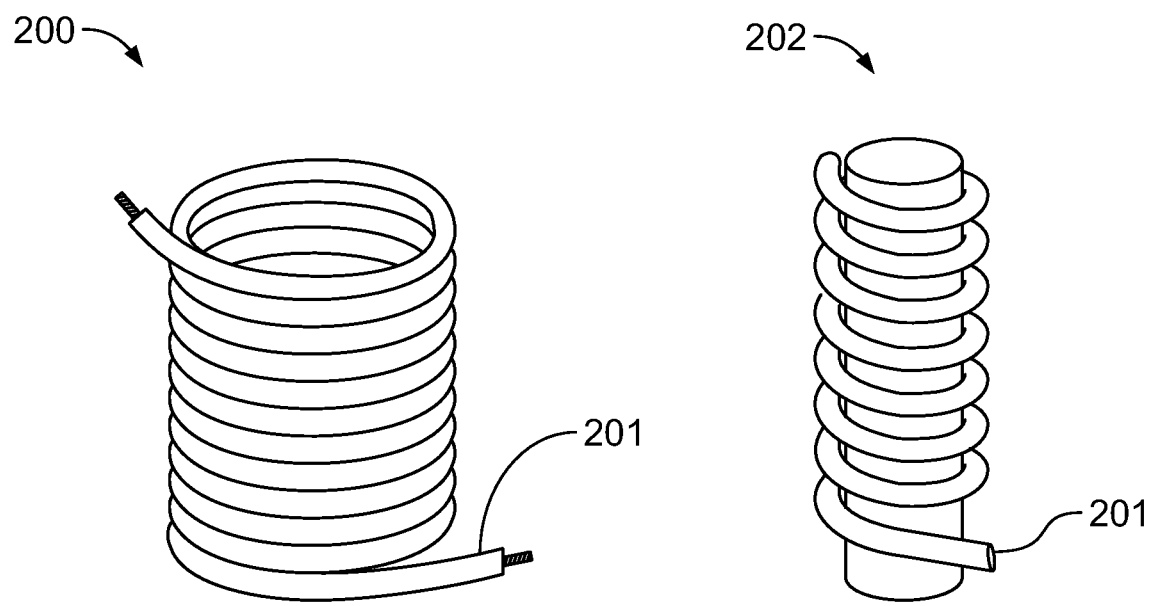
FIG. 1 is an example of piezo-cable as a sensor according to one embodiment.

In the following description, various aspects of the present invention will be described. For purposes of explanation, specific configurations and details are set forth in order to provide a thorough understanding of the present invention. However, it will also be apparent to one skilled in the art that the present invention may be practiced without the specific details presented herein. Furthermore, well-known features may be omitted or simplified in order not to obscure the present invention.

Embodiments of the present invention include sensors used to detect underwater sound pressure, and methods for manufacture. However, embodiments of invention have applications for detecting sound pressure in other media such as air, oil or soil, and vibrations in structures or pipes. The features of the invention are subject to alteration and modification and therefore the present description should not be considered limiting.

Some embodiments include a hydrophone which is easier to manufacture than prior hydrophones, as an embodiment may be manufactured from one or more, substantially continuous, strands of piezo cable (which may be subsequently cut, after manufacturing) obviating the need for numerous manufactured, soldered or otherwise created connections between individual sensors. Ease of manufacturing may also result from embodiments of a manufacturing method disclosed herein, where piezo cable is polarized in an alternating pattern. In some embodiments, a hydrophone without manufactured or created connections between individual units or sensors (connections rather being from a continuous strand of piezo cable) may be more physically robust, as connections between individual hydrophone sensors may fail in the physically demanding underwater environment, where hydrophone cables of for example 1 kilometer in length may be coiled, uncoiled, and dragged behind ocean vessels. In some embodiments, a hydrophone may have superior sensing and signal producing performance, by using two or more piezo cables in parallel (parallel in the sense of being physically side by side). Superior sensing, a boosted signal, noise reduction and signal producing performance may also be achieved by for example, using piezo cables having different polarization from each other, and/or sections of alternating polarization. Superior signal production may result from serial and/or parallel electrical connections between hydrophone units or tubes, which may be achieved from specific patterns of polarization and/or cutting of piezo cable, according to some embodiments.

In some embodiments, a hydrophone may refer to an individual sensing unit, such as one cylinder of coiled piezo cable which may be connected to other such units; and hydrophone may also refer to an entire structure of many such hydrophone units connected along many tens of meters, or several kilometers.

When used herein, "continuous" piezo cable may include one long piezo cable (or more than one arranged physically in parallel) manufactured into a hydrophone with some cuts in the cable(s) made, or some sections removed after coils are created. E.g. one of the two (or more) sections of uncoiled cable between sensing units may be removed, with the other piezo cable section remaining to connect the units. Removed piezo coating or jacket material may be re-used in manufacturing. In some embodiments, for at least a portion of a hydrophone, in each combination of adjacent coiled section and uncoiled section, or for each coiled section and uncoiled section that are adjacent to each other, one of the first piezoelectric cable or the second piezoelectric cable is cut: e.g. cutting may occur at or near the end of a coiled section, at a point in an uncoiled section, by removing some length (e.g. ¼ inch, 10 inches) of cable or inner wire or conductor, etc.

A typical prior art hydrophone may be for example a cylindrical shell, e.g. made of brittle piezoelectric ceramic material, such as PZT (lead zirconate titanate), sensing the pressure difference between inside and outside of the device. The inside and outside surfaces may be separately metalized with plating or electrically conductive ink (e.g. forming an outer conductor) and may serve as electrodes for electrical connections. The end caps on both ends may isolate the pressure inside the tube from the outside. The piezoelectric material may respond to the pressure difference between inside and outside. Typically immersed in deep water, the outside static pressure of the hydrophone increases as the depth increases, while the inside pressure stays the same. This will increase the resultant pressure on the material as the depth increase, and eventually will cause the material to fail at deep water.

P(VDF-TrFE) copolymer is an alternative to piezoelectric ceramics and crystals and has a lower piezoelectric constant, the amount of charge generated per unit force. Due to its polymer characteristic, P(VDF-TrFE) copolymer is much less brittle than ceramics and crystal. However, to sustain high pressure and maintain enough sensitivity, the required thickness demands extremely high voltage to polarize the material at an elevated temperature. As an example, the thickness of such kind of hydrophone shell is about 1 millimeter and requires 100 kilovolts at 100 degree Celsius to polarize. To have a uniform sensitivity across the whole surface area of a hydrophone, the thickness of the shell should be constant. To increase the yield of polarization process, the material should be free of contamination and voids. To achieve these, high cost investment of a clean environment and a high precision tubular plastic extrusion equipment is essential.

To avoid such extremely dangerous high voltage and high equipment cost, instead, embodiments of the present invention may utilize an easy-to-make, safe-to-pole and flexible coaxial piezo-cable 201 to form a cylindrical shell shape 200, an example embodiment of which is shown in FIG. 1. Using cable coated with piezo material may enable a thin layer of piezo material (e.g. 250 microns) to be used, requiring a lower voltage of for example 25 kV. Prior art cylindrical shells formed as shells from piezo material must be made (or formed) and then polarized afterwards. In contrast, in embodiments of the present invention, a piezo cable may be first polarized before being coiled or wound into a tube.

Coaxial piezo cables 201 have been used as guitar pickups and traffic sensors. FIG. 2 illustrates an example coaxial piezo cable 300 that includes an inside electrically conductive core 301, an insulation layer 302, and an outside electrically conductive layer 303. The inside conductive core 301 can be a solid conductive material (e.g. metal wire) or stranded conductive wires. The outside electrically conductive layer 303 can be for example a thin layer of electrically conductive paint, coating or ink, a layer of braided electrically conductive wires, or a layer of thin electrically conductive foil. Insulation jacket 302 may be a thin and tubular layer of P(VDF-TrFE) copolymer piezoelectric material. Other suitable piezoelectric materials may be used. Such a piezo layer can be radially polarized in either direction by switching the polarity between inside and outside conductors. For example, if the outside electrode is applied with positive voltage and the inside electrode is grounded, the cable is called positively polarized 304. Vice versa, if the outside electrode is applied with negative voltage and the inside electrode is grounded, the cable is called negatively polarized 305. Other polarization methods, such as the corona discharge needles method with heating discussed elsewhere herein, may be used.

As can be seen in FIG. 2, the construction of piezo cable 300 has a construction similar to that of a regular insulated electric cable, one difference being the material of the insulation layer. As a result, the unpolarized piezo cable itself can be easily manufactured in a manner similar to that of regular insulated electric cable using a cable extrusion machine. The manufacture of a hydrophone from such cable is discussed further elsewhere herein. Furthermore, the insulation layer of such type of cable is commonly thin, typically in an order of 250 microns in thickness, which may permit a lower and safer polarization voltage. Such a cable may have an inner wire or conductor of for example 1 mm diameter.

FIG. 1 depicts an embodiment of the present invention that utilizes a coaxial piezo-cable to form a cylindrical shell or a tube, e.g. a sensing unit, by coiling or winding around a cylinder 202. After being wound, the piezo-cable may be adhered together (e.g. adjacent coils adhered) for example by solvent (e.g. dissolving coating or jacket material which then flows together), epoxy, cyanoacrylates, or other adhesive. Then the cylinder 202 is removed from the cylinder and a tubular shape is formed. Electrically conductive coating or ink may then be applied on to both inside and outside surface of the tube, forming a terminal for ground and serving as an EMI shield. The coating may be a charge collector and aid in signal detection. The electrically conductive core inside piezo-cable forms a terminal for a converted electric signal. To protect the form, a layer of pressure sensitive material, such as silicone rubber or urethane can be applied inside, outside of the tube or both.

Figure 3A:
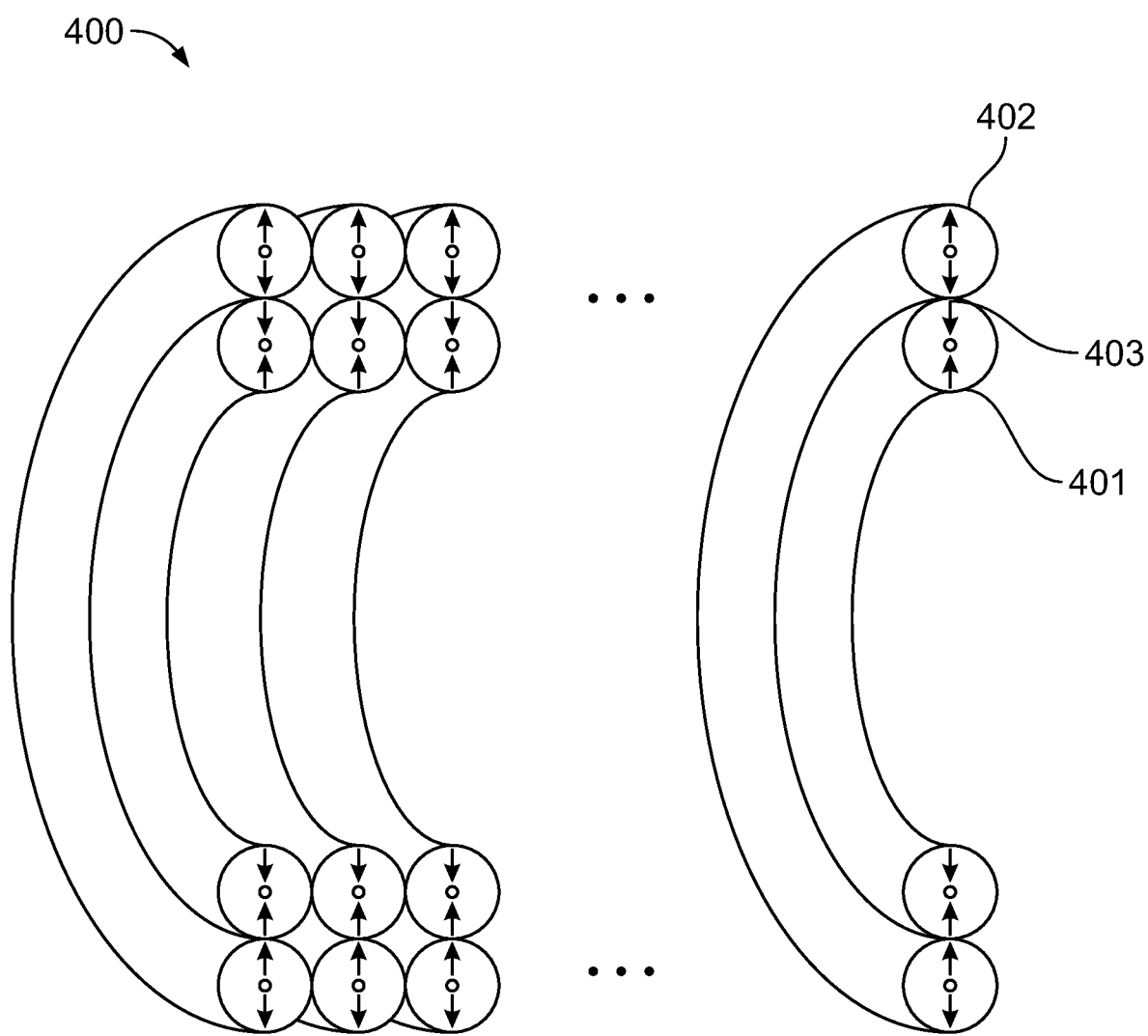
FIGS. 3A, 3B, 3C, 3D and 3E are examples of multiple wound layers connected in series according to various embodiments.
Figure 3B:
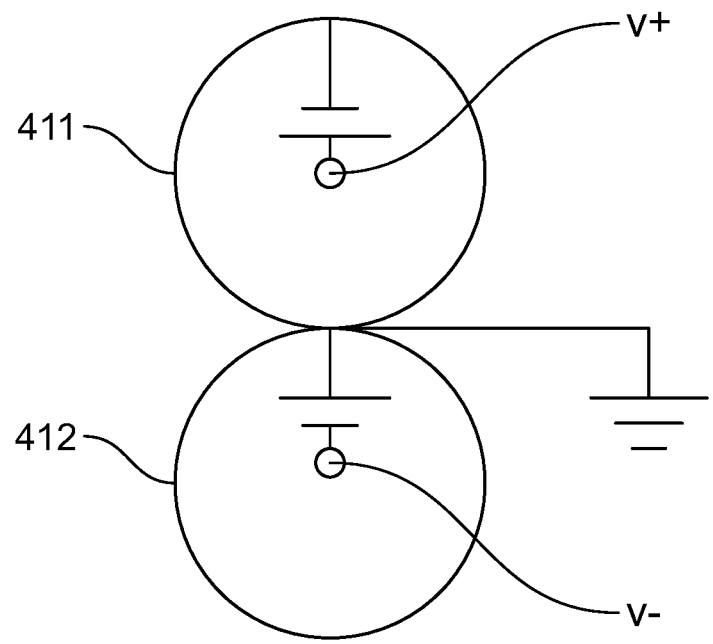
Figure 3C:
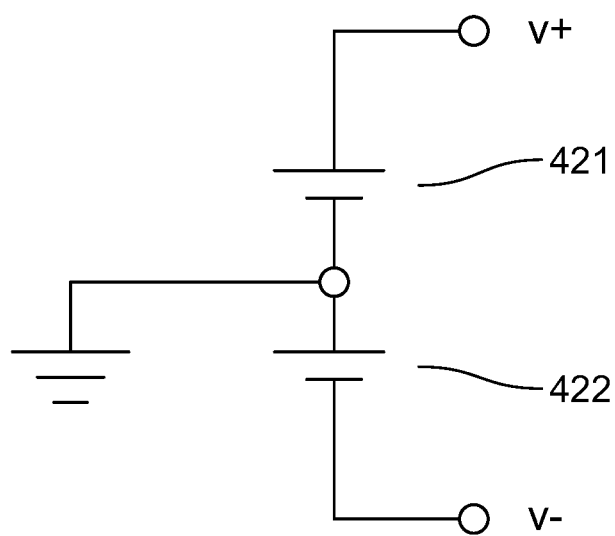

Some embodiments may increase sensitivity, that is, the voltage output per unit pressure, by for example connecting two layers wound in series. In the embodiment of FIG. 3A two layers of wound piezo-cable tube are connected in series 400 to double the output voltage. The first layer of wound piezo-cable 401 may be polarized negatively 305, as described in FIG. 2. The second layer of wound piezo-cable 402 may be polarized positively 304, as described in FIG. 2. Both wound layers 401, 402 may be connected with their outside conductive layers 403. The inside core conductors of both wound layers 401, 402 may provide the output voltage that is the sum of individual layers. Viewing each wound layer 411, 412 as analogous to a voltage generator or a battery with corresponding polarity as in FIG. 3B, the wound layers connected in series can be schematically shown (for analogy purposes) as two batteries 421, 422 connected in series as in FIG. 3C.

Figure 3D:
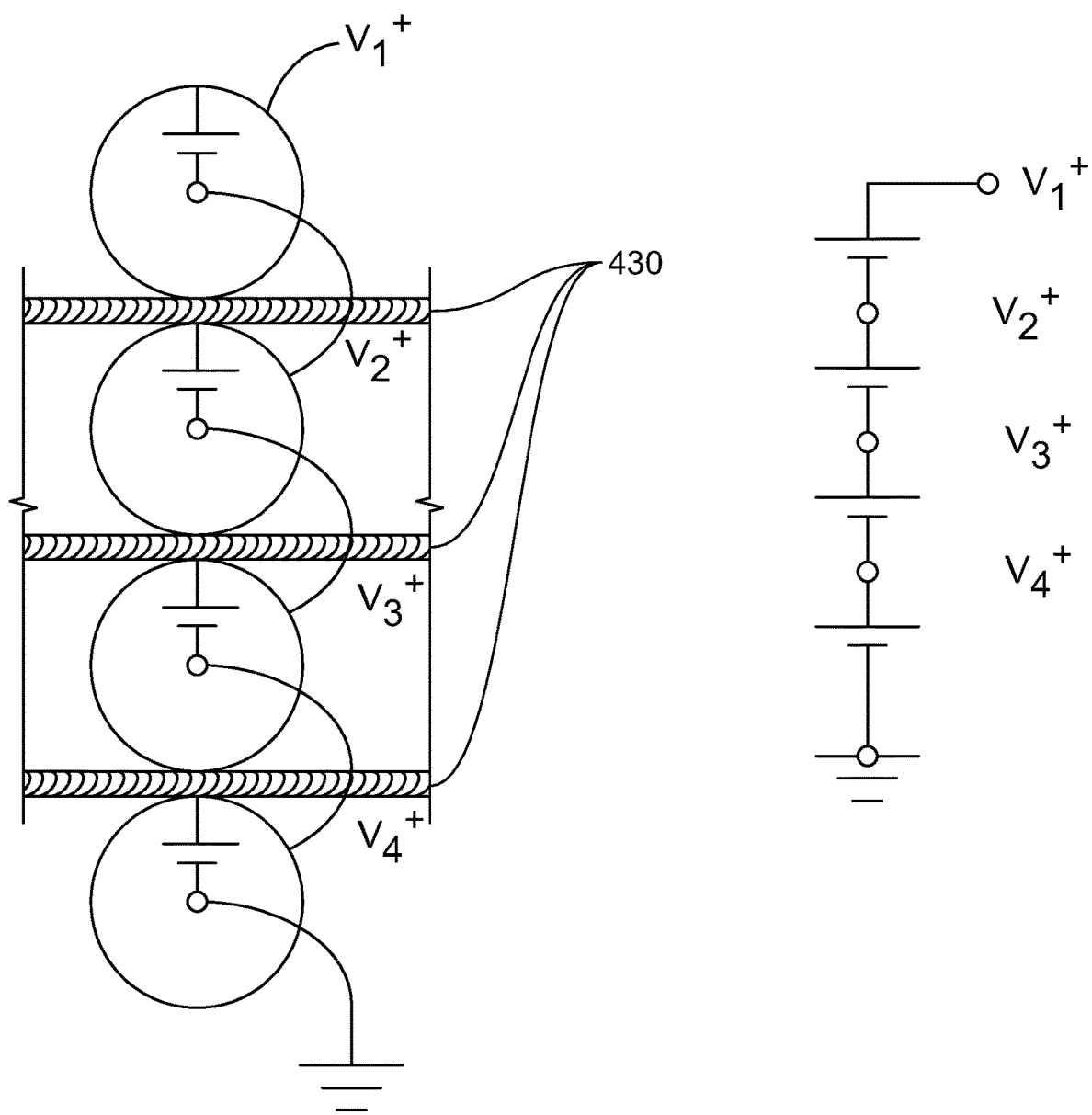
Figure 3E:
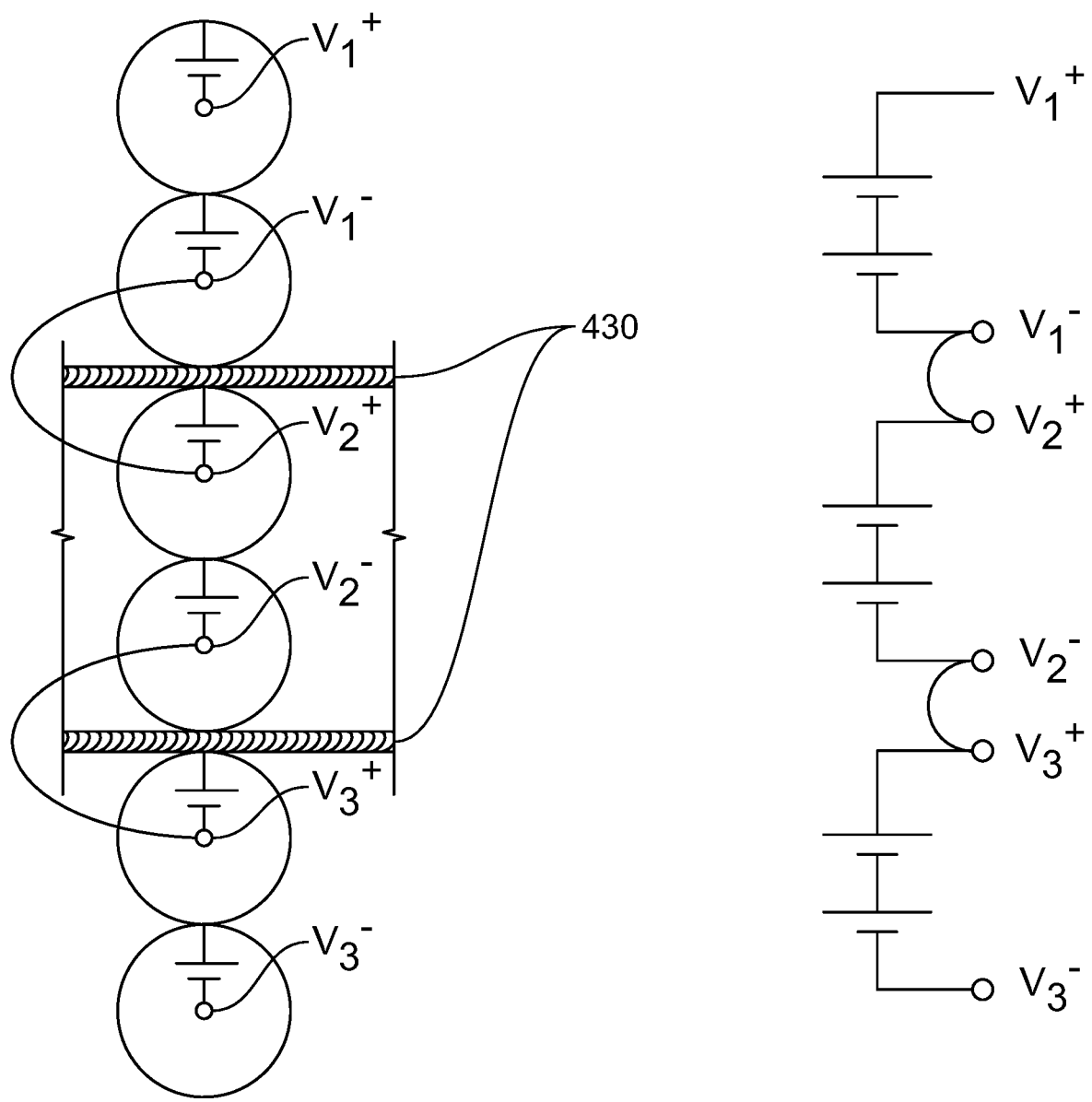

In some cases, it may be desirable to connect more than two wound layers in series to multiply output voltage by more than two times. As an example, layers of insulation 430 can be added in between wound layers with the same polarity, as shown in FIG. 3D (with an analogous voltage generator or a battery shown). As another example, layers of insulation 430 can be added in between double wound layers with paired polarities, as shown in FIG. 3E (with an analogous voltage generator or a battery shown).

Figure 4:
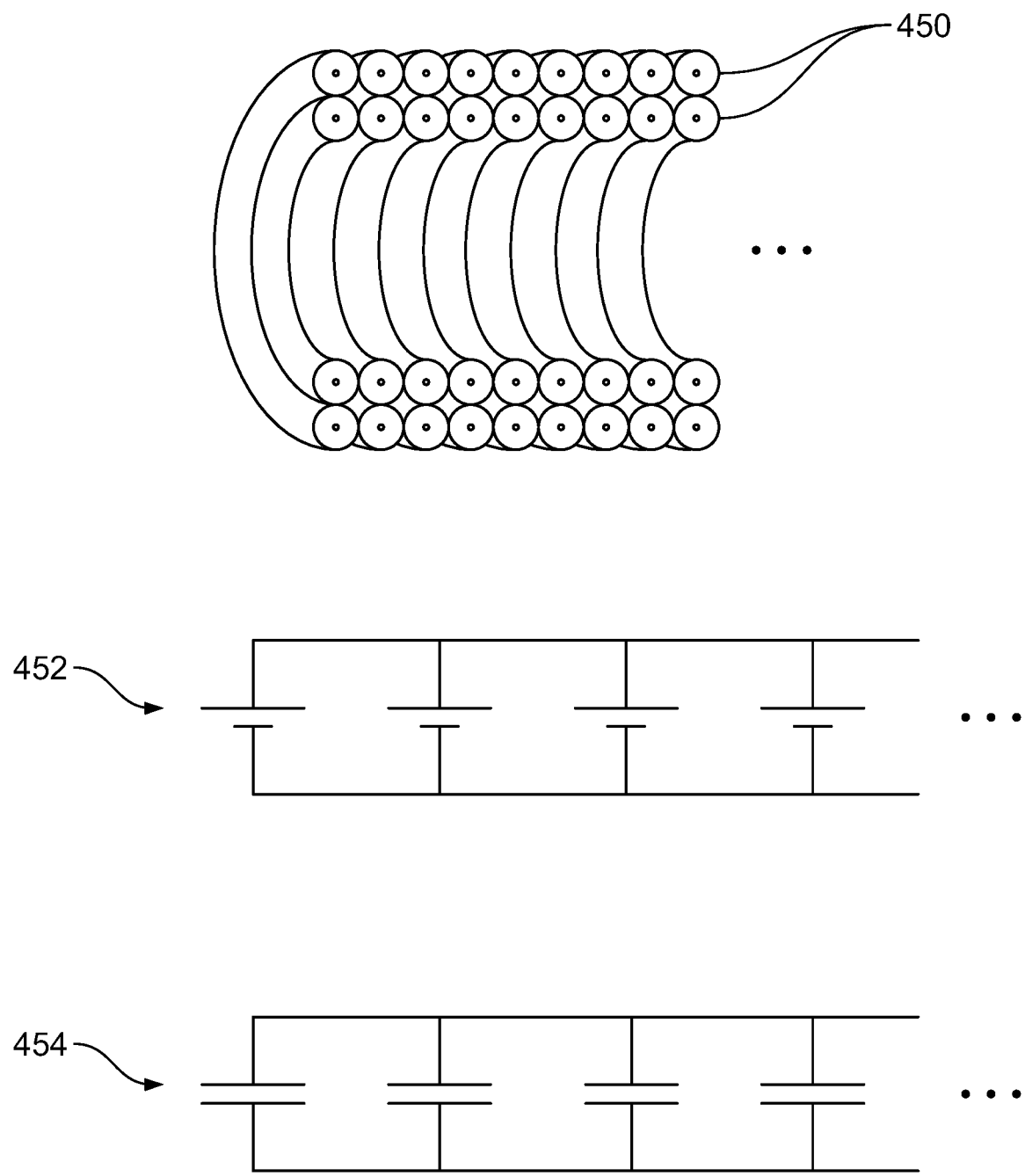
FIG. 4 illustrates an example of multiple wound layers connected in parallel according to one embodiment.

Other embodiments may increase the capacitance of the sensor so that the roll-off frequency of the frequency response at low frequency can be minimized in the amplification circuitry. To do so, as shown in FIG. 4, the wound layers 450 can be the same polarity and connected continuously. Circuit 452 shows that the output voltage stays the same with wound layers connected in parallel (with analogous voltage generators or batteries shown) according to one embodiment, while circuit 454 shows the capacitance multiplies with wound layers connected in parallel (with analogous capacitors shown) according to one embodiment.

In other embodiments, the thickness of the wound tube is minimized. To reduce the thickness, the coaxial piezo cable can be first flattened for example by a roll mill or a press before it is wound and formed, as shown in the cutaway view of wound and flattened cable 460 of FIG. 5. Another benefit of this configuration may be to increase active sensing area.

Figure 6:
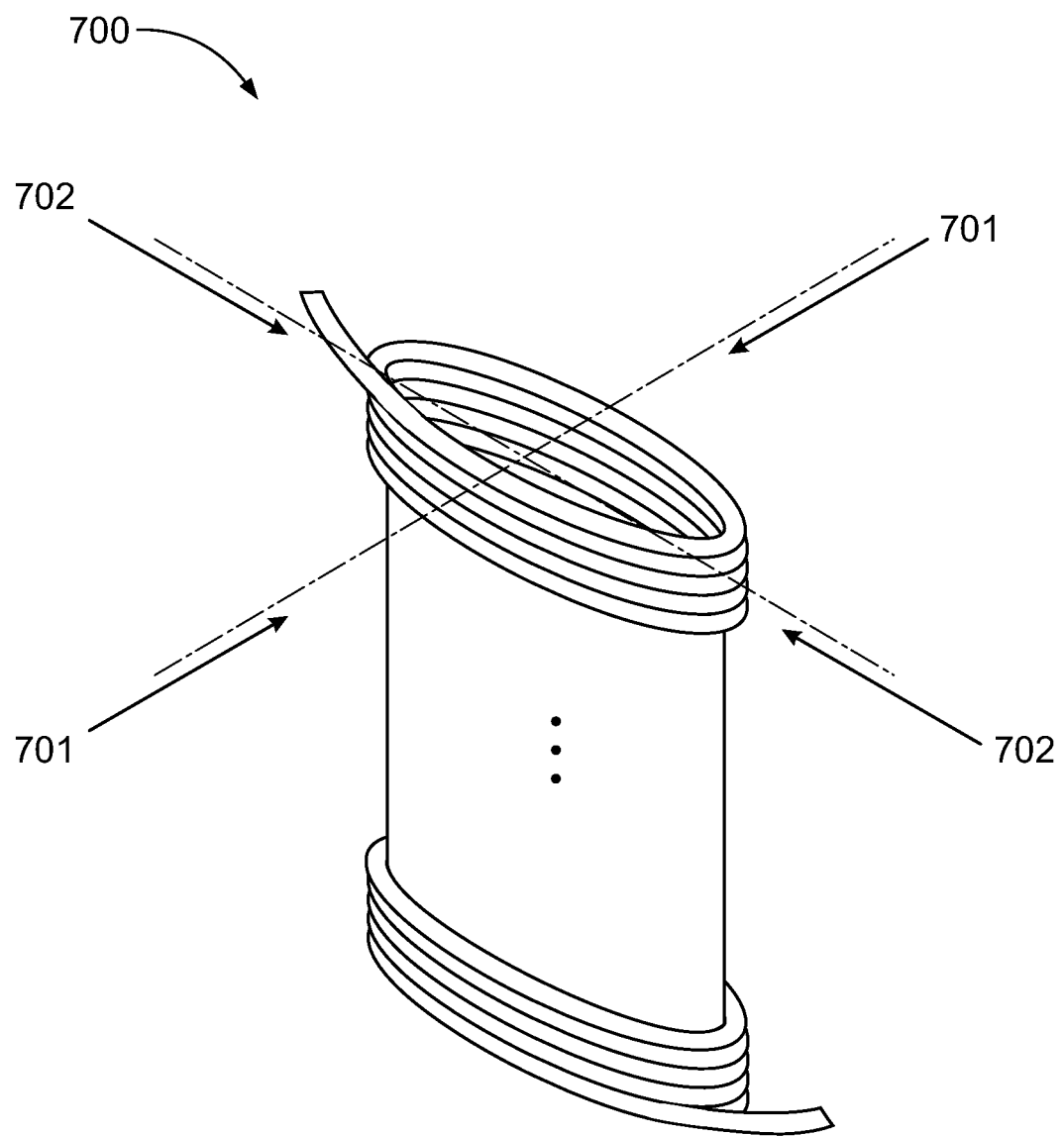
FIG. 6 illustrates an example of wound tube with an oval shape cross section according to one embodiment.

In some embodiments, a hydrophone may be directional. To achieve this, one can form the tube around a cylinder with an oval or oblong shape cross section, as shown in FIG. 6. A wound tube with oval shape cross section 700 may have higher sensitivity in one direction 701 than the other 702.

In some embodiments, hydrophone may have more sensing area per unit volume than other designs. To achieve this, in some embodiments instead of a constant diameter cylindrical shell, a wound football or oval 801 or sphere 802 shape can be formed, as shown in FIG. 7. In one embodiment, a hydrophone unit has a cross section which is circular, but which varies in diameter, which may give a football shape. In one embodiment, a hydrophone unit has a cross section which is not circular—e.g. oval, eye shaped, etc.

Figure 5:
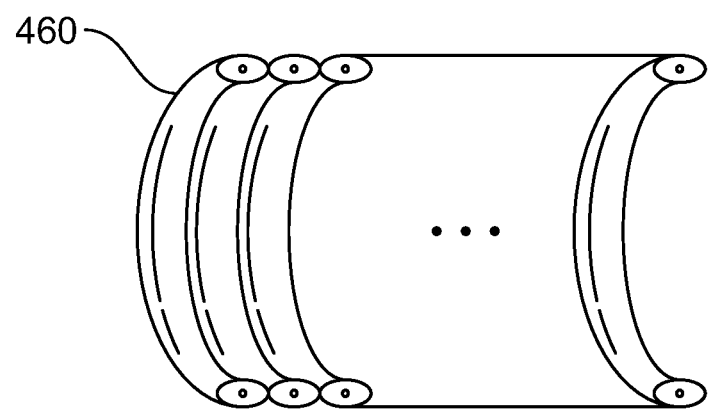
FIG. 5 illustrates an example of flat piezo-cable and a wound tube according to one embodiment.

As can be seen, the size of wound tubes or sensing units may be scalable in length, in thickness and in diameter. One size or kind of cable can be manufactured, and fabricated into tubes of different dimensions. Using the same diameter of the piezo-cable, to change length or diameter of the tube, one only needs to change the length or the diameter of the substructure (e.g. mandrel) of the cylinder to wind or coil on. To add the thickness of the wound tube, one can wind multiple layers to meet the requirement. To reduce the thickness of the wound tube, one can use a smaller size piezo-cable or a flattened piezo-cable, as shown in FIG. 5.

Figure 8:
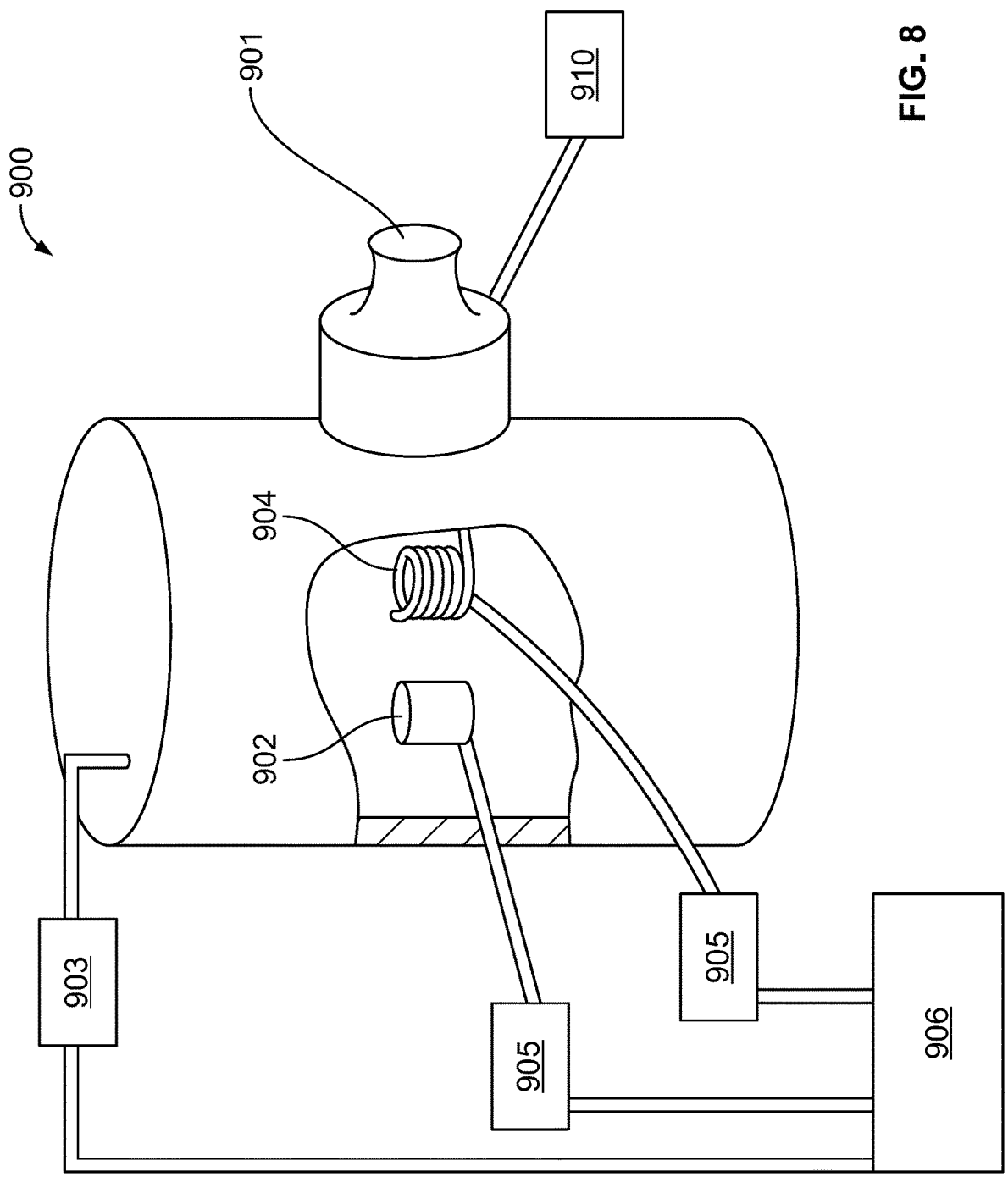
FIG. 8 illustrates an example of a calibration setup in air using air pressure sensors or a calibrated hydrophone according to one embodiment.

To calibrate the sensitivity of a piezo-cable wound tube, in one embodiment a simple air chamber 900 can be constructed as shown in FIG. 8. Speaker 901 may be driven by an amplified white noise signal 910. Calibrated hydrophone 902 with known sensitivity may be used, or calibrated air pressure sensor 903. Piezo-cable wound tube 904 may be tested (e.g. the device under test). Signal amplifiers (e.g. pre-amplifier) 905 and signal recorders 906 may be used. While speaker 901 emits sound pressure with a white noise wave form during the test, the amplified signals of device under test 904 and the reference hydrophone 902 or the pressure sensor 903 are recorded and transformed into frequency domain using Fast Fourier Transform (FFT). The difference in frequency response between the device under test 904 and the reference hydrophone 902 or air pressure sensor 903 can then be used to determine the sensitivity of the device under test 904.

Figure 9:
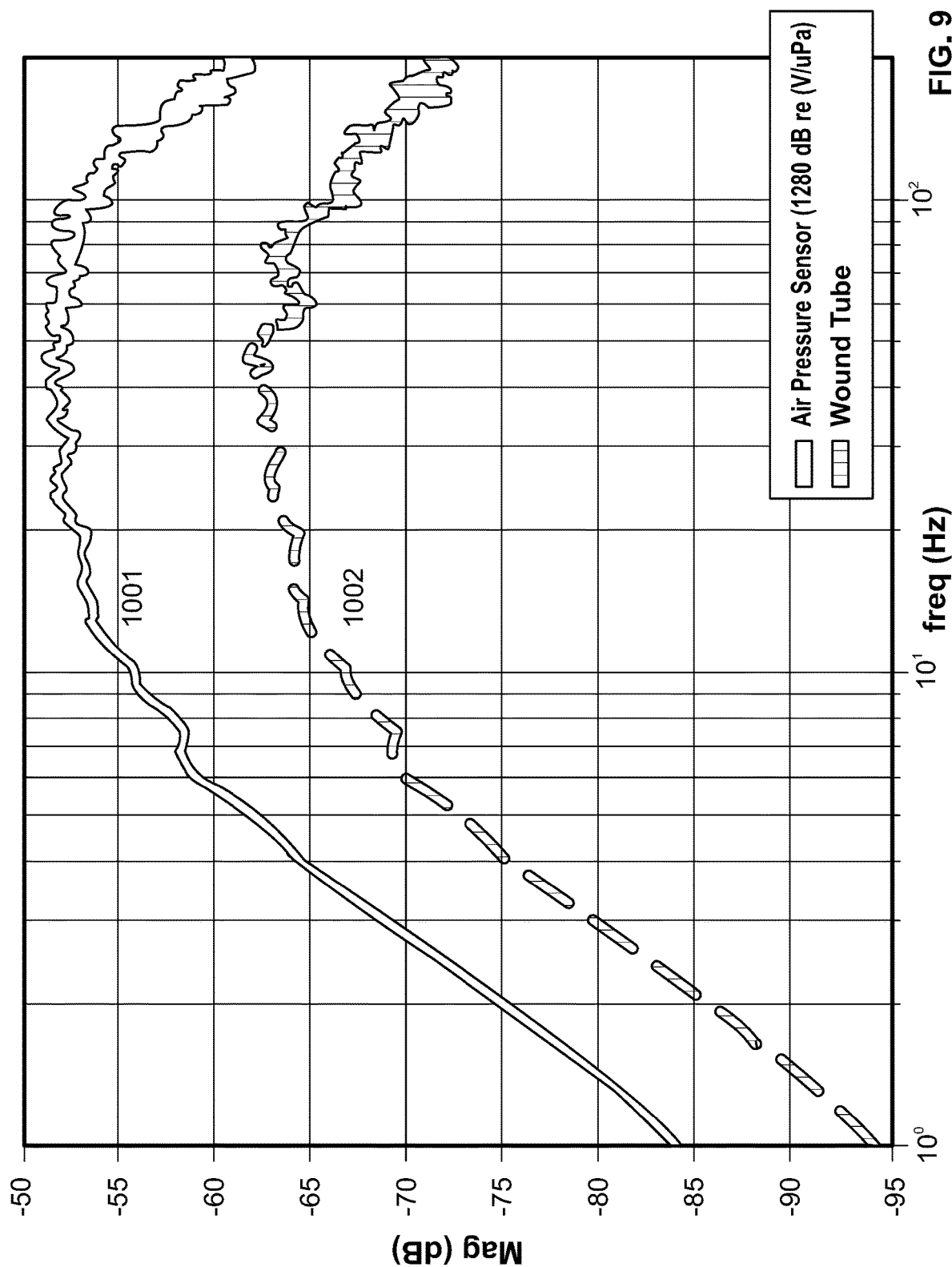
FIG. 9 illustrates typical frequency response of a known air pressure sensors and a piezo-cable wound hydrophone in air according to one embodiment.

As shown in FIG. 9, in one embodiment, 1001 is the frequency response of an example air pressure sensor, of which the sensitivity is −180 dB re (V/μPa) from 0.1 Hz to 200 Hz. Meanwhile, 1002 is the frequency response of a device under test, a piezo-cable wound tube. As an example, at 100 Hz, the difference between the air pressure sensor and the device under test is 13 dB. As a result, the sensitivity of the device under test can be determined as −193 dB re (V/µPa) at 100 Hz. Other frequency responses can be achieved.

Figure 10:
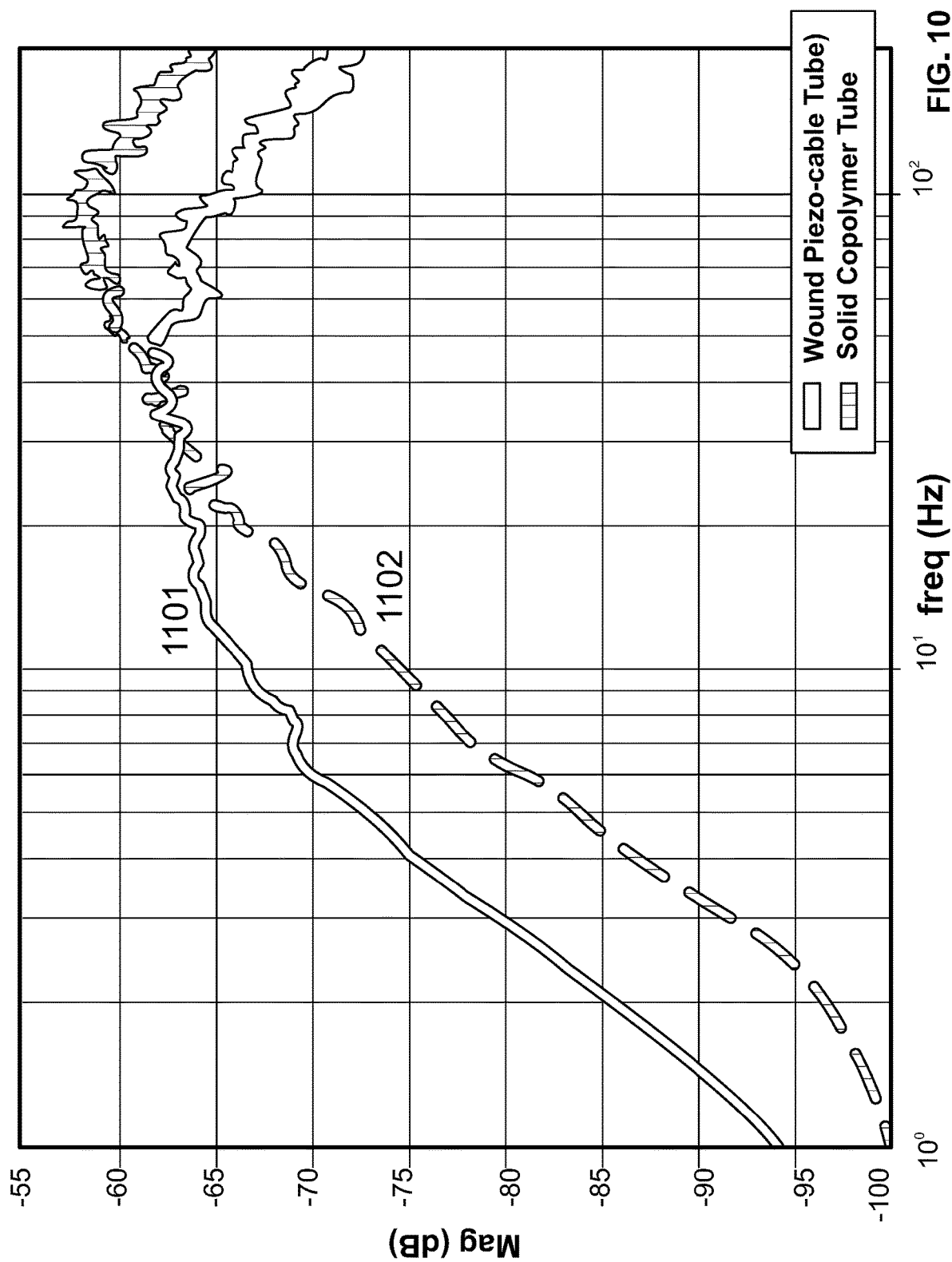
FIG. 10 illustrates typical frequency response in air of a piezoelectric copolymer hydrophone and a piezo-cable wound hydrophone according to one embodiment.

As shown in FIG. 10, in one embodiment, 1101 is the frequency response of an example piezo-cable wound tube 200 (FIG. 1). Meanwhile, 1102 is the frequency response of a solid P(VDF-TrFE) copolymer tube with material being P(VDF-TrFE) copolymer. As can be seen, at low frequency, a piezo-cable wound tube may have higher sensitivity than a solid copolymer tube, due to its higher capacitance. At higher frequency, an example solid copolymer tube has 6 dB higher sensitivity than an example piezo-cable wound tube. Such difference can be compensated by adding more wound layers in series. Other frequency responses can be achieved.

Figure 11:
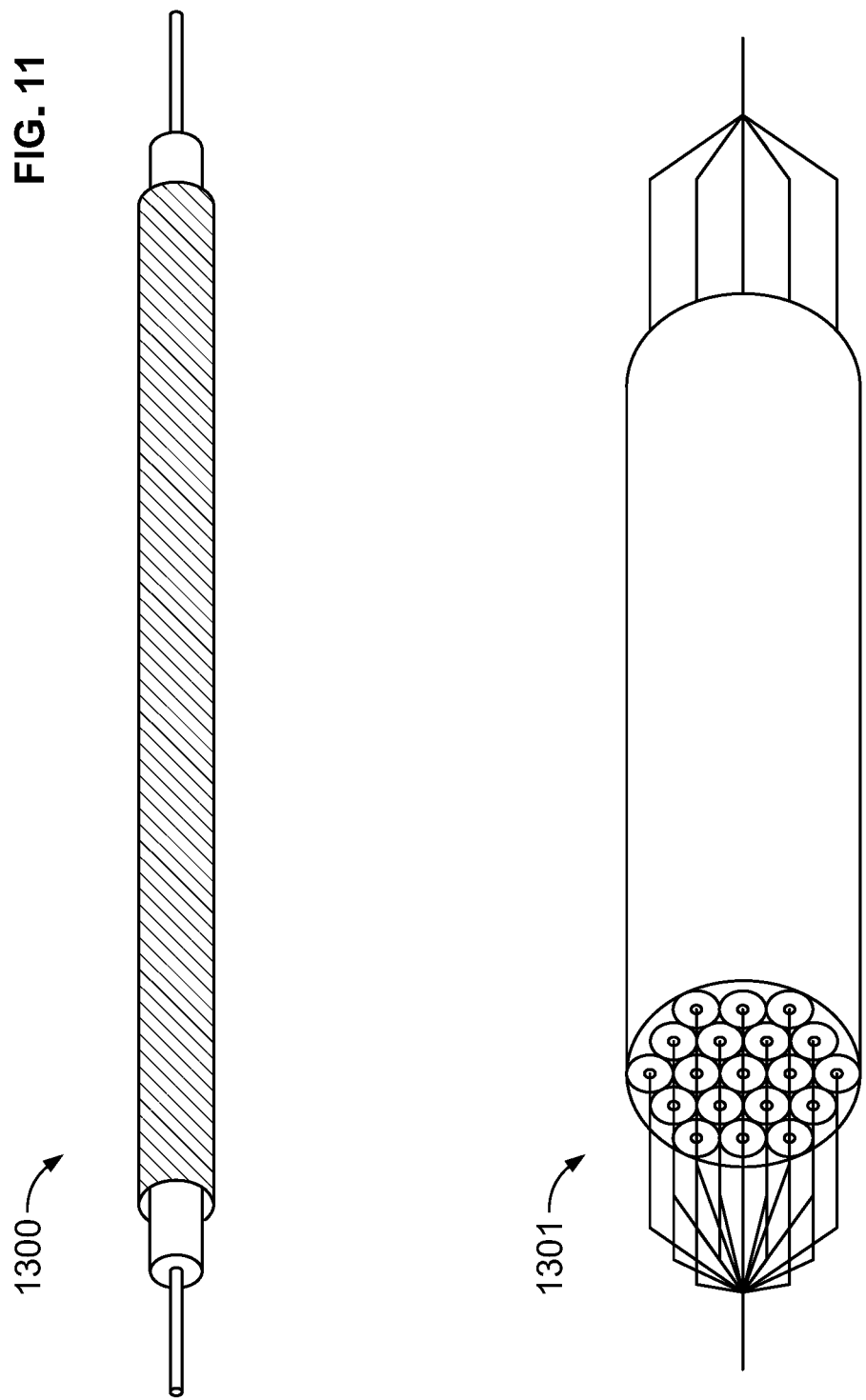
FIG. 11 illustrates a single straight piezo-cable and a bundled piezo-cable according to one embodiment.

To be deployed in the field, traditional hydrophones are usually connected in a long daisy chain. Such a chained configuration requires many in-between connections to be created, for example by soldering or by mechanical contacts. These connections not only involve labor costs to implement but also have a high likelihood of failure. One solution, in one embodiment, as shown in FIG. 11 is to use a single straight piezo-cable 1300 or a bundle of two or more straight piezo-cables bundled or twisted together 1301 in a long continuous length to avoid complicated connections. A single piezo-cable may not provide enough sensitivity; and a bundle of multiple straight piezo-cables may increase the overall weight and decrease the flexibility.

Figure 12:
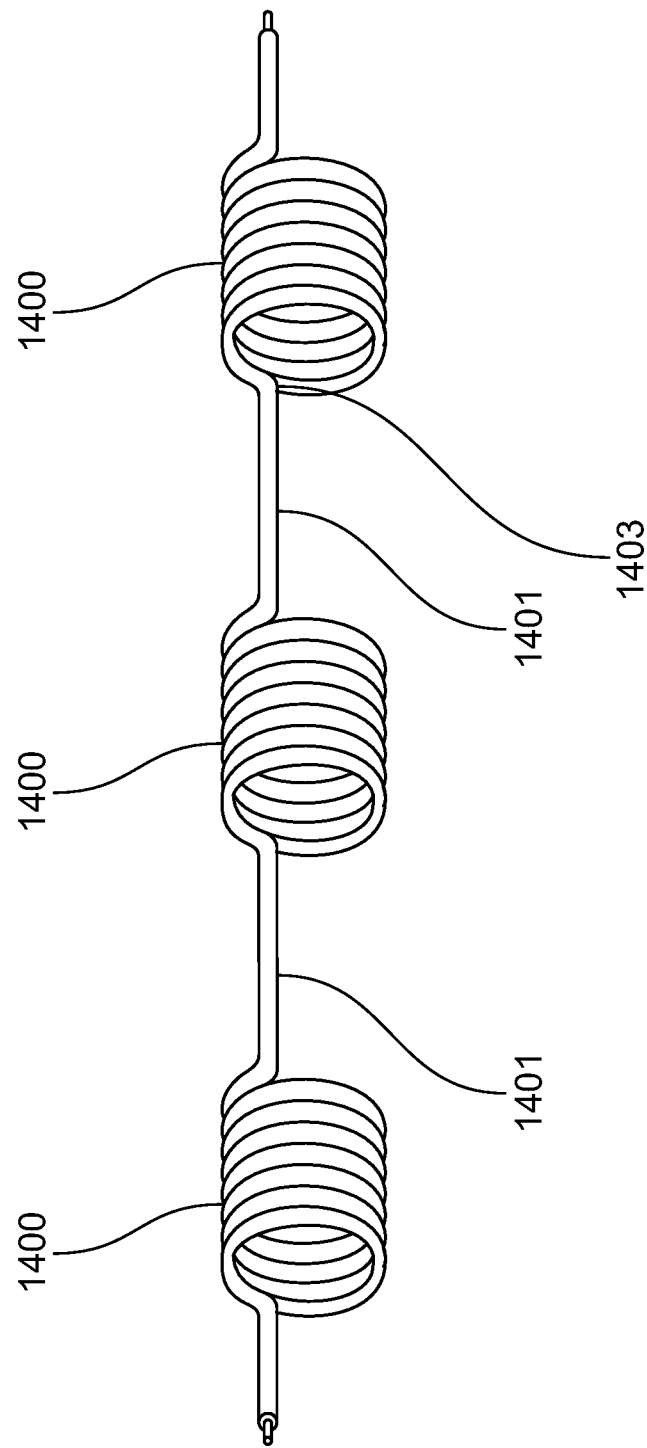
FIG. 12 illustrates an example of an embodiment of the present invention in field application with multiple piezo-cable wound hydrophones, as if connected in a daisy chain.

In contrast to unwound straight cable(s) and traditional hydrophones with solid walls, one embodiment of the present invention includes wound piezo-cable in tubular forms which may provide a solution minimizing laborious-to-produce connections and their possible failure while maintaining high sensitivity and flexibility with less weight. As illustrated in the embodiment of FIG. 12, a long continuous piezo-cable 1403 can be spirally wound into many individual hydrophones, tubes or sensing units 1400 as if connected in a daisy chain. In such a configuration, no or fewer manufactured or created connections are required in between tubes 1400 and the sensing surface area per unit weight may be increased. In addition, the unwound portions 1401 of the cable 1403 in between the tubes provide overall flexibility.

In some cases, it may be beneficial to produce a long daisy-chained hydrophone array using two or more piezo-cables bonded or adhered together, or portions of each cable may be bonded (e.g. only coiled portions). Such bonding may occur prior to coiling, and/or may occur only at coils, and not in uncoiled sections. In an example shown in FIG. 13, a twisted or bonded (e.g. solvent bonded) twin piezo-cable 1501 with paired polarity 1500 and including two bonded piezo cables 1503 and 1505 can be wound in to multiple tubes 1507 continuously, as if electrically connected in parallel, to provide advantages in signal processing, such as improving common mode rejection, where the paired polarity means the two piezo-cables are polarized reversely or in an inverted manner against each other. (Note parallel when used herein can mean physically parallel, as in two cables running side by side, and also electrically parallel, as in two hydrophone units or coils which are effectively electrically connected in parallel.) In cross section 1500, the arrows represent polarization, with one cable 1503 polarized inward and one cable 1505 polarized outward. Cables 1503 and 1505 are a differential pair used in parallel. Stress (e.g. from sound) on cables 1503 and 1505 may cause charges to flow oppositely in each cable. In one embodiment, charges flowing oppositely do not cancel each other as a signal processor can take one signal and invert or reverse it, electronically. A typical circuit with a differential amplifier or an instrumentation amplifier may process this differential voltage. Either circuit has one inverting and one non-inverting input. The output may be proportional to the difference between two inputs.

Figure 14:
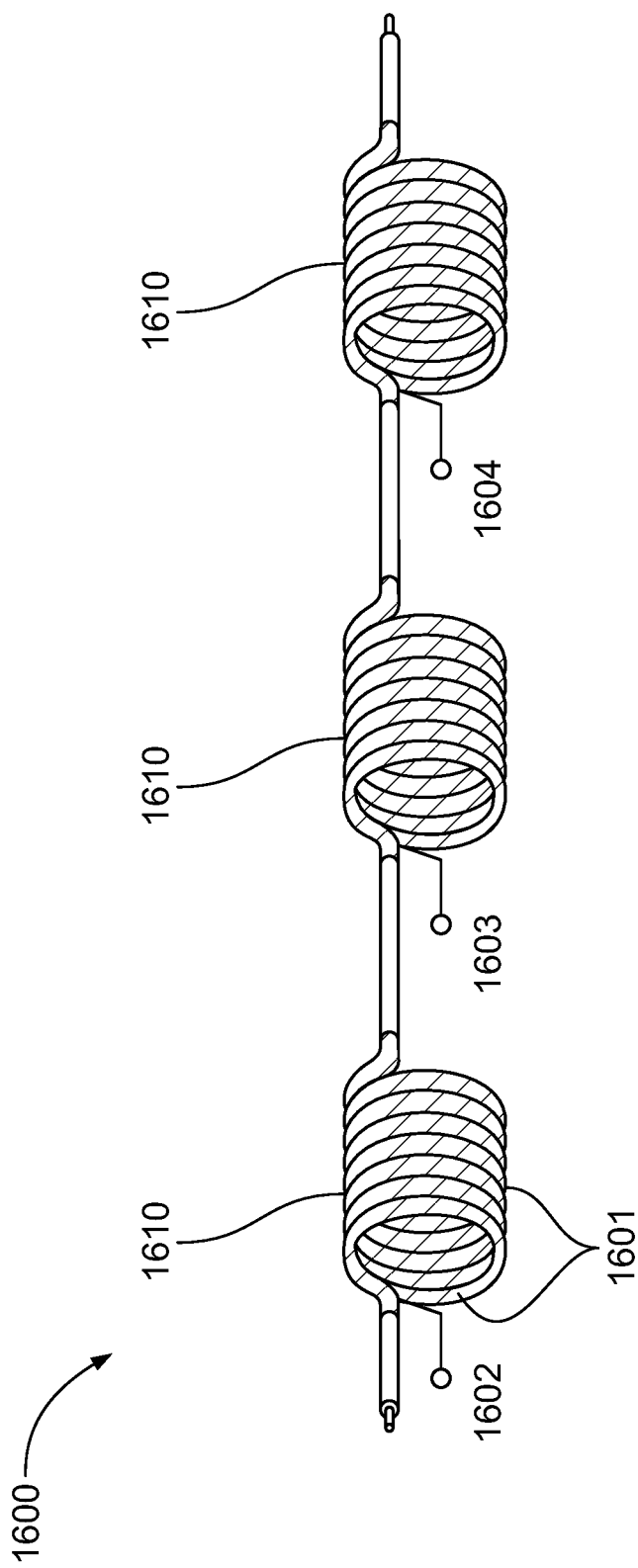
FIG. 14 illustrates another field application example of an embodiment of the present invention with multiple piezo-cable wound hydrophones, as if connected in a daisy chain, where each hydrophone element is grounded individually.

In an embodiment shown in FIG. 14, each tubular form may be grounded individually to provide multi-channel or matrix sensing using hydrophone 1600. The wall surface 1601 of each tube 1610 may be metalized individually for conduction and may form a separate ground connection 1602, 1603, 1604.

In some embodiments, a piezo cable may first be polarized, then coiled into different tubes or hydrophone units, coated with conductive material, and possibly coated with further material such as insulation or structurally supportive coating to create a hydrophone.

In some embodiments, a piezo cable used to create a hydrophone includes of an inner wire or conductor and a layer e.g. having a circular cross-section of piezoelectric copolymer coating or jacket on the outside. An inner core conductor may be for example copper or other metal wire, e.g. solid wire, or twisted strand wire. Typically a flexible inner conductor is used. Using a twisted strand instead of a solid wire may change frequency sensitivity profiles. Piezo-cable can be polarized positively or negatively. Using a pair of positively and negatively polarized cables bonded (or portions bonded) or paired together, e.g. in parallel or side by side, for example with two oppositely polarized cables joined, may in some embodiments reduce common mode noise and boost the signal analogous to two batteries connected in series. The two piezo cables may be connected or bonded using, for example, solvent (e.g. applying solvent to cause coatings of adjacent coils to dissolve partially and to form crosslinks together as the solvent dries), epoxy, cyanoacrylates, or other adhesive such as silicone rubber.

Figure 15:
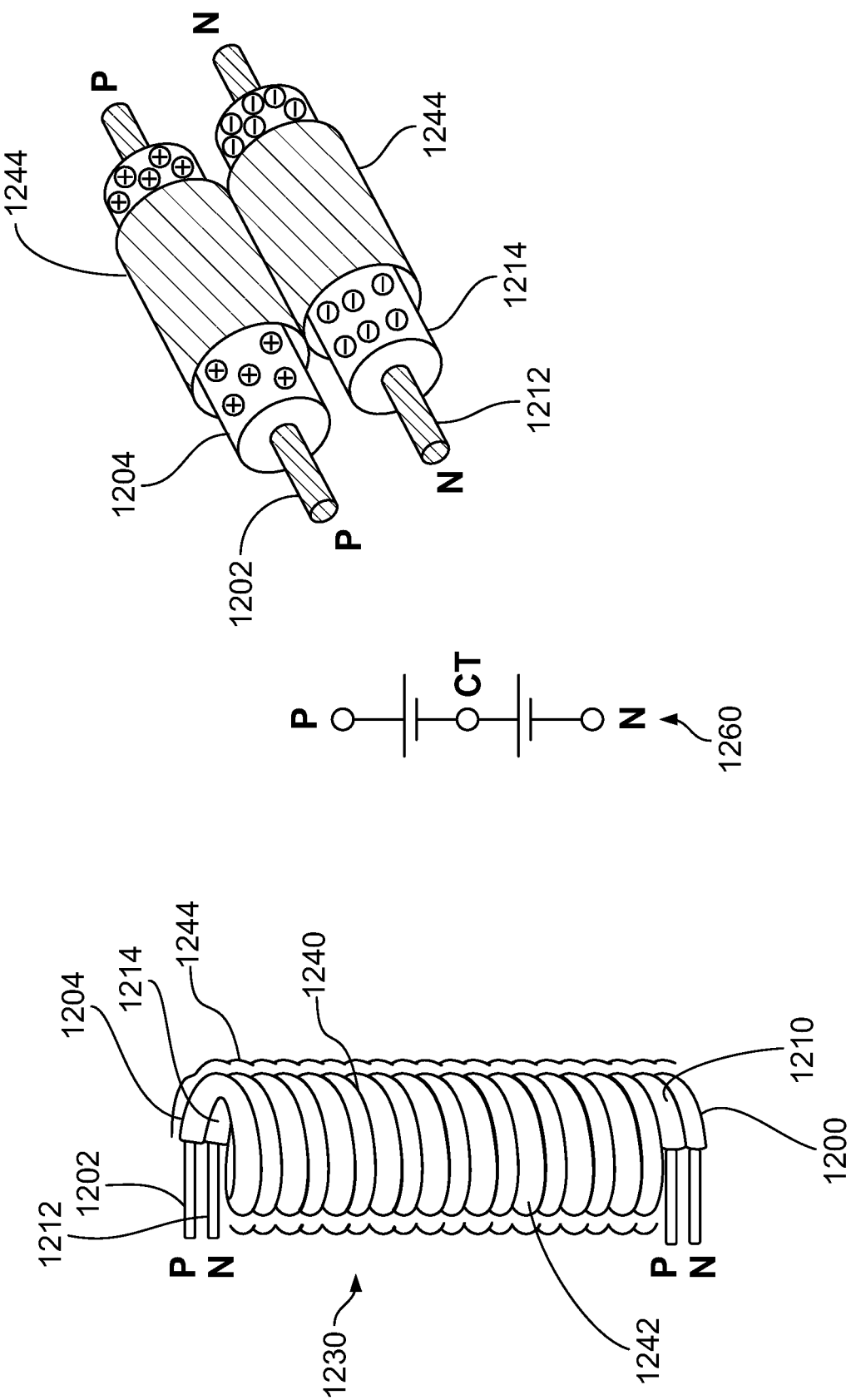
FIG. 15 illustrates piezo-cable wound or coiled into a coiled hydrophone unit, according to an embodiment of the present invention.
Figure 16:
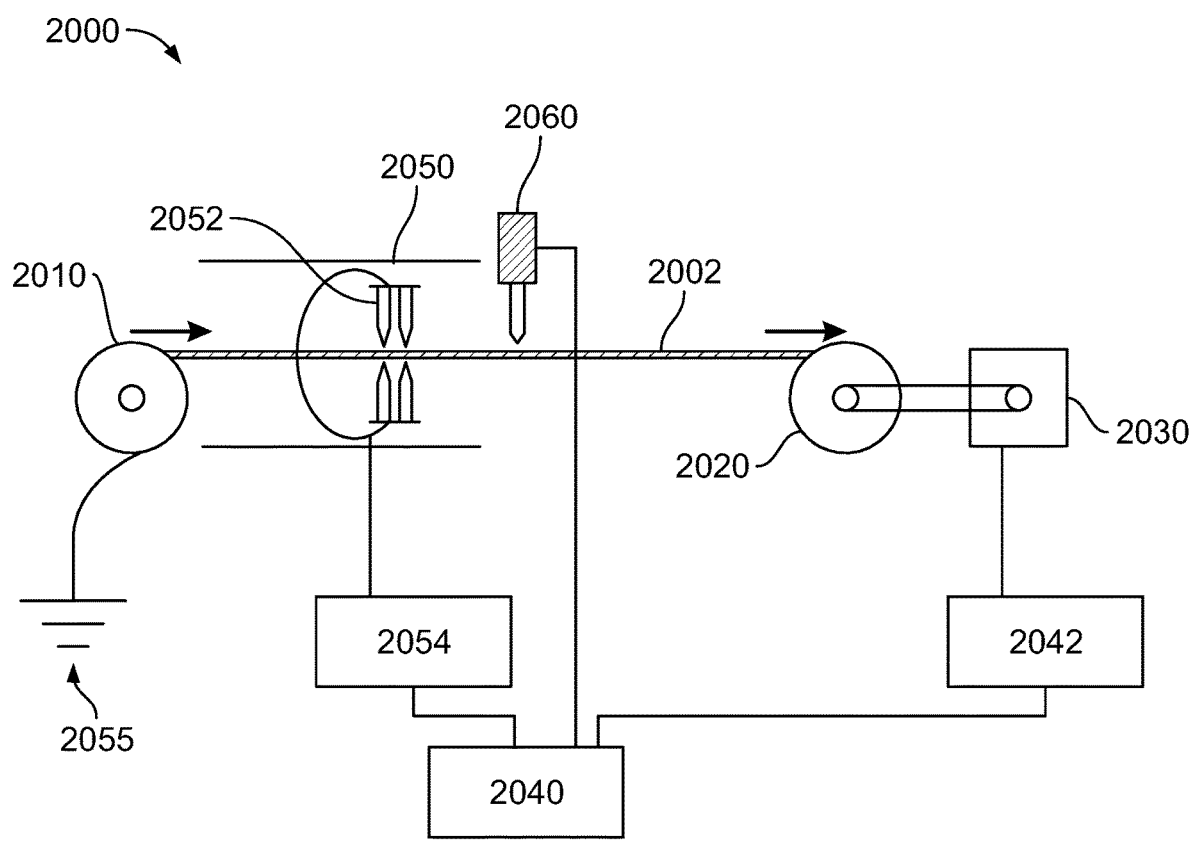
FIG. 16 illustrates a system for polarizing piezo-cable according to an embodiment of the present invention.

One embodiment of such an arrangement is shown in FIG. 15 In some embodiments, a pair of positively and negatively polarized cables 1200 and 1210 may be wound together to form a tube 1230 with adjacent and sequential coils 1242. Cables 1200 and 1210 may include conductive core 1202 and 1212 (e.g. copper or other wire) and piezoelectric coating or jacket 1204 and 1214 (e.g. P(VDF-TrFE) or another suitable material). Cables 1200 and 1210 may be polarized prior to winding into coils, e.g. as shown in FIG. 16. Conductive coating or paint 1244 may be added over tube 1230. Circuit 1260 is analogous to the circuit created by tube 1230, and is also electrically equivalent to the right part of FIG. 15 showing a pair of straight piezo cables bonded together. For tubes or coiled sections wound with paired cables having opposite polarities within the tube, typically connected in series to adjacent tubes, a conductive coating or paint area may collect charges, and is not typically connected to signal processing. The conductive coating or paint area in such series tubes does conduct charge within the same area and serves as a reference voltage (between positive and negative leads), and the whole conductive painted area within the same tube has the same voltage potential. However, the voltage potential between two neighboring tubes when in series connection is typically not the same, and therefore conductive paint sections for neighboring or adjacent series-connected tubes is typically not electrically connected. In other configurations conductive paint or coating on adjacent tubes may be electrically connected, e.g. via a continuous conductive paint coating: this may be done for example when using tubes wound with only one strand and one polarity, or two strands of continuous polarity, the polarity opposite in each strand. In such a configuration the conductive paint may be connected to a signal processing unit. In one embodiment, for one strand (e.g. FIG. 12), the inner conductor and conductive paint may be connected to a signal processing. For two strands with opposite polarity (e.g. one embodiment of FIG. 13), both inner conductors are connected to signal processing, and the conductive paint or coating may be for example an EMI shield Coils 1242 may be bonded or connected to each other. For example, adhesive 1240 may bind together adjacent coils or windings 1242. Coils or windings 1242 of paired piezo cables may be bonded to create tube 1230 using, for example, solvent, epoxy, cyanoacrylates, or other adhesive such as silicone rubber. Note that in some embodiments two bondings, adhesions, or connections may take place: a pair of piezo cables may be bonded to each other to create a combined parallel piezo cable, and this cable may be bonded along certain sections to create coiled sensing units or tubes. In some embodiments, more than two cables may be used physically in parallel. In some embodiments, a pair of cables is not bonded to each other before being wound, and the bonding may take place only between coils of cable and also adjacent parallel cable within a tube; and bonding may not take place at uncoiled sections of cable. It also may be beneficial to connect individual piezoelectric hydrophone units or tubes in parallel to increase capacitance for a better impedance matching to a pre-amplification circuit, e.g. circuit 905 of FIG. 8. In one embodiment it is advantageous to connect individual piezoelectric hydrophone units or tubes in series to boost the signal; in embodiments of the present invention connection may be achieved by using continuous piezo cables which may be cut in places, where no or few connections need to be manufactured (e.g. by soldering) between hydrophones or tubes. In prior hydrophone systems, these electrical connections require intensive labor and often fail in harsh environments at sea from bending and stretching during the operation. One embodiment a processing method can achieve benefits of a series of connected hydrophones or coiled units without excessive labor to create, and without weak electrical connections.

An embodiment of a piezo cable polarizing system is shown in FIG. 16. Referring to FIG. 16, piezo cable polarizing system 2000 includes feeding spool 2010 and take-up spool 2020. Feeding spool 2010 holds and feeds piezo cable 2002, typically a single strand of cable not yet polarized. (When the cable is manufactured and polarized, it is typically in single strand form. Cable typically only becomes a double or multiple strand when it is coiled. Other embodiments may be different.) A friction brake on feeding spool 2010 may keep tension on cable 2002. Take-up spool 2020 is motorized via motor 2030 with a precise constant speed S (m/second) controlled by computer or controller 2040, which may be associated with motor controller 2042. Computer or controller 2040 may include for example a processor, memory, input and output modules, and instructions or code that may configure controller 2040 to carry out methods as disclosed herein. Computer or controller 2040 may be for example a workstation, personal computer, or other device. Computer or controller 2040 may output digital or other instructions to motor controller 2042 which may output electric current and/or speed control to operate motor 2030. In between spools 2010 and 2020, heating unit or heated zone 2050 may include corona discharging needles or electrodes 2052. High voltage amplifier 2054 may provide electric voltage to discharging needles or electrodes 2052, and may be controlled by computer or controller 2040.

Heated zone or heating unit 2050 may be for example a hot air blower providing air into a tube or enclosure through which cable to be polarized is passed. Heated zone or heating unit 2050 may include vents. Heated zone or heating unit 2050 may raise the temperature to soften the piezo copolymer (e.g. FIGS. 15 and 21; cables shown in these figures paired after coiling) of cable 2002 for better polarization. Corona discharge needles or electrodes 2052, typically located within heated zone or heating unit 2050 may ionize the air in vicinity of cable 2002 to generate charges that attach to the piezo copolymer coating (FIG. 16) and polarize cable 2002. The inner conductor (e.g. FIGS. 15, 21) of piezo cable 2002 may be connected to ground 2055. The voltage of the corona discharge needles or electrodes 2052, typically direct current, can be programmed or controlled as a function of time and can be controlled by computer 2040. An example of a voltage applied is 25 kV in the case of a 250 micron thick copolymer coating; other voltages and other thicknesses may be used. Computer 2040 may at certain points in time invert or reverse the voltage of all needles or electrodes 2052 against ground 2055, accounting for the speed of the motor and thus the cable, and the time desired for the cable to be heated. The cable may be moved through the heated zone at a certain rate, since polarization occurs only after a certain temperature has been reached, and so that cooling to fix the polarization can take place. A heating zone 2050 may be for example, a five-foot long tube. Other dimensions may be used.

In one example process, the speed of the moving cable may be for example 5 mm/second. Polarizing a 150 cm length of cable may take 300 seconds, with certain parameters. The polarity switching of a high voltage amplifier may take 1 second to complete. In such a case, the transition zone between positive and negative when switching is 5 mm. However, typically, some portion of a previously polarized portion of cable may still be in the heating zone during the switch between polarities. Not all of this portion may be reversed, because the heating zone may have gradients between hot and cool. As a result, due to the length of heating zone, the transition zone may become the length of the heating zone. This should not have negative effects if the planned space between tubes or cylinders later created is longer than this transition zone. However, for tightly spaced tubes, the transition zone between polarity switching should be minimized; in other words, a smaller heating zone is preferred, for example 5 cm. To ensure enough time for material to be polarized in this tight heating zone, a slower cable moving speed can be used.

During polarization, one or more inkers or markers 2060 with (e.g. applying) various colors actuated for example by solenoids and controlled by computer 2040 can be used or activated to mark (e.g. visibly) points or regions along the cable 2002, typically after the corona discharging zone. Markers 2060 may be for example activated or moved by a hydraulic system or solenoid which pulls, pushes or moves a marking or inking device onto the moving cable to leave a mark, possibly with different colors or different markers for positive, negative, or other notation. Markers 2060 may be for example conventional permanent magic markers, a painting system, or other marking or inking systems. Marking need not be used. In one example, a series of tubes or coils may be created with spacing 5.5 cm in un-coiled cable between each tube. Each tube may have 1.5 cm in outer diameter and 5 cm in length, and may require a paired piezo cable segment of 75 cm in length with 1.5 mm in diameter for each cable in the pair (each individual cable segment may be 75 cm). Assuming the heating zone is 5 cm with 1 second switching between polarities, the voltage profile can be positive 25 kV for 155 seconds ((75+2.5)/0.5 seconds, as the speed in this example is 0.5 cm/s), followed by a 1 second transition and then −25 kV for 155 seconds, and so on. Of course other dimensions, voltages, speeds, and timing profiles may be used In other embodiments, the specific apparatus used to polarize cable shown in FIG. 16 need not be used. Further, not all cable used in hydrophones according to embodiments of the present invention need be polarized as in a process as described or with specific polarization as described. For example, sections of alternating polarity need not be used. In some embodiments, the entire length of a piezo cable may have the same polarity; in other embodiments some long sections (e.g. several tens of meters) may have the same polarity, and these sections of uniform polarity may alternate with sections within the same cable of alternating polarity, e.g. polarity alternating every 77.5 cm. For example, a cable when unwound may have positive polarity for 100 meters, then sections alternating positive and negative polarity having length of 77.5 cm or one meter each as two examples, then a section of positive polarity for 100 meters. Other dimensions may be used.

An embodiment includes a method to fabricate a long continuous hydrophone cable with a number of individual wound tubes or cylinders, which may form sensing units, where tubes may be virtually connected in series, in parallel, or both. For example, a hydrophone may include a series of coiled sections forming a series-connected set of hydrophone sensing units, a parallel-connected set of hydrophone sensing units, or a combination of such units. "Virtual" parallel systems and "virtual" series systems may include systems that functionally provide units connected in parallel and/or series, where the connections are produced by a combination of polarity changes and/or continuous cables and/or cutting continuous cables. Such virtual systems may achieve their properties without numerous additionally manufactured connections (e.g. soldering, crimping, etc.). The example system shown in FIG. 16 may be used to carry out the example method of FIG. 17, but other systems may be used as well.

In one embodiment, two cables are created each by starting with a wire core cable coated with a piezoelectric coating or jacket, and selectively polarizing piezoelectric coating in certain patterns. For example a pattern may be for one cable (e.g. Type A) all positive, and for another cable (e.g. Type B) all negative; a pattern may be for one cable alternating positive and negative, and for another cable also alternating positive and negative; a pattern may include different long sections of continuous polarity interspersed with sections of alternating positive and negative polarity. The cables may then be assembled or arranged together into a long hydrophone having alternating coiled sections connected by uncoiled sections. Further processing, such as selective cutting of certain points, or selective removal of cable, core wire, or piezoelectric coating, may take place, and an electrically conductive coating may be applied to portions of or all of the dual-wire cable, e.g. over coiled sections, or portions of coiled sections, or other sections. An electrically conductive coating may be applied to cover a portion or all of the first piezoelectric cable and a portion or all of the second piezoelectric cable; this may be performed by coating the outside and/or inside of coiled tubes. Other processing may be performed to create a finally manufactured hydrophone, such as the addition of end caps, potting, the covering of the cable with a substance such as a polymer compound to surround or cover the tubes or cylinders to form a cable such as a snake cable, and the addition of an EMI (electromagnetic interference) shield. Other methods of manufacture may be used.

In one embodiment, two cables, for convenience termed Type A and Type B, are created. Cables may be bonded or connected together to be parallel cables each with sections of alternating polarity, where typically a positive section of one cable is adjacent to a negative section of the other cable. In other embodiments the cables need not be bonded or connected before winding. Since in one embodiment the polarity of each cable switches or flips from positive to negative or vice versa at the same point in the dual/combined cable, in one embodiment sections where Type A has + polarity and Type B has − polarity alternate with sections where Type A has − polarity and Type B has + polarity. Other methods of producing paired cables with alternating polarity may be used, according to embodiments of the present invention.

In one embodiment, each of two piezoelectric cables (possibly each including alternating sections of positive polarity and negative polarity) may be connected or bonded where at least a portion of each section of positive polarity of each piezoelectric cable is bonded to at least a portion of a section of negative polarity of the other piezoelectric cable. The sections or portions of opposite polarity which are bonded may occur in coiled sections, where uncoiled sections may not be bonded.

Figure 17:
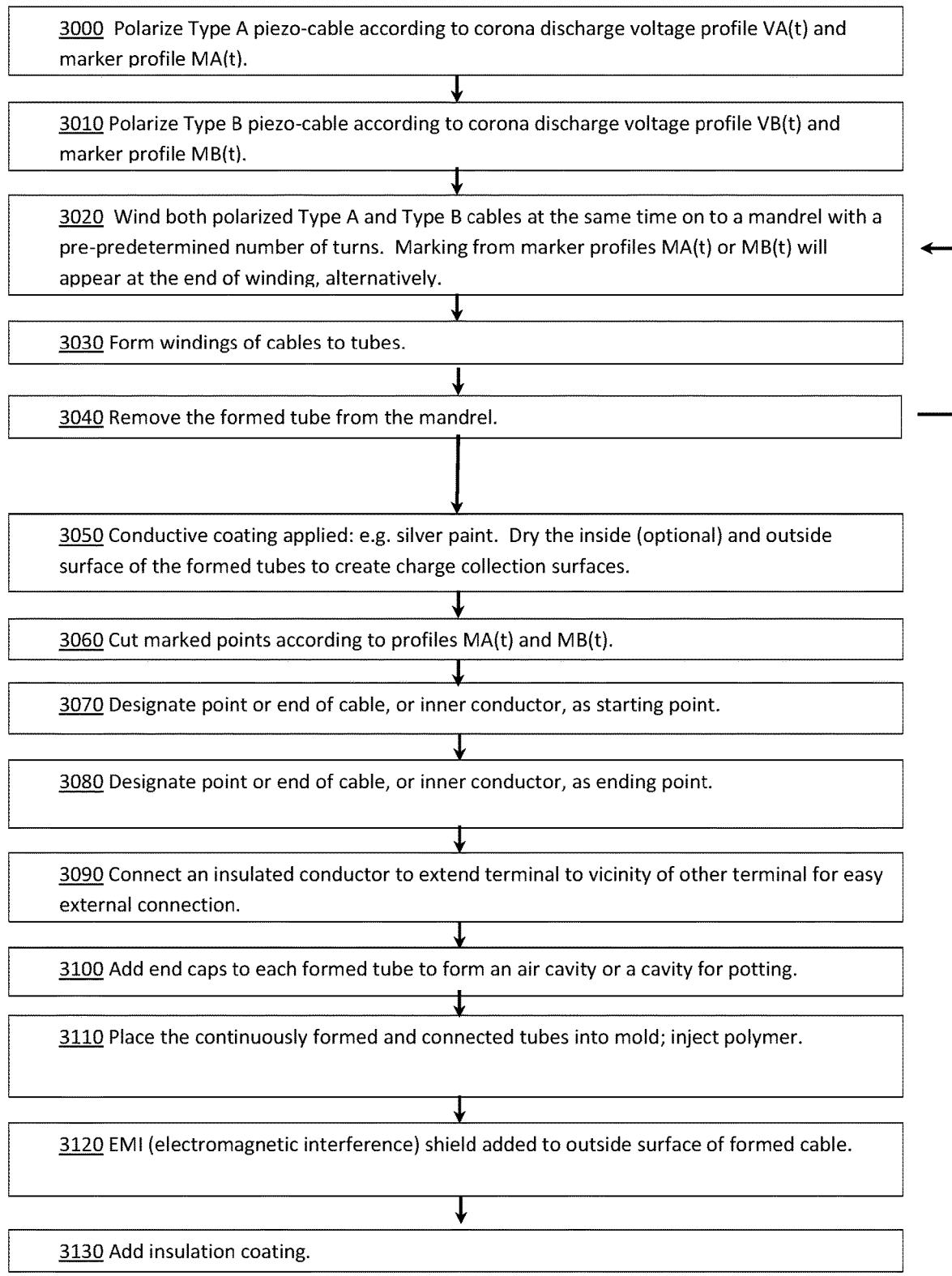
FIG. 17 illustrates an example method, according to an embodiment of the present invention, to fabricate a long continuous hydrophone cable with a number of individual wound tubes or cylinders.
Figure 18:
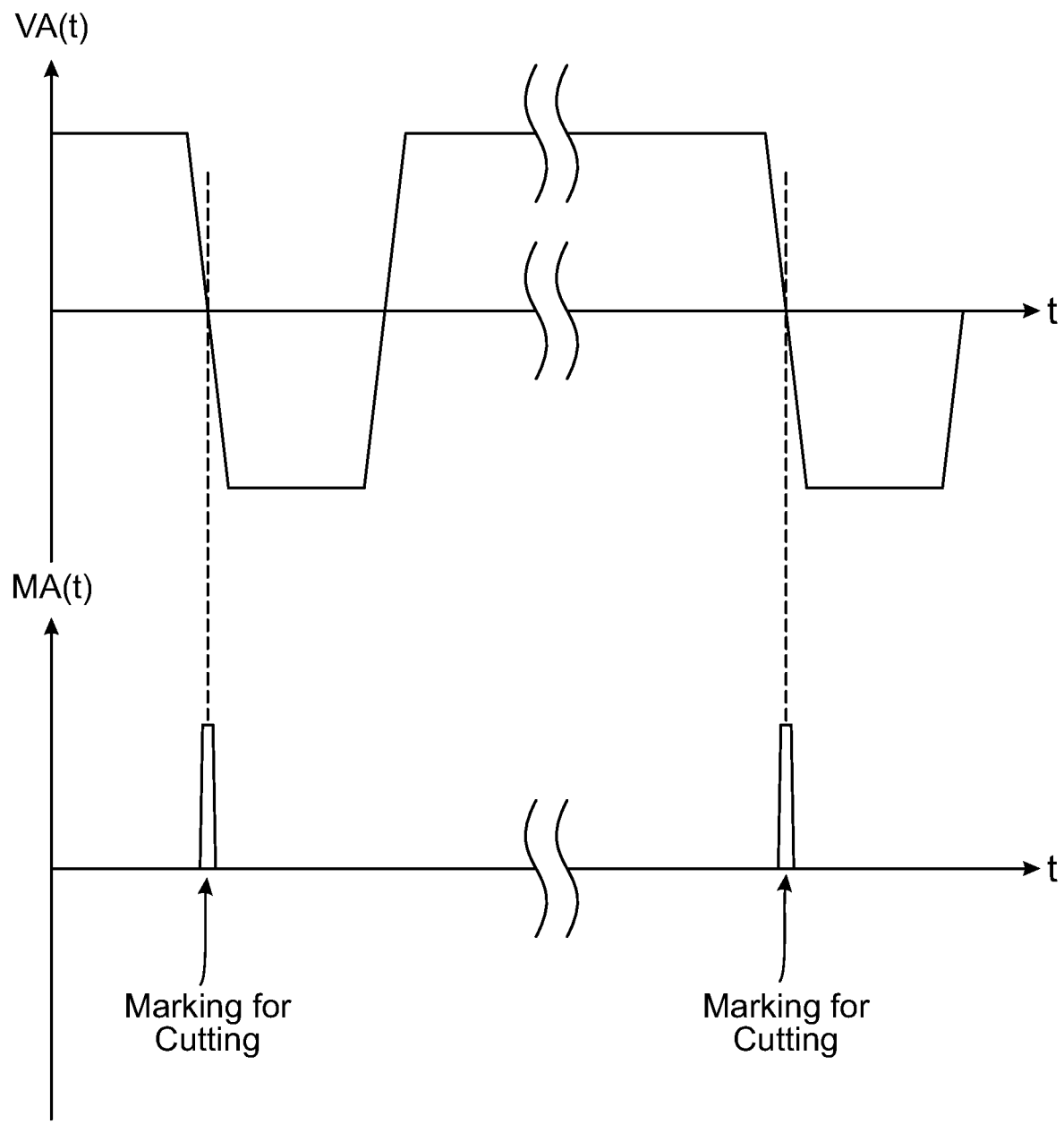
FIG. 18 illustrates a corona discharge voltage profile and marker profile according to an embodiment of the present invention.

FIG. 17 shows an example method, according to an embodiment of the present invention, to fabricate a continuous hydrophone cable. While in some embodiments of a hydrophone and a method for making a hydrophone two cables are used, in other embodiments one, or more than two, cables may be used. In operation 3000 a section of Type A piezo-cable may be polarized and may be marked, for example according to corona discharge voltage profile VA(t) and marker profile MA(t), an example of which is depicted in FIG. 18 Profiles may describe how or when polarization is to be changed, reversed or applied, and when and how to mark a cable; such profiles may be for example part of the programming or instructions for computer 2040 or a similar controller. Corona discharge profile VA(t) may start with a duration of positive high voltage, as shown in FIG. 18, followed by alternate polarity sections. The pulses in marker profile MA(t), shown in FIG. 18, indicate the marking or labelling (e.g. when a marking or labelling device is to place a mark or label) for cutting points or locations in a later process. Marking may also aid in positioning parallel cables during winding, to ensure polarity in each cable switches at the same point, in portions where polarity switching is desired. These cutting points may coincide with or are related to the points where VA(t) transitions from positive to negative or vice versa. Polarization may be performed using for example, the system shown in FIG. 16. The speed of the spool motor (e.g. motor 2030) and the duration of the corona discharge voltage profile may determine the length of the positively polarized zones and the negatively polarized zones.

Figure 19:
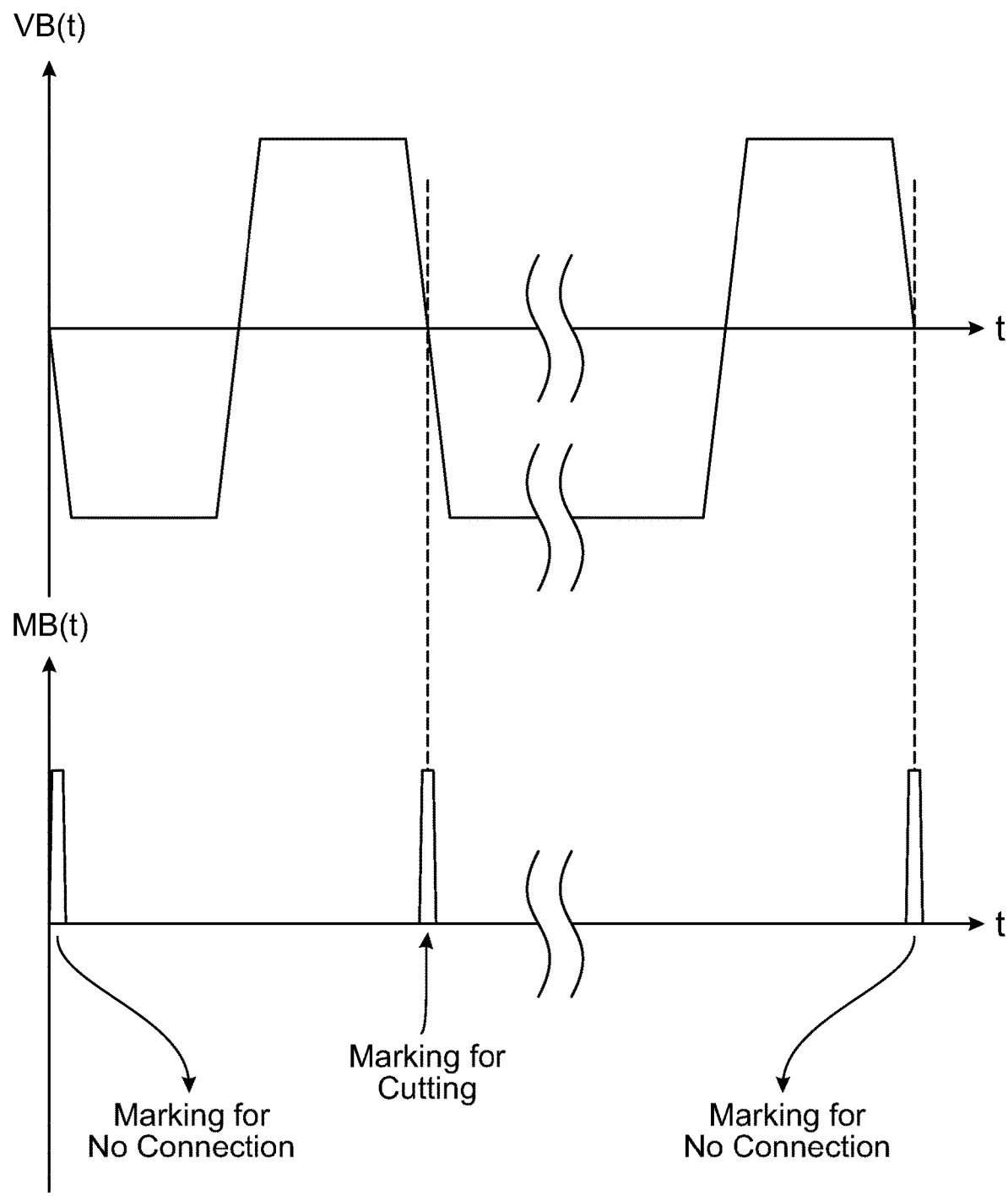
FIG. 19 illustrates a corona discharge voltage profile and marker profile according to an embodiment of the present invention.

In operation 3010 Type B piezo-cable may be polarized and may be marked according to corona discharge voltage profile VB(t) and marker profile MB(t), an example of which is depicted in FIG. 19. Corona discharge profile VB(t) starts for example with a duration of negative high voltage, as shown in FIG. 19, followed by alternate polarity sessions. (While each of FIG. 18 and FIG. 19 show certain polarities starting, the starting polarities may be different in different embodiments.) Marker profile MB(t), shown in FIG. 19 indicates the marking for, for example, cable cutting later in the process, associated with points where VB(t) transitions from positive to negative. The first pulse shown in the beginning of MB(t) indicates that this is a no-connection for Type B cable at this particular point.

Other profiles, and other connection or cutting arrangements, may be used. For example, cables may be all positive or all negative polarity, or have combined portions of long sections of one polarity, and other sections of alternating polarity.

In operation 3020, the cables may be coiled or wound into one or more cylinders, tubes or windings, which may form sensing units, such that there are unwound or straight sections between wound or coiled sections. For example, referring to FIG. 20A, motor 6010 may wind, coil or turn both of two different cables 6020 and 6030. In one embodiment, each cable has sections of alternating polarity, where each cable 6020 and 6030, when paired or bonded to the other, includes polarity opposite to the other. In other embodiments, each cable may have a single polarity; other polarity patterns may be used. In some embodiments in each wound section one piezoelectric cable has a polarity opposite the polarity of the other piezoelectric cable. For example, polarized Type A 6020 and Type B 6030 cables at the same time may be wound or turned on to the same mandrel or spool 6040 with a predetermined number of turns that can be programmed and controlled for example by a computer 6050. In one example embodiment, each coiled tube may include 33 coils or turns, to produce tube having 1.5 outside diameter and being 5 cm long using 1.5 mm diameter piezo cable. Other dimensions may be used. Winding at the same time on the same mandrel may mean that the two initially separate strands of cable are joined into one coil. If marking is used, then for example marking from marker profiles MA(t) or MB(t) may appear at the end of winding of either coil, alternatively. Between spools 6022 and 6032 of cables 6020 and 6030 and winder, mandrel or spool 6040, tension control units 6024 and 6034 may help ensure the tensions from both spools 6022 and 6032 are equal to prevent deformation of the tube and to provide consistent performance. In one embodiment, cables are bonded together before winding; in another embodiment cables are bonded after winding, possibly only between coils to produce a cylinder without bonding in un-wound sections. Solvent or adhesive 6060 may be applied. Un-wound sections may be bonded as well. Typically, bonding results in a portion of each section of positive polarity of each piezoelectric cable being bonded to at least a portion of a section of negative polarity of the other piezoelectric cable: certain portions of opposite polarity may not be bonded to the other cable.

Figure 20A:
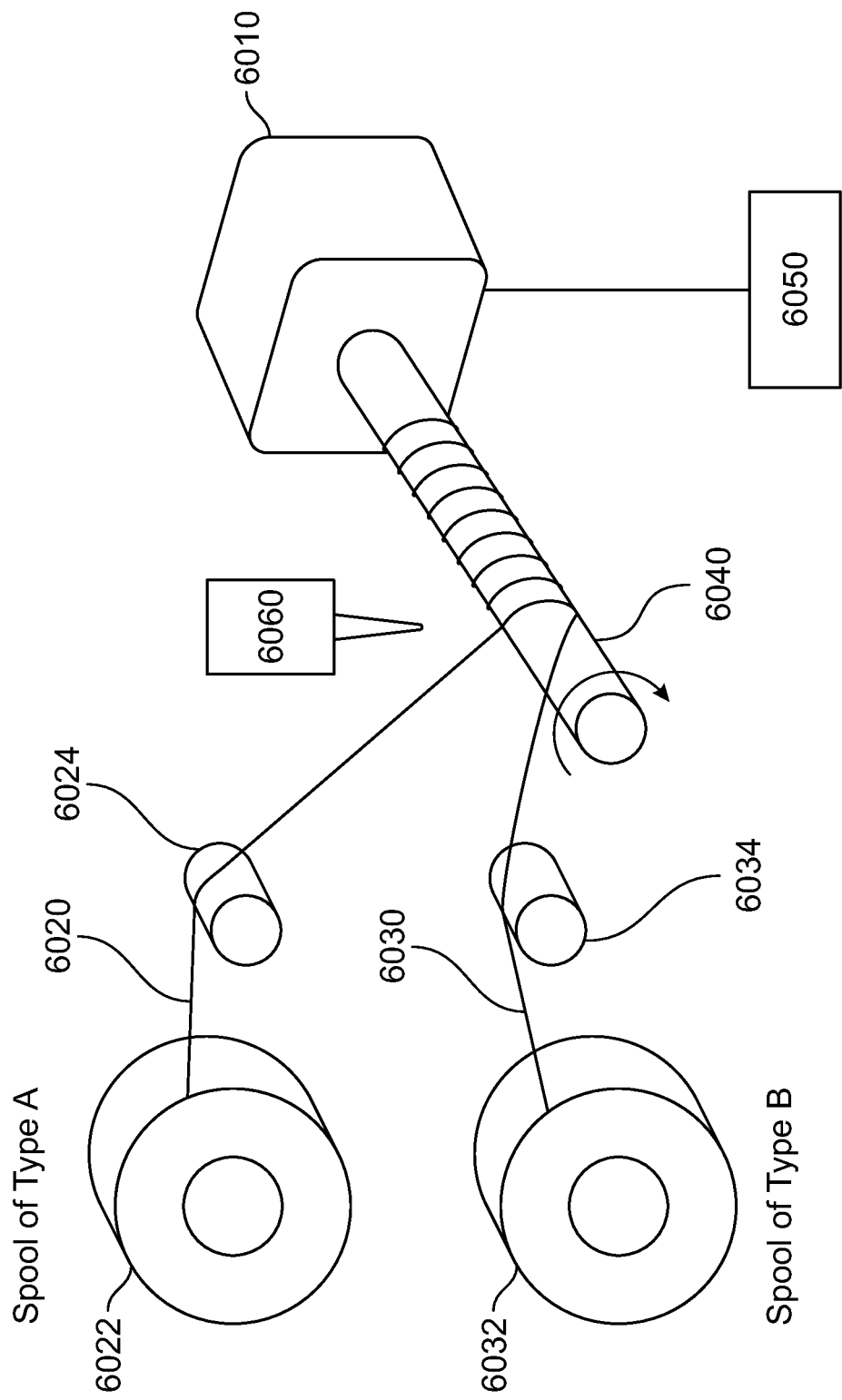
FIG. 20A illustrates a system for coiling cable according to an embodiment of the present invention.
Figure 20B:
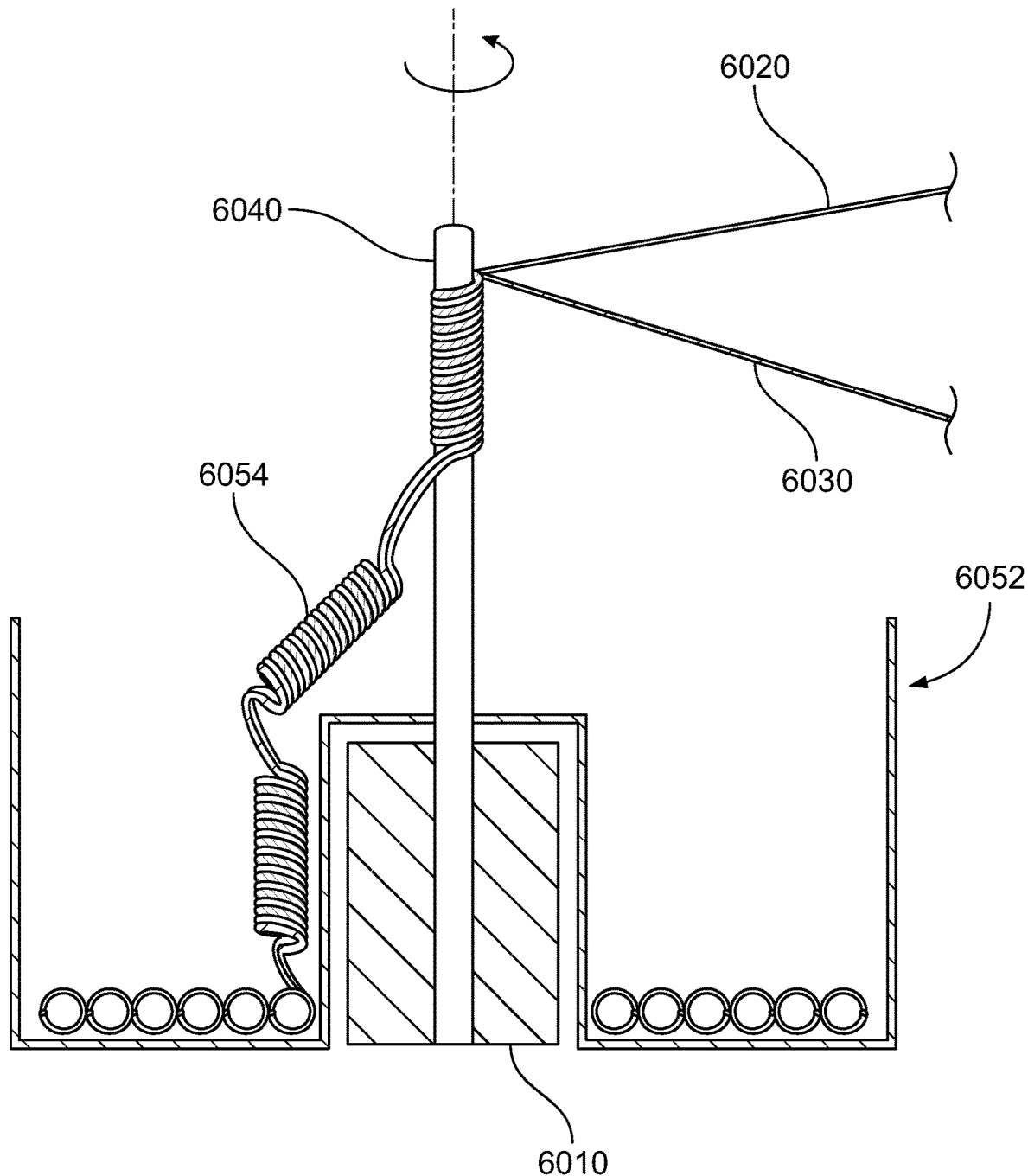
FIG. 20B illustrates a system for coiling cable according to an embodiment of the present invention.

FIG. 20B depicts an alternate system for creating coils according to an embodiment of the invention. Features of FIG. 20B may be used with features shown in FIGS. 20A and 20C (e.g. spools, tension control units, solvent, etc.). Motor 6010 including a non-rotating housing may wind, coil or turn both of cables 6020 and 6030, polarized as described elsewhere herein. Cables 6020 and 6030 at the same time may be wound or turned on to the same mandrel or spool 6040 as controlled for example by computer 6050 (FIG. 20A). Container or bin 6052 may hold completed coils 6054. Container 6052 may rotate in synchrony with mandrel 6040.

Figure 20C:
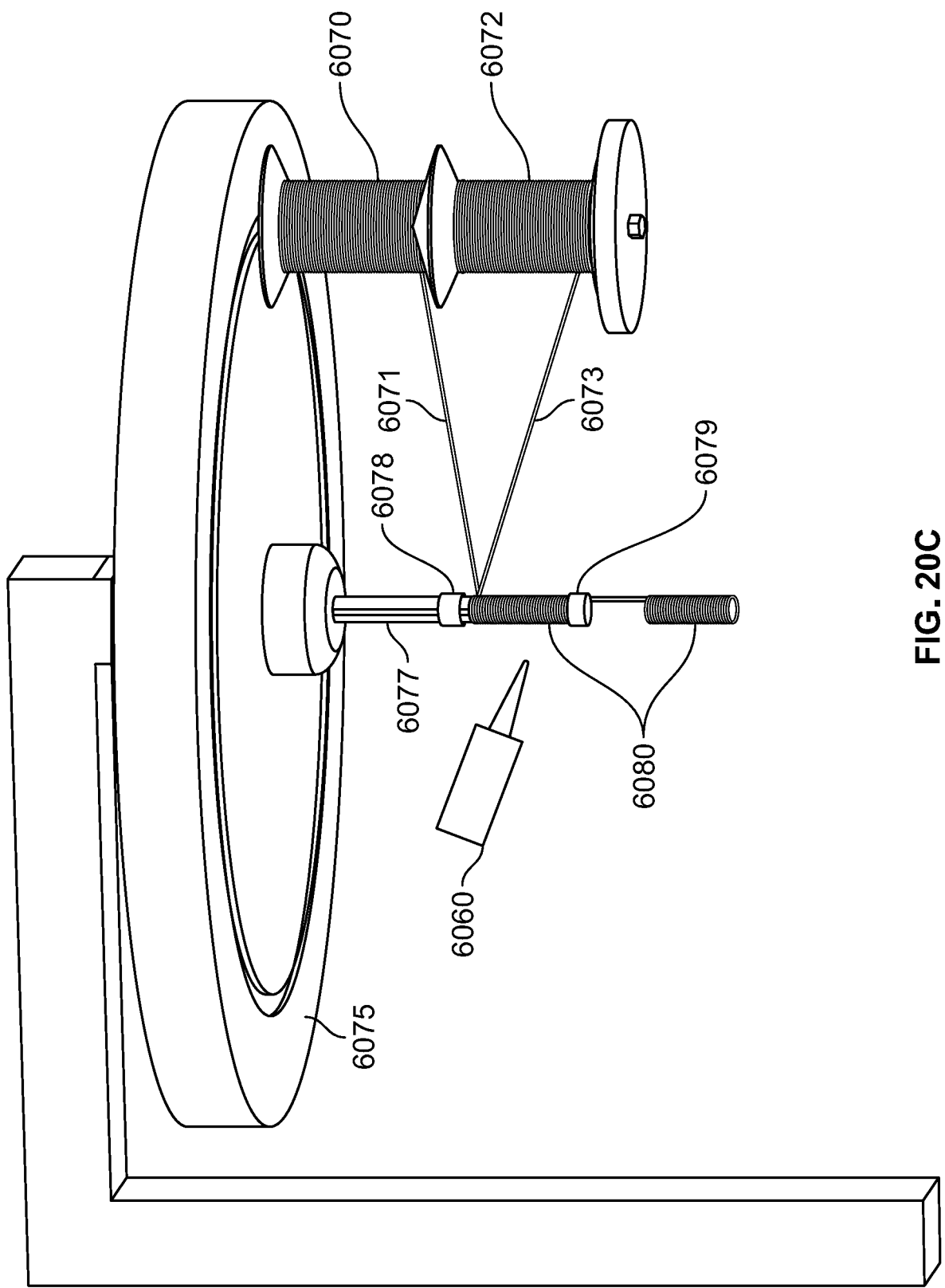
FIG. 20C illustrates a system for coiling cable according to an embodiment of the present invention.

FIG. 20C describes an alternate system for winding coiled units, according to an embodiment of the present invention. Referring to FIG. 20C, each of spools 6070 and 6072 of cable 6071 and 6073 may be rotated around circular track 6075 and around mandrel 6077 to create coiled sections 6080, each including both of cables 6071 and 6073. To wind coils, spools 6070 and 6072 may rotate simultaneously along circular track 6075. Typically mandrel 6077 does not rotate but rather may move up and down to traverse the winding. Mandrel 6077 may include two half cylindrical shells that can be expanded for example by an inflated air tube inside mandrel 6077. Once a coiled section 6080 is wound, solvent or adhesive 6060 may be applied, and the air tube may be deflated, shrinking the cross section of mandrel 6077, and coil 6080 may be removed and collected easily. Two collars 6078 and 6079 outside the mandrel may keep the mandrel within desired diameters. Lower collar 6079 may clamp the starting ends of winding.

Winding the cables in any method disclosed may include for example periodically removing a wound or coiled section from the mandrel to create not wound sections, and periodically re-winding or re-starting the cables on the mandrel to start another wound section.

In operation 3030, wound or coiled cables may be formed into tubes or cylinders. For example, the coils windings may be bonded or connected to each other, for example by bonding the piezo coating in coils. In one embodiment, solvent or adhesive 6060 (e.g. FIG. 20, FIG. 21) used for bonding may be applied to cables and between or over coils or windings. If solvent is used the solvent may be dried; adhesive if used may be cured. Other connection or bonding methods may be used. In such a manner a wound tube, e.g. tubes 4020, may be formed from adjacent coils. Each of tubes 4020 may be a separate hydrophone sensing unit or cylinder. Solvent can be for example sprayed, brush painted, or syringe injected into the gaps between coils or windings. In one embodiment as applied, solvent may partially dissolve the piezo copolymer material. As dried, the dissolved material may form a bonding between surfaces which may be as strong as the original material. A forced air dryer can be used to facilitate the drying of the solvent. Solvent application and drying can be automated along with winding by pre-programmed robots.

In operation 3040, formed tubes or cylinders may be removed from the mandrel. In one embodiment, a collapsible or expandable mandrel (e.g. controlled by a pre-programmed computer) may be used to enable completed coils to be pulled or slid off the mandrel, preferably after coils are bonded together to form a cylinder. Solvent bonding may be advantageous, as after the solvent causes piezoelectric coating to partially dissolve and flow into neighboring coils, and the solvent evaporates, leaving the bonded cylinder, the coils may be slid off the mandrel easier than if adhesive is used. Mandrel or spool 6040 or 6077 may have non-stick coating such as Teflon coating to aid removal. A person, automated tool, or industrial robot may remove completed coils from a mandrel and re-start unwound cables on the mandrel for the next coiling. In another embodiment, spools of cable may themselves rotate around a mandrel or spool, to enable both winding coils or tubes, and removal of coiled tubes, and re-starting winding of cables on a mandrel or spool. In some embodiments, cables may be connected to each other or attached by twisting instead of or in addition to bonding or adhesion.

Operations 3020-3040 may be repeated until a desired number of tubes are formed. For example, 10 tubes, 10,000 tubes, or another appropriate number of tubes may be created. For example, a 5 cm long tube with 5 cm spacing between each tube will have the 10,000 tubes forming a 1 km long towing hydrophone. However, longer or shorter hydrophones may be created, e.g. one or several meters long.

Figure 21:
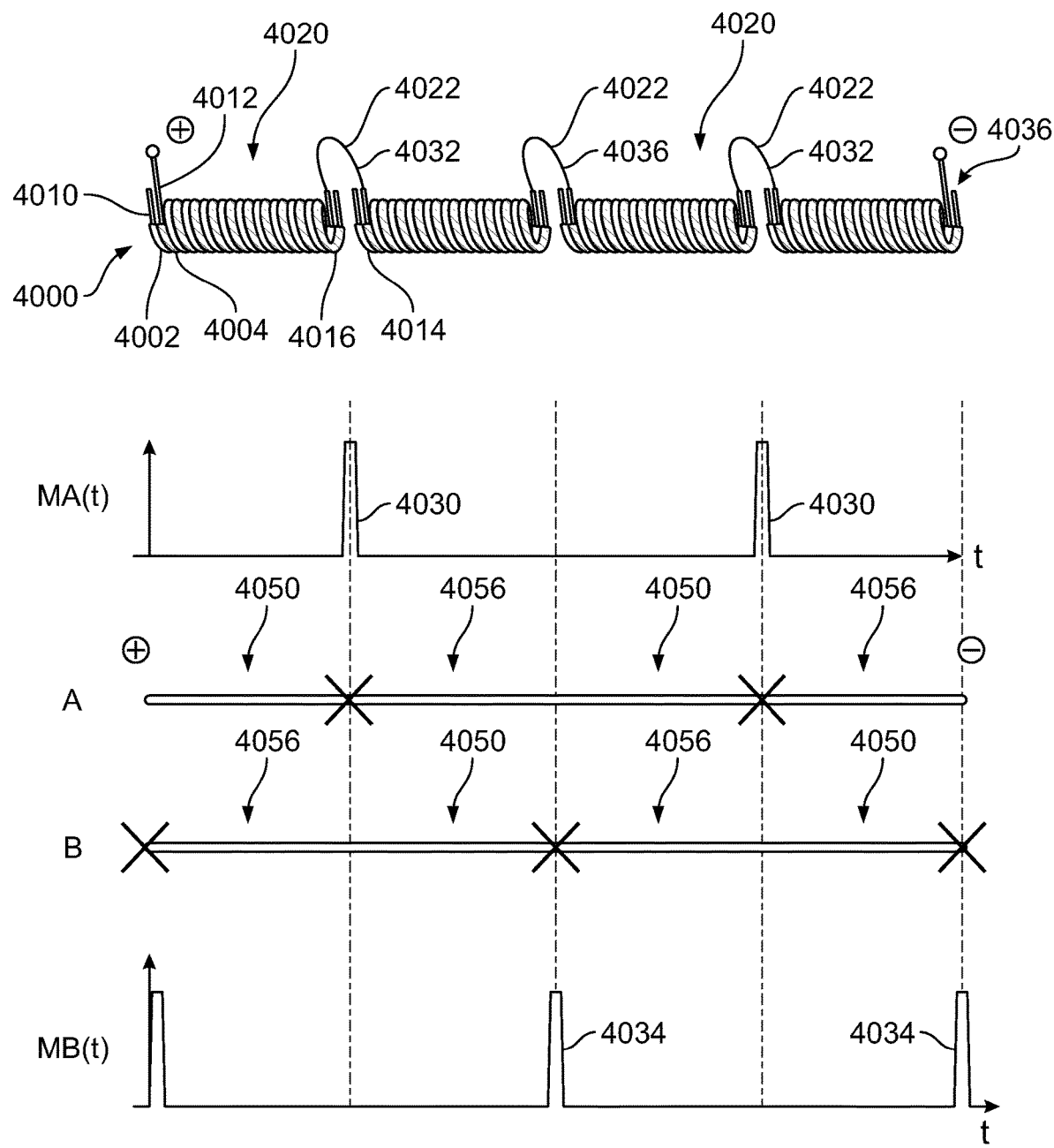
FIG. 21 illustrates a partial structure of a hydrophone, along with corresponding polarity and marking graphs, according to embodiments of the present invention.
Figure 22:
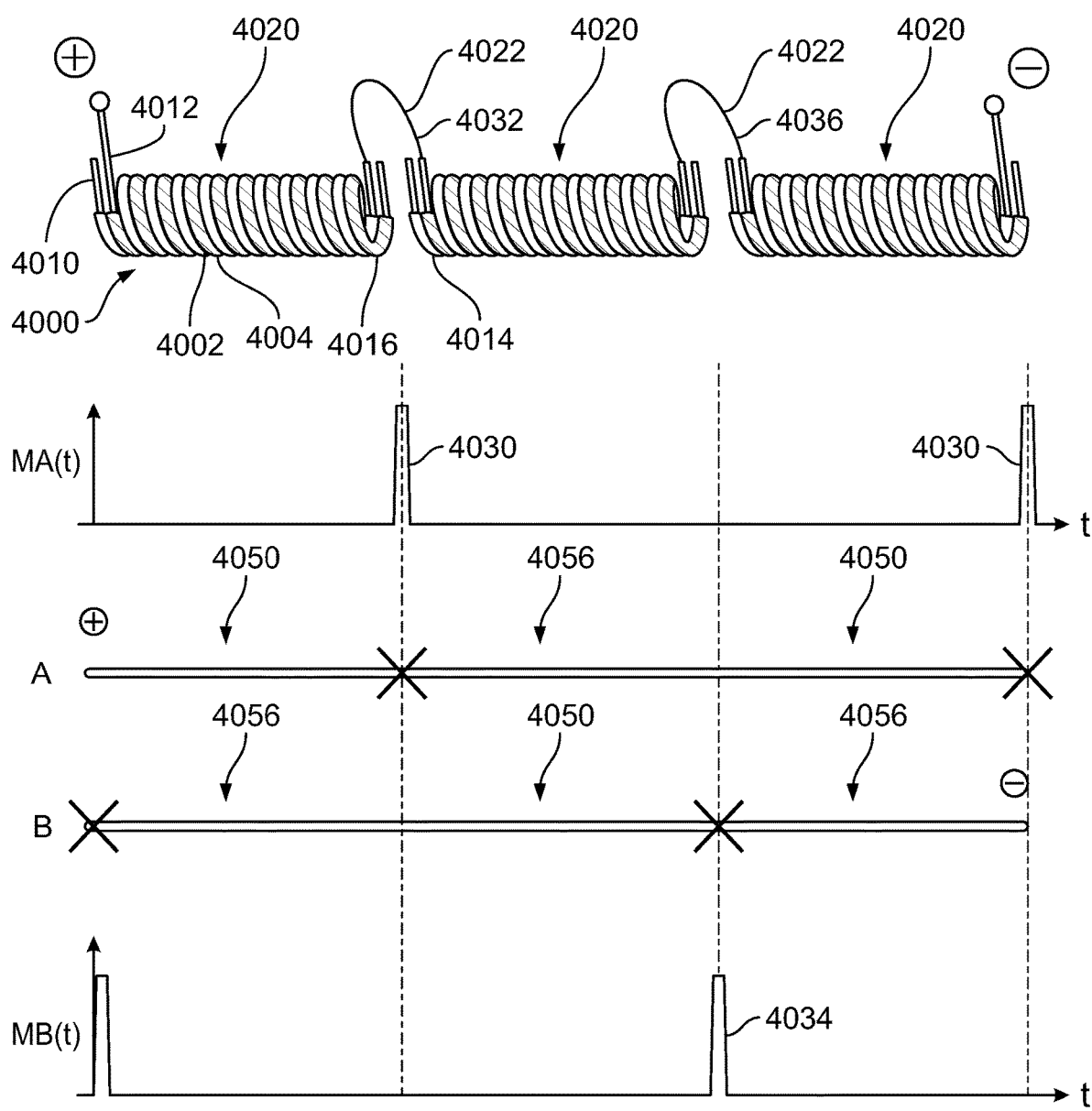
FIG. 22 illustrates a partial structure of a hydrophone, along with corresponding polarity and marking graphs, according to embodiments of the present invention.

In operation 3050, an electrically conductive coating 7002 may be applied to the surface of the wound or coiled sections, or formed tubes 4020 (e.g. FIGS. 21 and 22). For example conductive silver paint or conductive carbon paint such as MG Chemicals Silver Print (Conductive Paint), 842AR-15ML), or another suitable coating may be applied e.g. by spraying or brushing, onto the outside and/or inside surface of formed tubes to create charge collection surfaces. Conductive coating 7002 may not be connected to a circuit or an external signal processor, but rather may distribute charge. Typically, conductive coating does not occur on the outside of unwound cable at breaks between units connected in series, but may occur on the outside of unwound cable between units connected in parallel. Thus in a parallel arrangement, conductive coating may be applied between coiled units. In one embodiment, electrically conductive coating is applied to tubes only, and not to uncoiled sections between tubes. In other embodiments, electrically conductive coating is applied to tubes and uncoiled sections between tubes. A forced air dryer can be used to facilitate the drying of the paint or coating. This operation may be automated by pre-programmed robots. Electrically conductive coatings other than silver paint may be used.

In one embodiment, after operation 3050, if cables are used with continuous rather than alternating polarization, a continuous long hydrophone with many wound tubes virtually connected in parallel has formed.

In operation 3060, portions of the cable, e.g. individual cables within the combined or dual cable, may be cut in order to create series-connected sections. Cutting may not be done if parallel-connected sections are desired. For example, points marked according to profiles MA(t) and MB(t) may be cut. Markings may indicate transitions between areas of different polarity. This operation can be automated for example by pre-programmed robots with color detection sensors. In some embodiments, cutting may occur at any point between coiled sections or tubes with no significant effect on functionality, since electrically conductive coating is in one embodiment not placed on un-coiled cable between coiled tubes, and no significant signal collection occurs between coiled tubes. In a typical embodiment, cutting may involve removing a small portion, e.g. 1 cm, or ¼ inch, or another length, of internal conducting wire, preventing a circuit or electrical connection from forming due to bending of cable. In some embodiments, piezoelectric material on un-coiled sections may be removed and re-used, for both cut and uncut individual strands of single cables Typically, only one of the two cables between coiled sections is cut, the cutting producing, in conjunction with alternating polarization, a series connection between coils: e.g. having adjacent coiled sections have, for each cable, an alternating polarization, with an alternating one of the two cables cut between each coiled section. A parallel connection between coiled sections may be produced by not cutting cable between coiled sections, and not using alternating polarization: e.g. having adjacent coils have, for each cable, the same polarization. A combination series and parallel cable may include a series section with cable of alternating polarity and cut portions and a parallel section with constant polarity and no cutting. In some embodiments, more series than parallel may be used: for example sections may include a set of 10 series connected coiled sections and 5 parallel connected coiled sections. In some embodiments, a number of tubes or units connected in parallel may be considered functionally to be one longer tube. Cutting may be performed at point within each adjacent wound and not wound section.

Cutting is typically not performed to create a virtual parallel connection between coiled sections.

Figure 33:
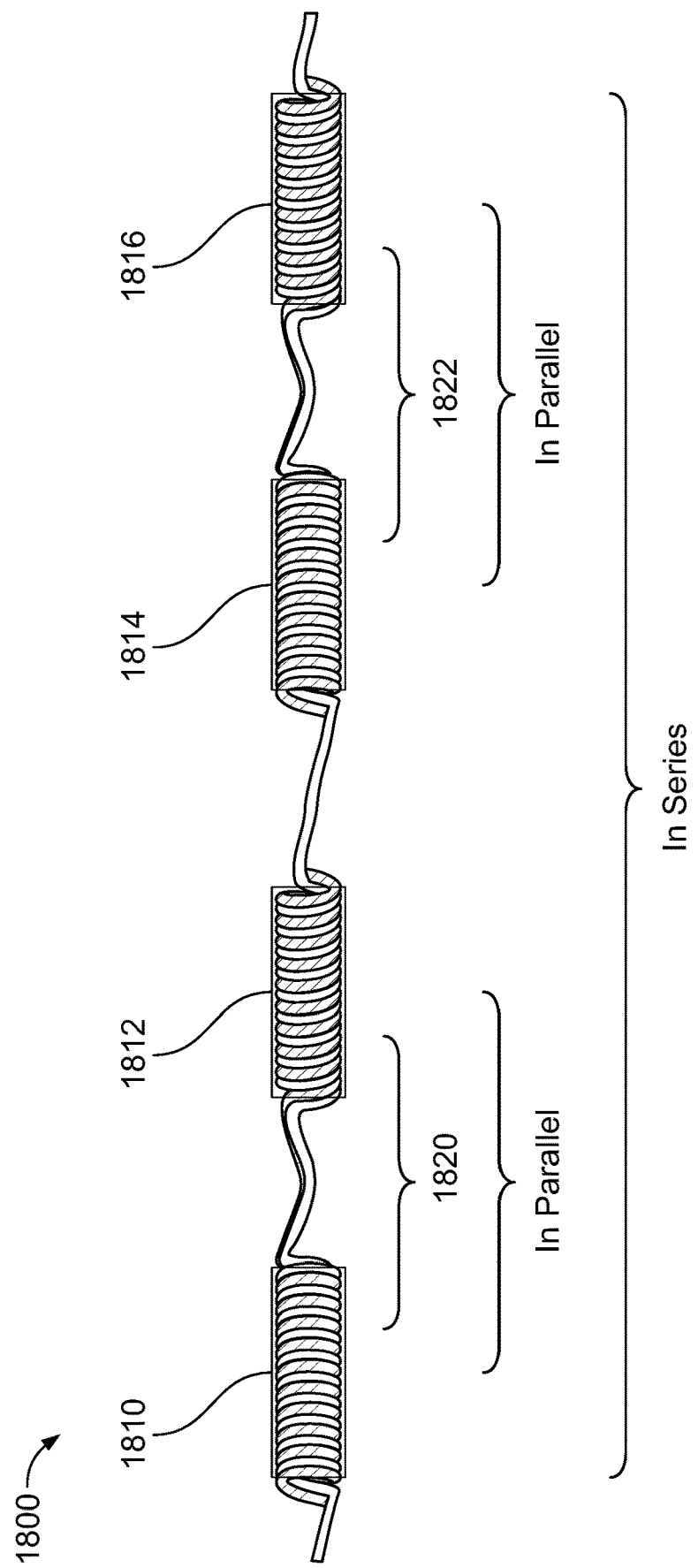
FIG. 33 illustrates a hydrophone including a series of hydrophone units, according to one embodiment.
Figure 34:
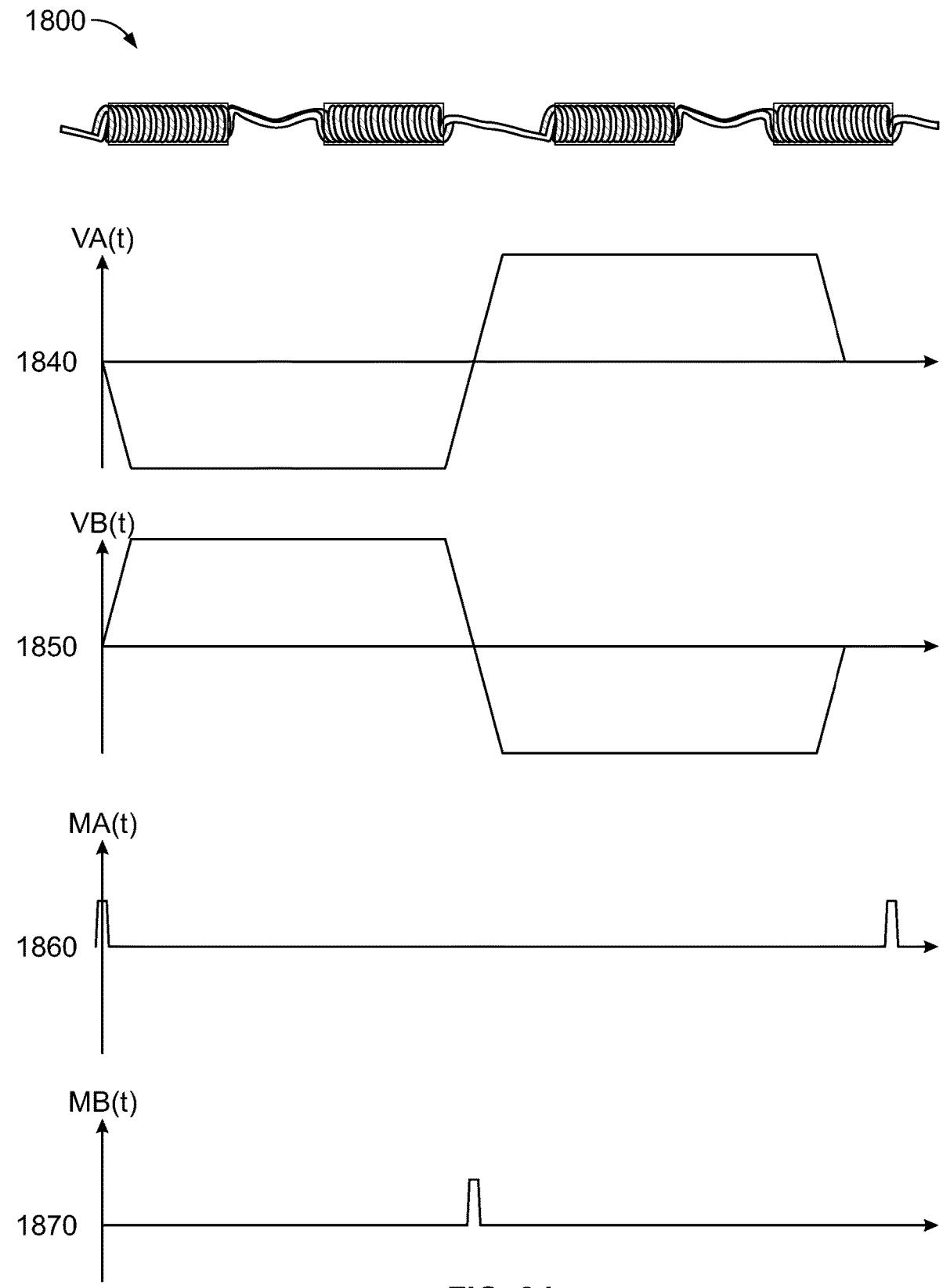
FIG. 34 illustrates example polarization control graphs and example marking control graphs according to one embodiment.

Referring to FIG. 33, hydrophone 1800 according to one embodiment includes a series of hydrophone units 1810, 1812, 1814 and 1816. Hydrophone units 1810 and 1812, and separately 1814 and 1816 are connected in parallel: two groups 1820 and 1822 of parallel connections. Hydrophone groups 1820 and 1822 are connected to each other in series. This may be achieved by having hydrophone units 1810 and 1812 each having two cables of continuous polarity, each cable having polarity opposite to the other, and hydrophone units 1814 and 1816 each having two cables of continuous polarity, each cable having polarity opposite to the other; and having the polarity of cables in hydrophone units 1812 and 1814 switch at the uncoiled connection via the combined cable between hydrophone units 1812 and 1814, with one of the two cables cut between hydrophone units 1812 and 1814. FIG. 34 shows example polarization control graphs 1840 and 1850 for the two cables making up hydrophone 1800 in FIG. 33, and example marking control graphs 1860 and 1870 for the two cables making up hydrophone 1800 in FIG. 33.

In one embodiment, if sections or alternating polarity are used, up to and including cutting operation 3060, a continuous long hydrophone with many wound tubes virtually connected in series has formed. Coating 7002 may be applied to the surface of the wound or coiled sections, or formed tubes 4020 (FIGS. 21 and 22). Examples of partial structures of hydrophones, along with corresponding polarity and marking graphs, are shown in FIG. 21 and FIG. 22, according to some embodiments of the present invention, FIG. 21 showing an even number of coiled sections and FIG. 22 showing an odd number of coiled sections (numbers of coiled sections different from 3 and 4 may of course be used, a typical hydrophone in some embodiments includes e.g. 10,000 coiled tubes which may be for example, 5 cm long tube with 5 cm of spacing between then, to form a 1 km long towing hydrophone). Other structures, and other polarity organizations, and other marking and cutting patterns, may be used.

Referring to FIGS. 21 and 22, hydrophone 4000 may include coiled sections or tubes 4020 formed from two piezo cables 4002 and 4004. Cables 4002 and 4004 may be bonded or connected along coiled sections to create a combined parallel piezo cable, e.g. using for example adhesive such as epoxy or silicone rubber, or using solvent. Cables 4002 and 4004 may be bonded or connected along their length, including coiled and uncoiled sections, or only at coiled sections. Other methods of bonding or joining may be used. Cables 4002 and 4004 may include inner conductors 4010 and 4012, respectively, and piezoelectric coating 4014 and 4016, respectively. Piezoelectric coating 4014 and 4016 may be for example poly(vinylidene difluoride-trifluoroethylene) or P(VDF-TrFE) co-polymer, or other type of piezoelectric material. Each coiled section or tube 4020 may be formed from having adjacent coils of the parallel cable (formed from cables 4002 and 4004) joined or connected for example using adhesive such as epoxy or silicone rubber or solvent. Each coiled section 4020 may be connected by an uncoiled section 4022 of the parallel cable (4002 and 4004): since portions of this parallel cable may be cut or removed, it may be considered that one substantially contiguous cable with sections cut or removed (from cables 4002 and 4004) forms hydrophone 4000. Inner conductors 4010 and 4012 may be for example copper or other metal wire, e.g. solid wire, or twisted strand wire.

In FIG. 21 and FIG. 22, MA(t) depicts when marking occurs on cable 4000, at points 4030, corresponding to points 4032 on cable 4000, and MB(t) depicts when marking occurs on cable 4000, at points 4034, corresponding to points 4036 on cable 4000. Marking may be used to indicate to a manufacturing device or system when cuts or cable removal is to be made. Graphs A and B depict the polarity of cable 4000 across various sections, showing sections of positive polarity 4050 corresponding to positively polarized sections of cables 4002 and 4004 and tubes 4020 and sections of negative polarity 4056 corresponding to negatively polarized sections of cables 4002 and 4004 and tubes 4020. In some embodiments, a section of continuous polarity (positive or negative) includes both a coiled section and an uncoiled section of cable, unless removed.

In some embodiments, individual hydrophone units may be coiled or wound into a shape other than a cylinder, such as a sphere or a football shape. The wound form can include multiple layers of cables, which may be for example connected in parallel to increase capacitance or in series to increase voltage sensitivity. Individual coiled units may be connected in parallel or series with each other, for example by the planned use of cutting and/or alternating polarization of cable segments. In embodiments of a hydrophone including non-cylindrical shape, e.g. oval cross section, or football shape (e.g. FIG. 6 or 7) only one coiled tube may be used, as directionality may be best if only one tube is used. In one embodiment, a hydrophone may not include coiled sections at all. E.g. a hydrophone may include a single strand of piezo cable polarized in a certain manner, two or more parallel strands of piezo cable polarized in a certain manner, or another structure.

In one embodiment, polarity in each individual cable 4002 and 4004 alternates or switches near or at one end of each coiled section 4020, and continues through one uncoiled section 4022, and thus one section of cable having the same polarity may include both a coiled section and an adjacent uncoiled section. Each uncoiled section thus attaches a coiled portion of cable of one polarity to a coiled portion of cable of opposite polarity: for example, cable 4002 in coiled section 4020A has polarity − and cable 4002 in coiled section 4020B has polarity +, and these two sections are connected by uncoiled section 4032, which in one embodiment lacks polarized coating. Each of coiled sections 4020 may be made from the same two contiguous piezo cables 4002 and 4004. In one example embodiment shown in FIG. 21, coiled sections 4020 may be made from the same two contiguous piezo cables 4002 and 4004, but have a section of cable joining them removed, so that coiled sections 4020 are connected by one piezo cable, not two, at section 4032.

In operation 3070, one end of one cable strand (e.g. of Type A or Type B, or one of piezo cables 4002 and 4004) may be designated or assigned the starting point for signal processing. For example, in one embodiment, point 4070 of the inner conductor of cable Type A, may be designated or assigned a starting or connection point as the positive terminal for signal processing, as shown in FIGS. 23A, 23B and 23C. In other embodiments the starting or connection point may be a negative terminal. Note that the starting point of Type B cable may be a non-connection point, such that the inner conductor of the cable is not electrically connected at the point closest to point 4070 of Type A cable, according to marker profile MB(t).

In operation 3080, one end of one cable strand (e.g. of Type A or Type B, or one of piezo cables 4002 and 4004) may be designated or assigned the end point for signal processing. For example, in one embodiment, point 4080 may be designated or assigned as the ending point from one of two cables, typically without marking which in one embodiment denotes cutting and no connection. The negative terminal may be for signal processing. Depending upon the number of the tubes, coiled sections or cylinders formed, this negative terminal can be on Type A or Type B cables. For an even number of tubes formed, as shown in FIG. 21, this negative terminal can be located at the ending point of the Type A cable. For an odd number of tubes formed, as shown in FIG. 22, this negative terminal can be located at the ending point of the Type B cable. In other embodiments the ending or connection point may be a positive terminal.

In operation 3090, a conductor such as an insulated conductor may be attached. For example, in the case that the starting point was designated positive, an insulated conductor may be connected to extend the negative terminal (e.g. point 4080 in FIG. 23) to the vicinity of the positive terminal for easy connection for output or signal processing, or to produce a convenient two-terminal output for a hydrophone at one end of the hydrophone, e.g. as shown in FIGS. 23A, 23B and 23C. Referring to FIGS. 23A and 23B, return cable 5000, e.g. an insulated conductor, may be attached to piezo cable 4000 which includes tubes or coiled sections 4020 alternating with uncoiled sections 4022. The positive and negative end points 4070 and 4080 may be considered an output and may be connected to for example signal processing 5014 which may include for example pre-amplification and other processing. In other embodiments the starting or connection point may be a negative terminal and the added conductor may thus be positive. Insulated conductor 5000 can be placed inside or through the middle of tubes 4020 or outside tubes 4020. In FIG. 23A, the first coiled section 4020, closest to signal processing 5014, terminates with positive and the last coiled section 4020 terminates with negative at point 4080, connected to return lead or cable 5000. Alternative, as seen in FIG. 23C, one can fold a piezo cable 4000 (e.g. a long chain of connected tubes) for example in half such that both positive and negative terminals of cable 4000 are close to each other for easy connection, with no separate return lead used. In some embodiments, if a hydrophone is formed with positive and negative terminals on both ends, on one end the positive and negative terminals may not need to be connected, and at the other end the positive and negative ends may be connected to signal processing. For example, in FIG. 13, the inner conductors are continuous, each end of a particular inner conductor has the same voltage potential.

Figure 24:
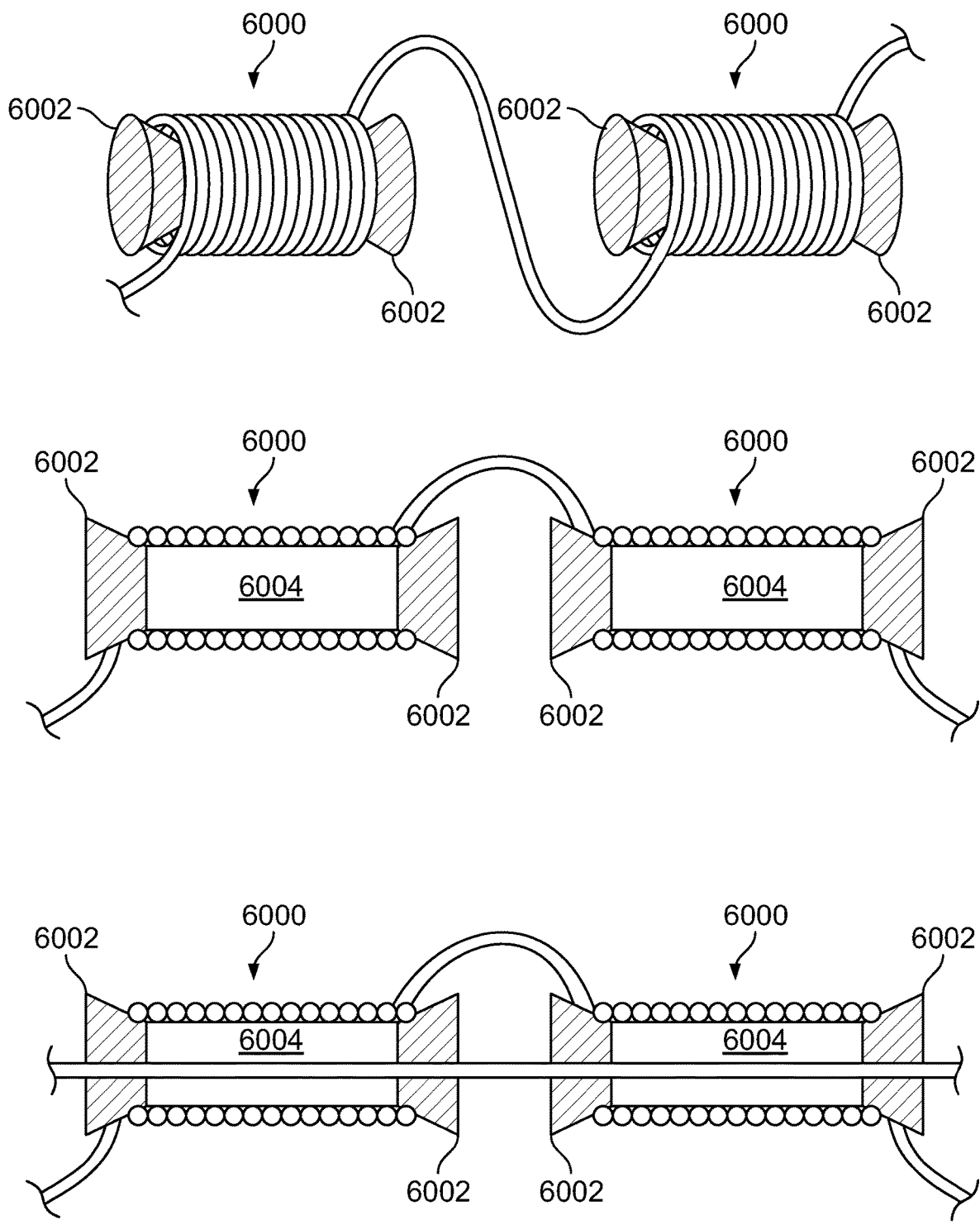
FIG. 24 illustrates wound cylinders with end caps or stoppers, according to an embodiment of the present invention.

In operation 3100, end caps or seals may be added or applied to each formed tube to form an air cavity, or for example a cavity for potting (e.g. filling with a substance other than air). For example, referring to FIG. 24, tubes or cylinders 6000 may have end caps or stoppers 6002 (made of e.g. rubber, or another substance) added to produce cavities 6004. In one embodiment a substance 6006, e.g. a potting material such as soft potting polymer compound, can be injected into cavities 6004. Pins, staples, clips or other fasteners may be used to secure cables to the end caps to prevent cables from unraveling. End caps 6002 may have slits or holes 6003 to allow an insulated conductor (e.g. 5000, FIG. 23) to pass through tubes 6000 if the insulated conductor is chosen to be placed inside the tubes. Such end caps or seals need not be used. End caps 6002 may allow the tube to form a cavity 6004 and isolate the inside pressure field from the outside pressure field. In one embodiment, the pressure difference between inside field and outside field is the driving force of the hydrophone sensors. End caps may also act as supports to balance against hydrostatic pressure from outside, analogous to the walls between sections in bamboo cavities: without walls between cavities, the bamboo will collapse easily from the outside pressure or bend easily from bending moment. The use of end caps may increase output by capping cylinders with for example rubber to produce an air filled container: the coils may be squeezed, but hydrostatic pressure from the end caps also squeezes coils and also balances hydrostatic pressure in core.

Figure 25:
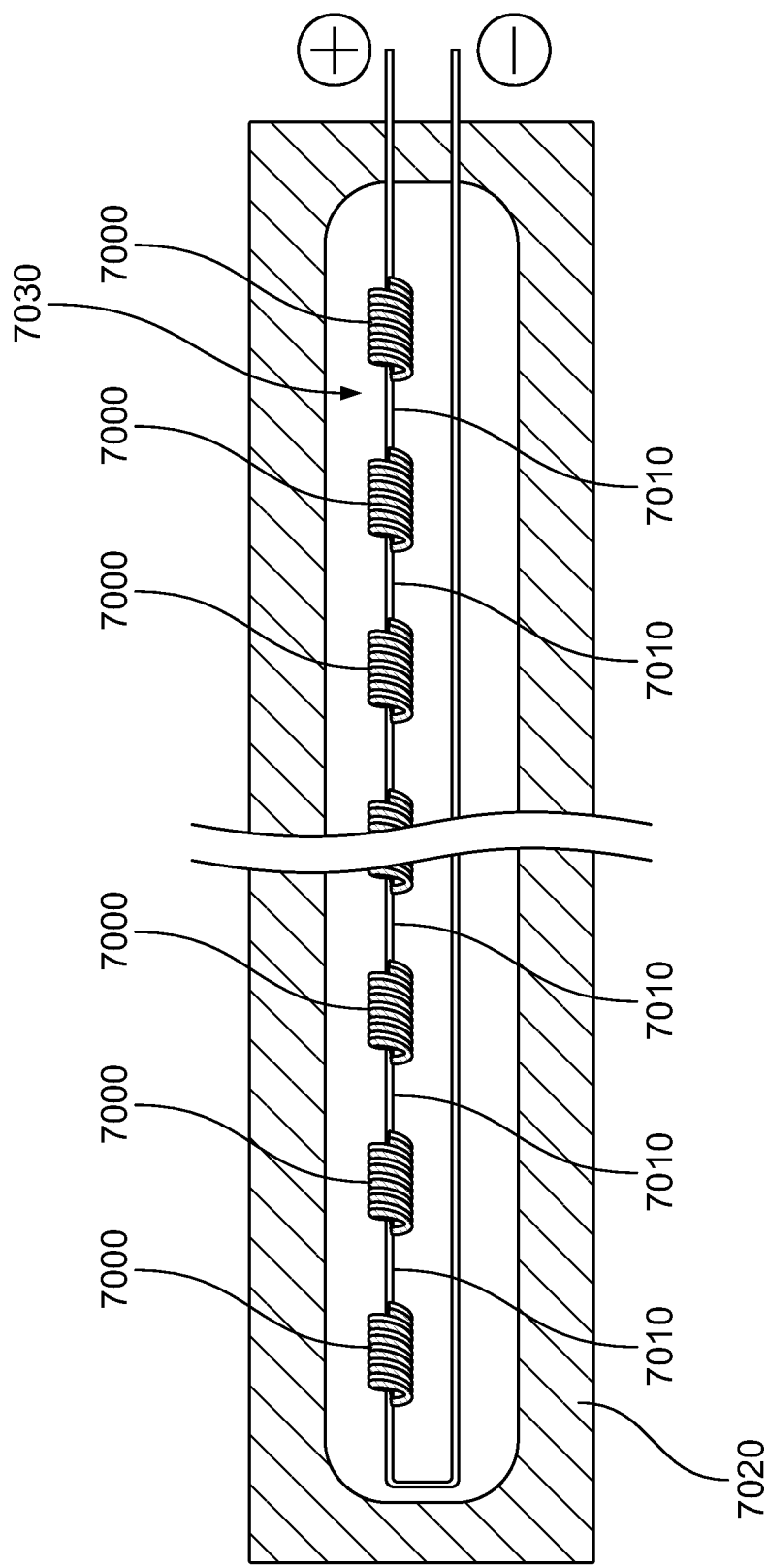
FIG. 25 illustrates wound cylinders in a mold for coating, according to an embodiment of the present invention.

In operation 3110, the tubes or cylinders, connected by uncoiled sections, may be formed into a cable. For example, referring to FIG. 25, a series of continuously formed tubes 7000 connected by uncoiled sections 7010 may be placed into a "snake" shaped mold 7020, or another type of mold. The mold may accept a portion of the cable at a time, since the cable may be long, e.g. 1 km, ½ mile, etc. A substance such as a polymer compound 7030, or another coating or covering substance, may be injected into the mold to surround or cover the tubes or cylinders to form a cable such as a snake cable. Other methods may be used to coat coiled sections and sections connecting coiled sections. Electrical connections may extend from the cable and may not at their ends be covered in polymer 7030. The covering substance may protect internal components, provide or add to structural support, and possibly provide a continuous or relatively smooth outer package for the hydrophone.

In operation 3120, an EMI (electromagnetic interference) shield may be added. For example, electrically conductive silver paint or other coating may be added to the outside surface of the formed cable or snake cable to form an EMI shield if desired, and the paint may be dried after application. Other type of EMI shielding material may be used, such as braided conductive wires or fabric.

In operation 3130, a conformal insulation coating may be applied over the EMI shield to protect the EMI shield and hydrophone cable as a whole from water. A conformal layer or other coating may be for example a thin layer of soft polymer or silicone that conforms and covers the outer surface of the snake hydrophone cable, e.g. a thin polymeric film which conforms to the contours of the cable to protect the components.

Other or different operations may be used.

Figure 13:
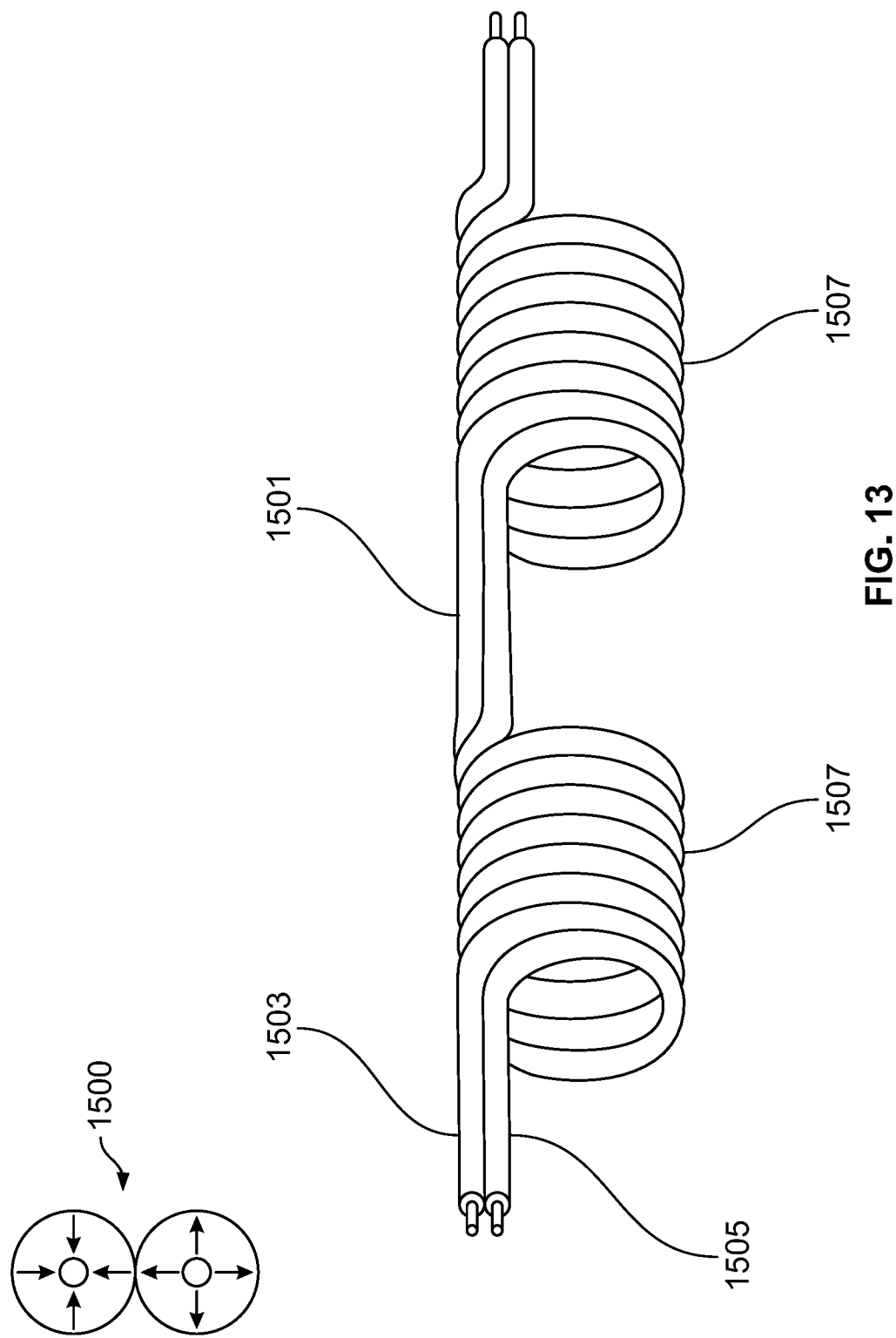
FIG. 13 illustrates another field application of an embodiment of the present invention with multiple piezo-cable wound hydrophones.
Figure 26:
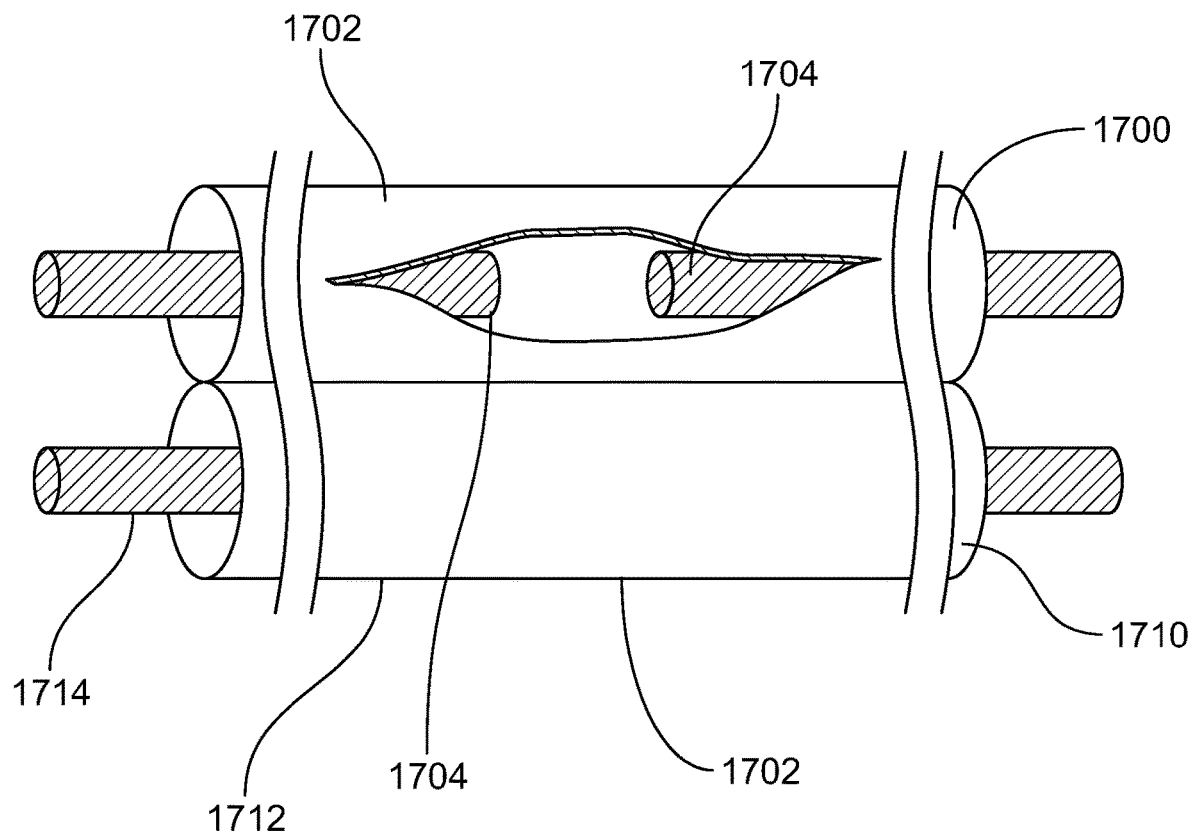
FIG. 26 is an example of a cut cable, according to an embodiment of the present invention.

A choice of polarity and whether/how to cut inner conductors may cause different hydrophone units to be effectively connected in parallel or serially or a mix of both within one hydrophone. For example, FIG. 13 depicts a twin piezo-cable 1501 includes two bonded or connected physically parallel piezo cables 1503 and 1505 coiled or wound in to multiple tubes or cylinders 1507. In FIG. 13, since each of the two cables 1503 and 1505 includes one continuous strand of the same polarity, each cable 1503 and 1505 having opposite polarity, and since there are no cuts in the cables between cylinders 1507, cylinders 1507 are electrically connected in parallel. In other embodiments, tubes or cylinders may be connected to each other in a combination of parallel and series connections. Disconnection or cutting of the inner conductor may be performed in different manners. Referring to FIG. 26, in some embodiments, instead of cutting off a whole portion of piezo cable (both inner conductor and copolymer jacket) for disconnection or cutting, an opening of the outside copolymer jacket 1702 of an individual piezo cable of cables 1700 and 1710 can first be cut or slit, and then a portion of the inner conductor 1704 may be cut off for disconnection. Jacket 1712 and conductor 1714 may remain uncut. Such a method may preserve more strength of the cable.

Figure 27:
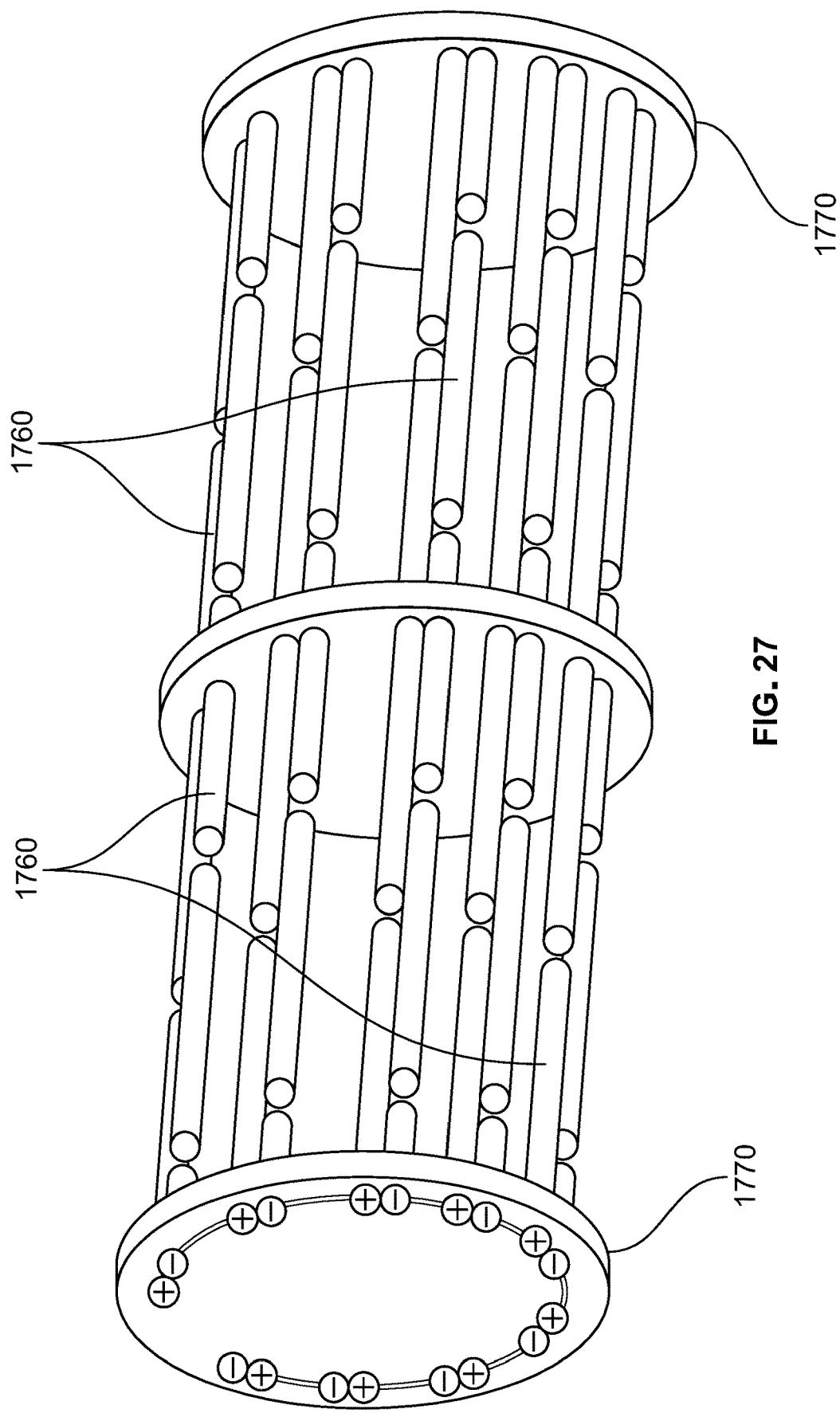
FIG. 27 illustrates a combinations of cables placed in disks or supports, according to an embodiment of the present invention.

In other embodiments, wound tubes or cylinders need not be used. For example, a hydrophone in one embodiment may be one unwound or straight alternately polarized pair of piezo cables, solvent bonded or otherwise connected to each other, or formed as a twisted pair. Such an embodiment typically has less sensitivity than embodiments using tubes or cylinders. Multiple strands of such alternately polarized and connected pairs of piezo cables can be bundled for example with spacers to form a continuously long and strong sensing hydrophone, an example being shown in FIG. 27. FIG. 27 shows an embodiment using series combinations in larger group. Series connected wires 1760 are kept straight or not coiled, and are placed in disks or other supports 1770 that allow daisy-chaining in series; however daisy-chaining in the sense of a series of coiled tubes may not be used in such embodiments. In one example, eight pairs of piezo cables are used, where supporting spacer discs are 1.5 cm in diameter. Spacers may be placed for example every 20 cm apart. Each pair of piezo cables may be for example 100 meter long or longer. Each boding section of paired polarities may be for example 1 m long. The bundle (group) of cables may be encapsulated with soft polymer inside the mold, for example, similar to operation as 3110. Other dimensions and numbers of cables may be used. While only one central support 1770 is shown more are typically used. This group or "bundle" of strands may be placed for example evenly along the circumference if supports 1760 are to achieve isotropic, e.g. same, sensitivity along the circumference. Spacers 1770 at the ends can be for example printed circuit boards that can reconnect the leads from each wire 1760 from the group. The grouped strands can using connections on end spacers 1770 be used to create combinations of parallel and/or series connections. For example, each strand can be viewed as a battery and may be connected to the printed circuit board (an end section 1770). One can design various trace patterns on the printed circuit board to combine these individual strands (e.g. analogous to batteries) in series, parallel or both. The particular example in FIG. 27 shows traces to connect in series.

Figure 28A:
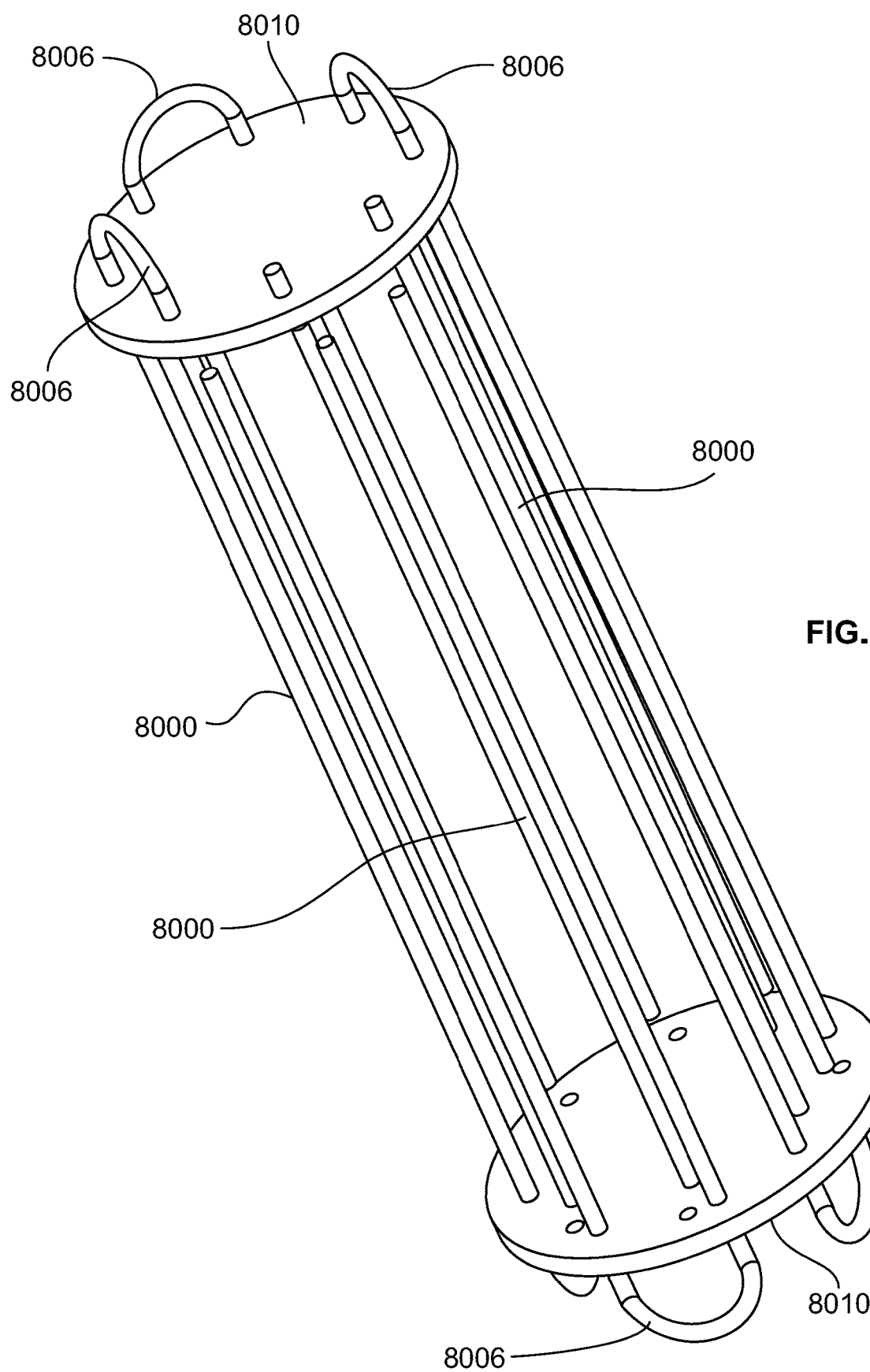
FIG. 28A and FIG. 28B illustrate a cable passed back and forth through supports, according to an embodiment of the present invention.
Figure 28B:
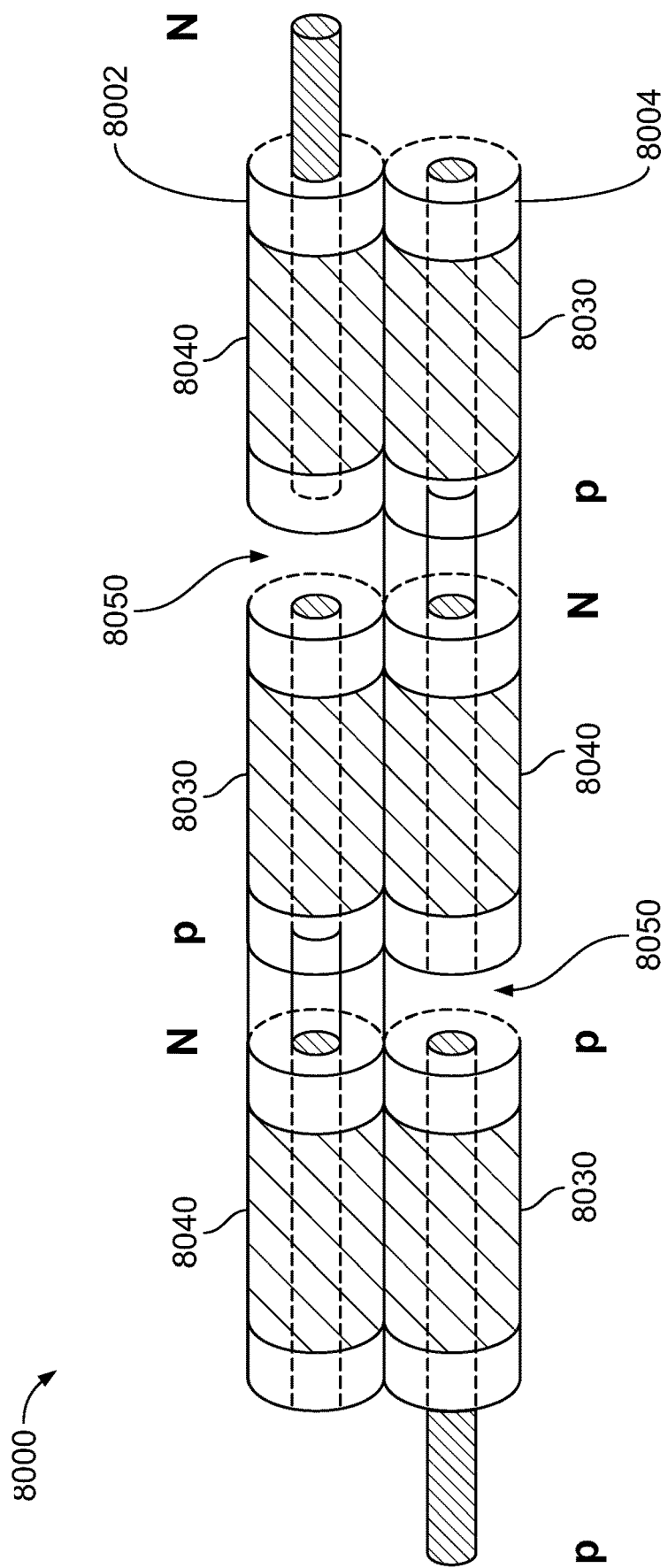

In other embodiments, a single strand of a pair of alternately polarized and bonded piezo cables can be folded or passed back and forth several times with spacers or holders to form a continuously long and strong sensing hydrophone, as shown in FIGS. 28A and 28B. Referring to FIGS. 28A and 28B, folded strand 8000, which may be made from two paired or bonded, and alternately polarized, piezo cables 8002 and 8004, is arranged evenly along the circumference of end spacers or supports 8010 to achieve isotropic (e.g. same around circumference) sensing performance. Supports or spacers 8010 hold strand 8000. End portions 8006 of strand 8000 which connect portions of strand 8000 outside of spacers 8010, may include only one of cables 8002 and 8004. In-between end spacers 8010 the cable may be a continuous series arrangement with alternating polarity and cutting. For example FIG. 28 shows a schematic representation of a portion of strand 8000, including cables 8002 and 8004, which are alternately polarized and also cut in places between spacers 8010. For example, cables 8002 and 8004 may include positive sections 8030 and 8040 and cuts or sections where cable is removed 8050.

Figure 29A:
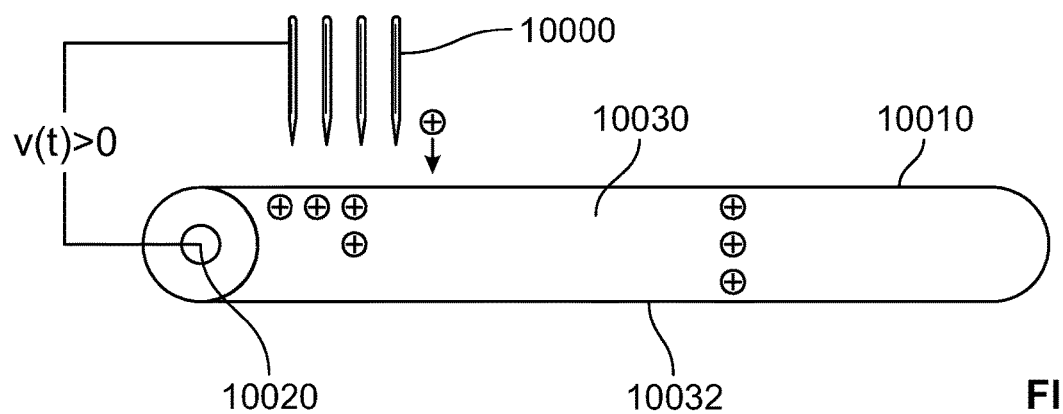
FIG. 29A illustrates a positive polarization setup of a section of a piezoelectric copolymer cable according to one embodiment.

Embodiments of the present invention may use the properties of piezoelectric copolymers. For example, signs of charges for typical piezoelectric ceramics with the piezoelectric charge constant $d_{33}>0$ are described for example in the standard IEEE STD 176-1987. In contrast to piezoelectric ceramics, $d_{33}$ of piezoelectric copolymer is negative, $d_{33}<0$. To account for this reversed piezoelectric effect, in one embodiment, tension may be reversed into compression so that all the signs of charges can remain the same. FIG. 29A illustrates a positive polarization setup of a section of a piezoelectric copolymer cable according to one embodiment. The potential difference between corona discharge needles 10000 and the inner conductor 10020 of cable 10010 is positive, V(t)>0. The positive ions may be expulsed from the positive needles 100000 to the dielectric copolymer jacket 10030 of the cable. The positive ions then may adhere to the surface 10032 of the jacket 10030 and create an electric field polarizing the piezoelectric dielectric copolymer jacket 10030. After polarization, outer surface 10032 may be coated with a thin layer of electrically conductive coating such as silver paint as an electrode to collect charges.

Figure 29B:
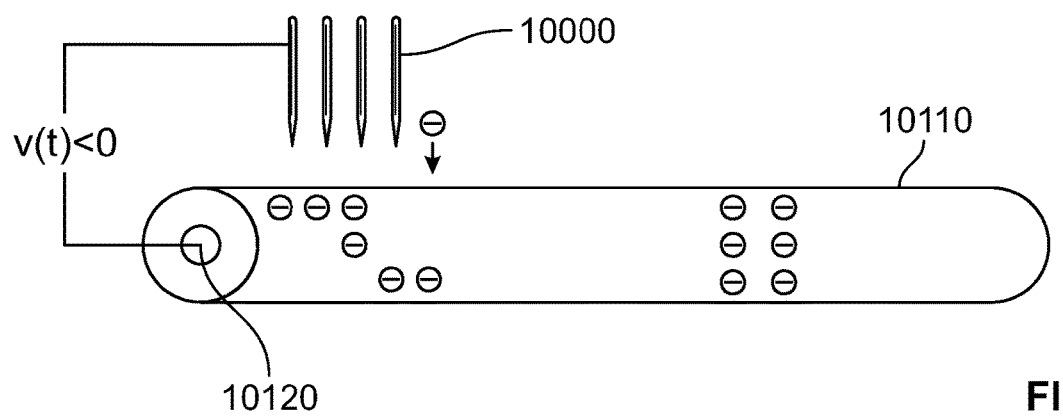
FIG. 29B illustrates a negative polarization setup of a section of a piezoelectric copolymer cable according to one embodiment.
Figure 30:
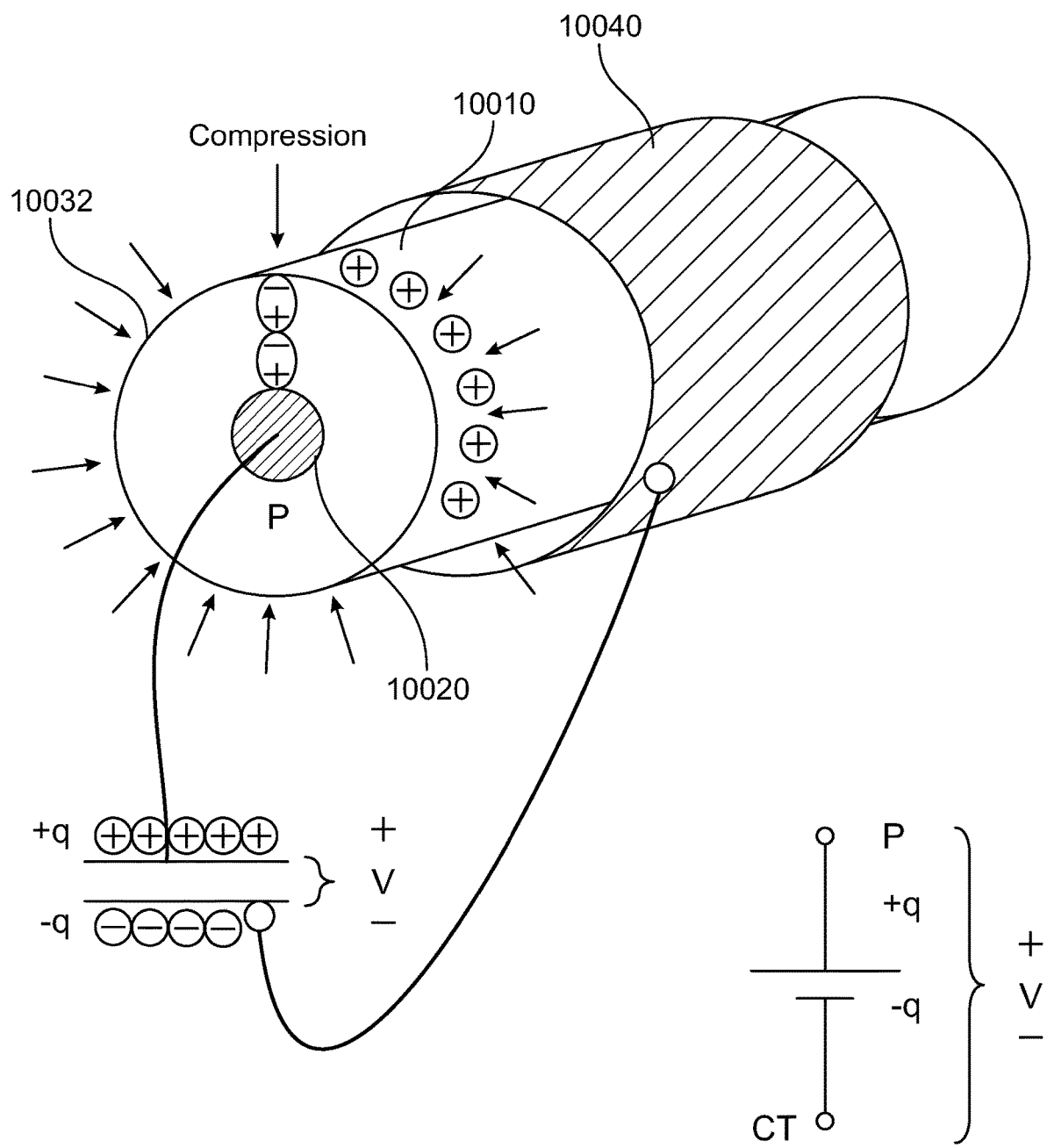
FIG. 30 illustrates a positive polarized copolymer cable which may generate positive charges at an inner conductor when subjected to compression, according to one embodiment.
Figure 31:
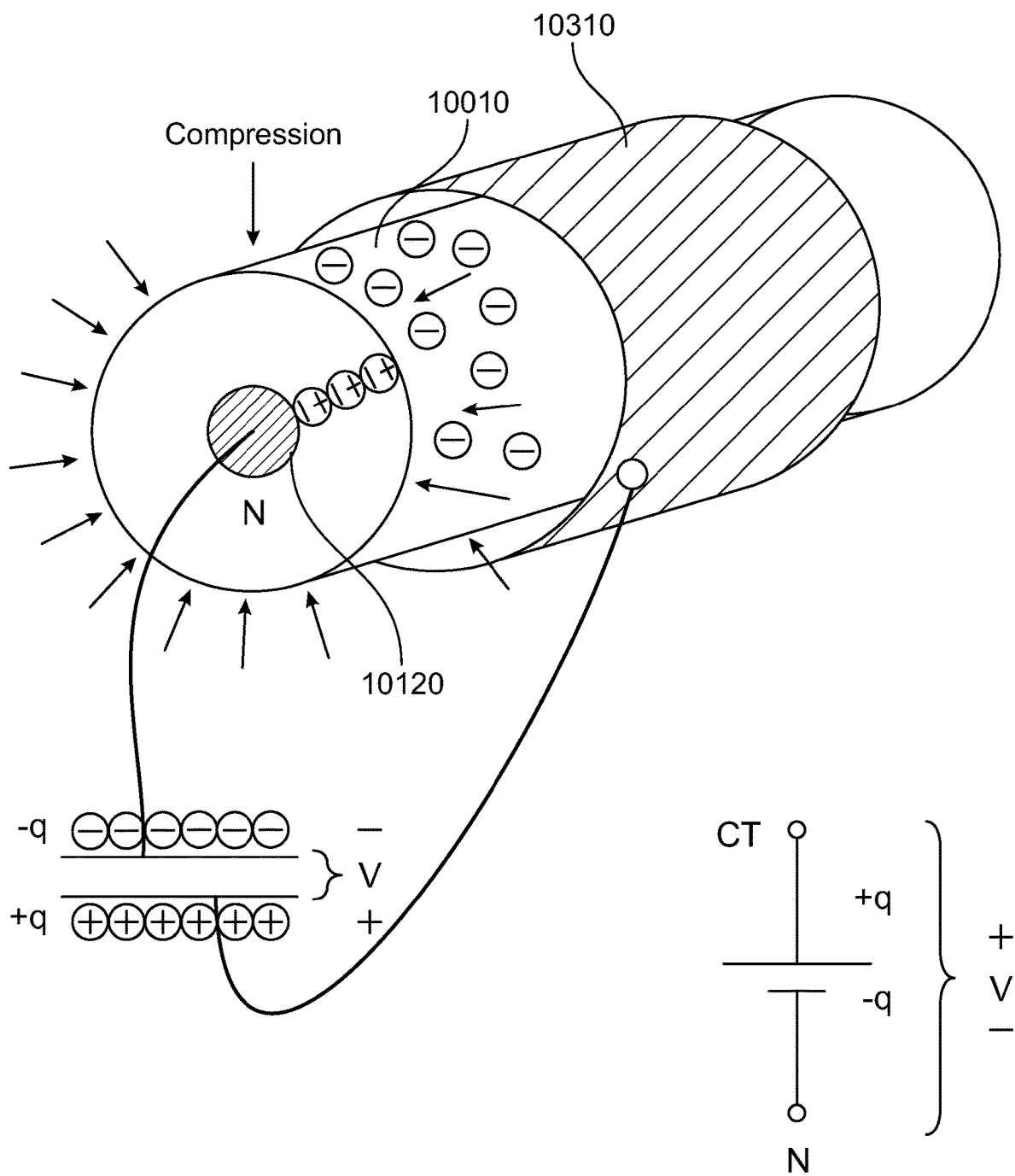
FIG. 31 illustrates a charge being generated in a copolymer, according to one embodiment.

A positive polarized copolymer cable may generate positive charges at an inner conductor when subjected to a compression normal to the cylindrical surface, for example as depicted in FIG. 30. Since the inner conductor 10020 will generate positive charges and therefore higher potential compared to the outer surface 10032, one can conceptually interpret this positively polarized piezo-cable 10010 under compression as a battery with the inner conductor 10020 being its positive lead and with the outside electrode (e.g. conductive coating 10040) being its negative lead. In contrast, FIG. 29B shows a negative polarization of a section of a piezoelectric copolymer cable, V(t)<0. Following the convention discussed above, one can verify that a negatively polarized copolymer cable 10110 will generate negative charge at inner conductor 10120 when subjected to a compression normal to the cylindrical surface, as depicted in FIG. 31. As a result, one can conceptually view this negatively polarized piezo-cable 10110 under compression as a battery with the inner conductor 10120 being its negative lead and with the outside electrode (e.g. conductive coating) being its positive lead, as described in FIG. 31.

Figure 32:
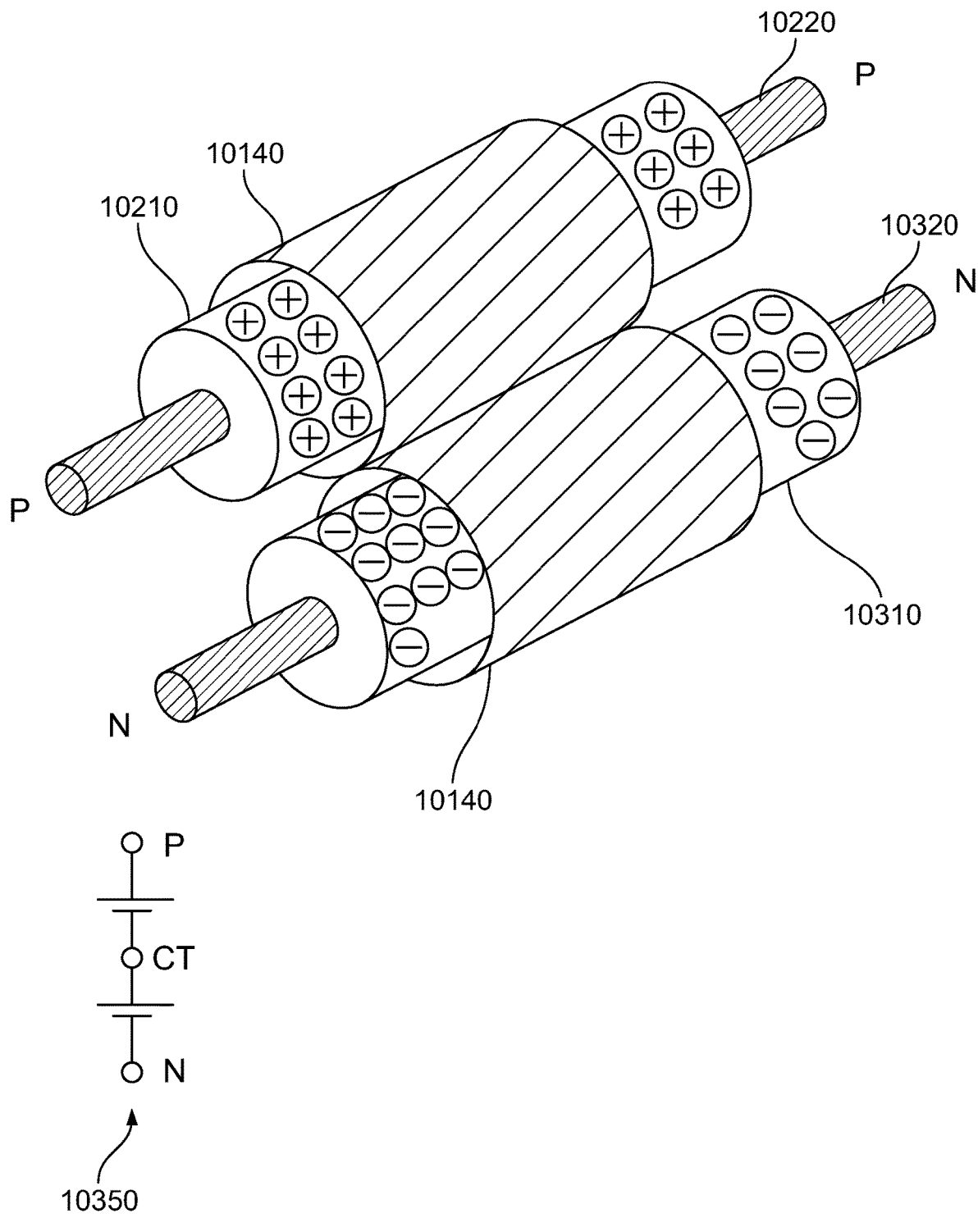
FIG. 32 illustrates a pair of copolymer cables, according to one embodiment.

In some embodiments of the present invention, as shown in FIG. 32, a section of a positively polarized piezo-cable 10210 and a section of a negatively polarized piezo-cable 10310 can be bonded (e.g. solvent bonded) or twisted together to form a pair. The outside surface of the pair of piezo cables may be coated with conductive coating or paint 10140 (e.g. silver, carbon, or mixture of both). As the pair of piezo cables 10210 and 10310 are under compression normal to the cylindrical surface and generating charges, one can realize this is conceptually two batteries connected in series at the coated electrode surfaces 10140, with the highest potential point being at the inner conductor 10220 of the said positively polarized cable 10210, and the lowest potential point being at the inner conductor 10320 of the said negatively polarized cable 10310. Note that since the inner conductors 10220 and 10320 of the piezo cables 10210 and 10310 conduct electricity, the starting end of each inner conductor 10220 and 10320 has the same voltage potential as the ending end. This may allow two pairs of cables or tubes to be connected in series or in parallel. For series, one end from each side (on different cable) may be used for connection. For parallel, both ends from both sides are used for connection. In one embodiment, one can connect either end of the cable for electrical connection. As seen in FIG. 32 a pair of piezo cables 10210 and 10310 may act as two batteries or voltage generators connected in series at reference point CT, per diagram 10350.

In other embodiments, piezoelectric material or coating may be a material other than P(VDF-trfe). For example polyvinylidene fluoride (PVDF) or PVDF ter-polymer may be used. PVDF homopolymer may require mechanical stretching during polarization, which can be added to the polarization processes described herein, for example by increasing the tension on the cables. P(VDF-trfe) is a copolymer of PVDF and trifluoroethylene, where the ratio in moles can be for example, 60/40, 70/30, 75/25, or 80/20); PVDF is homo-polymer. Embodiments of the invention are not limited to stranded core piezo cable, but rather can include a solid core, a solid strip, or for example a mercury filled core. Embodiments of the invention are not limited to circular cross section piezo cable; for example piezo cable may be flattened piezo-cable, or cable without a cylindrical shape. Hydrophone units may be shapes other than cylinders, for example, can be a flattened cross-section, football, sphere or oval shaped.

A piezo cable hydrophone according to the present invention may be for example 1 kilometer long, or another length. Coiled sections or tubes may be for example 2 inches long and spaced 14 inches apart, and thus uncoiled (not wound) sections between tubes may be 12 inches long. Other dimensions may be used. For example, in the case of tubes having 1.5 cm in outer diameter and 5 cm in length, 75 cm of paired piezo cable having 1.5 mm in diameter may be required, with 33 turns or coils are used in each tube. Spacing between tubes may range from 5 cm to several meters. The insulation layer of the cable may be on the order of 250 microns, which as discussed may permit a lower and safer polarization voltage. Since there is a benefit to sensing along the tube length, but not as much benefit to sensing at all points along the entire length of the hydrophone, individual sensing units or hydrophone cylinders made from coiled sections of continuous piezo cable may be created at intervals. The uncoiled piezo cable connecting sensing units may save on the cost of the relatively expensive (e.g. possibly $5,000/kg) piezo coating by not being coiled and/or by having the piezo coating or a portion of the piezo cable removed (and possibly recycled or reused), as typically sensing is not required between sensing units.

While the invention has been described with respect to a limited number of embodiments, these should not be construed as limitations on the scope of the invention, but rather as exemplifications of some of the preferred embodiments. Other possible variations, modifications, and applications are also within the scope of the invention. Different embodiments are disclosed herein. Features of certain embodiments may be combined with features of other embodiments; thus certain embodiments may be combinations of features of multiple embodiments.

The invention claimed is:

1. A hydrophone comprising:
    a first piezoelectric cable comprising alternating sections of positive polarity and negative polarity; and
    a second piezoelectric cable comprising alternating sections of negative polarity and positive polarity, where at least a portion of each section of positive polarity of the first piezoelectric cable is bonded to at least a portion of a section of negative polarity of the second piezoelectric cable;
    wherein the first piezoelectric cable comprises an inner conductor and a continuous layer of piezoelectric material coating and the second piezoelectric cable comprises an inner conductor and a continuous layer of piezoelectric material coating.

2. The hydrophone of claim 1, comprising an electrically conductive coating covering at least a portion of the first piezoelectric cable and at least a portion of the second piezoelectric cable.

3. The hydrophone of claim 1, comprising coiled sections and uncoiled sections, the coiled sections alternating with the uncoiled sections, each coiled section comprising the first piezoelectric cable and the second piezoelectric cable.

4. The hydrophone of claim 3, wherein in each combination of adjacent coiled section and uncoiled section, one of the first piezoelectric cable or the second piezoelectric cable is cut.

5. The hydrophone of claim 1, wherein the continuous layer of piezo electric material coating of each of the first piezoelectric cable and the second piezoelectric cable is a layer of piezoelectric copolymer coating.

6. The hydrophone of claim 1, comprising a series of coiled sections forming a series-connected set of hydrophone sensing units.

7. The hydrophone of claim 1, wherein the hydrophone does not include coiled sections, and wherein one of the first piezoelectric cable or the second piezoelectric cable is cut.

8. The hydrophone of claim 1, wherein the hydrophone is formed in an unwound series-connected structure.

9. The hydrophone of claim 1, wherein the hydrophone is formed in an unwound parallel-connected structure.

10. The hydrophone of claim 1, comprising a series of coiled sections forming a parallel-connected set of hydrophone sensing units.

\* \* \* \* \*